US009223204B2

(12) United States Patent  
Ito et al.

(10) Patent No.: US 9,223,204 B2
(45) Date of Patent: *Dec. 29, 2015

(54) ACTINIC RAY-SENSITIVE OR RADIATION-SENSITIVE RESIN COMPOSITION, RESIST FILM, AND PATTERN-FORMING METHOD USING THE SAME

(71) Applicants: Takayuki Ito, Shizuoka (JP); Hidenori Takahashi, Shizuoka (JP); Tomotaka Tsuchimura, Shizuoka (JP); Shohei Kataoka, Shizuoka (JP); Takeshi Inasaki, Shizuoka (JP)

(72) Inventors: Takayuki Ito, Shizuoka (JP); Hidenori Takahashi, Shizuoka (JP); Tomotaka Tsuchimura, Shizuoka (JP); Shohei Kataoka, Shizuoka (JP); Takeshi Inasaki, Shizuoka (JP)

(73) Assignee: FUJITSU Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/669,530

(22) Filed: Nov. 6, 2012

(65) Prior Publication Data

US 2014/0127627 A1    May 8, 2014

Related U.S. Application Data

(63) Continuation of application No. 12/748,728, filed on Mar. 29, 2010, now Pat. No. 8,329,379.

(51) Int. Cl.
G03F 7/039 (2006.01)
G03F 7/20 (2006.01)
G03F 7/004 (2006.01)

(52) U.S. Cl.
CPC .............. *G03F 7/004* (2013.01); *G03F 7/039* (2013.01); *G03F 7/0392* (2013.01); *G03F 7/20* (2013.01)

(58) Field of Classification Search
CPC ....... G03F 7/004; G03F 7/039; G03F 7/0392; G03F 7/0395; G03F 7/0397; G03F 7/20; G03F 7/2002; G03F 7/203; G03F 7/2037
USPC ...................................... 430/270.1, 326, 910
See application file for complete search history.

(56) References Cited

U.S. PATENT DOCUMENTS

| 5,945,250 | A | 8/1999 | Aoai | |
| 6,177,228 | B1 * | 1/2001 | Allen et al. | 430/270.1 |
| 7,569,326 | B2 | 8/2009 | Ohsawa et al. | |
| 7,776,505 | B2 | 8/2010 | Gonsalves | |
| 7,858,289 | B2 | 12/2010 | Yamashita | |
| 7,989,138 | B2 | 8/2011 | Furuya et al. | |
| 8,003,295 | B2 | 8/2011 | Hatakeyama | |
| 8,039,198 | B2 | 10/2011 | Tachibana et al. | |
| 8,057,982 | B2 | 11/2011 | Hatakeyama et al. | |
| 8,057,985 | B2 | 11/2011 | Ohshi et al. | |
| 8,084,187 | B2 | 12/2011 | Mizutani et al. | |
| 8,114,571 | B2 | 2/2012 | Ohsahi et al. | |
| 8,329,379 | B2 * | 12/2012 | Ito et al. | 430/270.1 |
| 2004/0091817 | A1 | 5/2004 | Komatsu | |
| 2005/0221220 | A1 * | 10/2005 | Meagley | 430/270.1 |
| 2005/0260525 | A1 * | 11/2005 | Takemoto et al. | 430/270.1 |
| 2006/0121390 | A1 | 6/2006 | Gonsalves | |
| 2006/0147836 | A1 | 7/2006 | Hatakeyama et al. | |
| 2007/0117043 | A1 | 5/2007 | Gonsalves | |
| 2007/0149702 | A1 | 6/2007 | Ando | |
| 2008/0102407 | A1 * | 5/2008 | Ohsawa et al. | 430/286.1 |
| 2008/0160449 | A1 | 7/2008 | Kubo et al. | |
| 2009/0069521 | A1 | 3/2009 | Nagai | |
| 2009/0202943 | A1 * | 8/2009 | Ohsawa et al. | 430/285.1 |
| 2009/0233223 | A1 * | 9/2009 | Tachibana et al. | 430/270.1 |
| 2009/0269696 | A1 * | 10/2009 | Ohsawa et al. | 430/270.1 |
| 2010/0040977 | A1 * | 2/2010 | Nagai et al. | 430/285.1 |
| 2010/0055608 | A1 * | 3/2010 | Ohashi et al. | 430/270.1 |
| 2010/0075257 | A1 | 3/2010 | Takemoto et al. | |
| 2010/0248143 | A1 * | 9/2010 | Ito et al. | 430/282.1 |
| 2011/0003251 | A1 | 1/2011 | Tanka et al. | |
| 2012/0058429 | A1 | 3/2012 | Nishino et al. | |

FOREIGN PATENT DOCUMENTS

| JP | 09-325497 A | 12/1997 |
| JP | 10-221852 A | 8/1998 |
| JP | 2004-158287 A | 6/2004 |
| JP | 2006-178317 A | 7/2006 |
| JP | 2006215526 A | 8/2006 |
| JP | 2007-197718 A | 8/2007 |
| JP | 2007254494 A | 10/2007 |
| JP | 2008-90261 A | 4/2008 |

(Continued)

OTHER PUBLICATIONS

Machine translation of JP 2006-178317, published on Jul. 6, 2006.*
Hirao et al., Recent Advance in Living Anionic Polymerization of functionalized Styrene Derivatives, Prog. Polymer Science 27 (2002), pp. 1399-1471.
Wang, "Synthesis and Properties of New Anionic Photoacid Generators Bound Polymer Resists for e-beam and EUV lithography," Proc. of SPIE, vol. 6923, 692312 (2008).
Office Action dated Nov. 19, 2013, issued by the Japan Patent Office in corresponding Japanese Application No. 2010-013681.

(Continued)

*Primary Examiner* — Anca Eoff
(74) *Attorney, Agent, or Firm* — Sughrue Mion, PLLC

(57) ABSTRACT

Provided is an actinic ray-sensitive or radiation-sensitive resin composition, a resist film formed with the composition, and a pattern-forming method using the same. The actinic ray-sensitive or radiation-sensitive resin composition includes (P) a resin that contains the following repeating units (A), (B) and (C); and a solvent having a boiling temperature of 150° C. or less,
 (A) a repeating unit containing a group capable of decomposing and forming an acid upon irradiation with an actinic ray or radiation,
 (B) a repeating unit containing a group capable of decomposing and forming a carboxylic acid by the action of an acid, and
 (C) a repeating unit containing a carbon-carbon unsaturated bond.

17 Claims, No Drawings

(56) References Cited

FOREIGN PATENT DOCUMENTS

| | | | |
|---|---|---|---|
| JP | 2008-133448 | A | 6/2008 |
| JP | 2008-162101 | A | 7/2008 |
| JP | 2008248063 | A | 10/2008 |
| JP | 2009217253 | A | 9/2009 |
| JP | 2010100830 | A | 5/2010 |
| WO | 2006/121096 | A1 | 11/2006 |
| WO | WO 2008/056796 | * | 5/2008 |
| WO | 2010110236 | A1 | 9/2010 |

OTHER PUBLICATIONS

Office Action dated Aug. 6, 2014 issued by the Taiwan Intellectual Property Office in counterpart Taiwanese Patent Application No. 099109309.

Office Action, dated Apr. 15, 2014, issued by the Japanese Patent Office in counterpart Japanese Application No. 2010-013681.

* cited by examiner

ACTINIC RAY-SENSITIVE OR RADIATION-SENSITIVE RESIN COMPOSITION, RESIST FILM, AND PATTERN-FORMING METHOD USING THE SAME

This is a continuation application of application Ser. No. 12/748,728 filed Mar. 29, 2010 now U.S. Pat. No 8,329,379, claiming priority based on Japanese Patent Application No. 2009-083708 filed Mar. 30, 2009 and Japanese Patent Application No. 2010-013681 filed Jan. 25, 2010, the contents of all of which are incorporated herein by reference in their entirety.

BACKGROUND OF THE INVENTION

1. Field of the Invention

The present invention relates to an actinic ray-sensitive or radiation-sensitive resin composition preferably used in super-micro-lithography process such as the manufacture of super LSI and high capacity microchips and other photofabrication processes, a resist film formed with the composition, and a pattern-forming method using the same. More specifically the invention relates to a positive resist composition for electron beam, X-ray or EUV ray, a pattern-forming method using the same, and a resin for use in a positive resist composition.

2. Description of the Related Art

In manufacturing process of semiconductor devices such as IC and LSI, fine process by lithography with a photoresist composition has been conventionally carried out. In recent years, ultrafine pattern formation of a sub-micron region and a quarter micron region has been required with higher integration of integrated circuits. In such a circumstance, exposure wavelength also shows a tendency to become shorter such as from a g line to an i line, and further to a KrF excimer laser ray. Further, besides a KrF excimer laser ray, development of lithography using an electron beam, an X-ray or an EUV ray is also now progressing.

In particular, electron beam lithography is positioned as a pattern-forming technique of the next generation or the next of the next generation, and positive resist of high sensitivity and high resolution is desired. For shortening the processing time of wafers, increase of sensitivity is a particularly important problem. However, pursuit of higher sensitization in positive resist for electron beams is accompanied by not only lowering of resolution but also deterioration of line edge roughness, accordingly development of a resist satisfying these characteristics at the same time is strongly desired. Here, line edge roughness means that, since the edge at the interface between the pattern of a resist and a substrate irregularly fluctuates in the perpendicular direction to the line direction attributably to the characteristics of the resist, the edge is seen unevenly when the pattern is viewed just above. This unevenness is transferred in the etching process of using the resist as a mask and deteriorates electric characteristics to lower the yield. In particular, in a super fine region of 0.25 μm or less, line edge roughness is an extremely important problem to be improved. High sensitivity, high resolution, good pattern form and good line edge roughness are in a relationship of tradeoff, and it is very important how to satisfy these characteristics at the same time.

It is also an important problem to satisfy high sensitivity, high resolution, good pattern form and good line edge roughness at the same time in lithography using X-rays and EUV rays, and solution is necessary.

As one way of solving these problems, use of a resin having a photo-acid generator in the main chain or side chain of a polymer is examined (JP-A-9-325497 (The term "JP-A" as used herein refers to an "unexamined published Japanese patent application".), JP-A-10-221852, JP-A-2006-178317, JP-A-2007-197718, WO 2006/121096, US 2006/121390, US 2007/117043, JP-A-2008-133448 and Proc. of SPIE, Vol. 6923, 692312, 2008). However, in the examination of JP-A-9-325497, since the composition is a mixed system of a resin having a photo-acid generator and a dissolution-inhibiting compound capable of increasing solubility in an alkali developer by decomposition due to an acid, it is difficult to obtain good pattern form and line edge roughness attributable to a heterogeneous mixing property of these materials.

On the other hand, in JP-A-10-221852, JP-A-2006-178317, JP-A-2007-197718, WO 2006/121096 and US 2006/121390, resins having a photo-acid generating group and a group capable of decomposing by the action of an acid and increasing the solubility in an alkali developer in the same molecule are disclosed, but it cannot be said that the sensitivity to electron beams, X-rays or EUV rays is sufficient.

Further, a terpolymer comprising hydroxystyrene, acrylate containing an adamantyl group and acrylate containing a photo-acid generator is disclosed in US 2007/117043 and Proc. of SPIE, Vol. 6923, 692312, 2008. JP-A-2008-133448 discloses a high energy ray- or heat-sensitive resist containing a resin containing a repeating unit capable of generating a sulfonic acid at the fluorine-containing terminal of a side chain for improving high resolution, iso/dense bias and exposure margin.

On the other hand, in electron beam, X-ray or EUV ray lithography, the volatile constituent from a resist film at exposure time causes contamination of a very expensive exposing apparatus as outed gas. However, if a large amount of a solvent having a high boiling temperature is used as a resist solvent, the solvent remains in the film and causes outgassing. Accordingly, the development of a resin component capable of dissolving and coating in a general purpose solvent having a low boiling temperature as far as possible is desired.

Thus, it is the present situation that high sensitivity, high resolution, good pattern form, good line edge roughness and outgassing performance are not sufficiently satisfied at the same time in electron beam, X-ray or EUV ray lithography by the combinations of the presently known techniques.

In addition, fine processing with a resist composition is not only directly used in the manufacture of integrated circuit but also it is applied to the manufacture of a mold structure for what is called imprinting in recent years (e.g., refer to JP-A-2004-158287, JP-A-2008-162101 and Fundamentals, Technical Development and Development of Applications of Nano-Imprinting—Techniques on Substrates And The Latest Technical Development of Nano-Imprinting—, compiled by Yoshihiko Hirai, published by Frontier Publishing Company (June, 2006)). Therefore, even when X-ray, soft X-ray or electron beam is used as an exposure light source, it is important problems to satisfy high sensitivity, high resolution, good pattern form, good line edge roughness and outgassing performance at the same time, and resolution of these problems is necessary.

SUMMARY OF THE INVENTION

An object of the invention is to provide an actinic ray-sensitive or radiation-sensitive resin composition satisfying high sensitivity, high resolution, good pattern form, good line edge roughness and reduction of outgassing at the same time in a super fine region, in particular, in electron beam, X-ray or EUV ray lithography, and another object is to provide a pattern-forming method using the same.

It has been found that the above objects are achieved by the following constitutions.

<1> An actinic ray-sensitive or radiation-sensitive resin composition comprising:
(P) a resin that contains the following repeating units (A), (B) and (C); and
a solvent having a boiling temperature of 150° C. or less,
(A) a repeating unit containing a group capable of decomposing and forming an acid upon irradiation with an actinic ray or radiation,
(B) a repeating unit containing a group capable of decomposing and forming a carboxylic acid by the action of an acid, and
(C) a repeating unit containing a carbon-carbon unsaturated bond.

<2> The actinic ray-sensitive or radiation-sensitive resin composition as described in <1>, wherein
the repeating unit (B) is a repeating unit represented by the following formula (I), and
the repeating unit (C) is a repeating unit represented by the following formula (II):

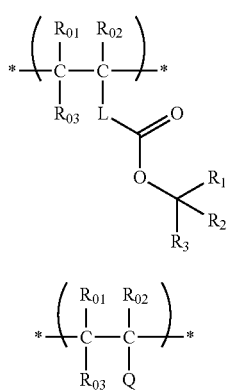

wherein
each of $R_{01}$, $R_{02}$ and $R_{03}$ independently represents a hydrogen atom, an alkyl group, a cycloalkyl group, a halogen atom, a cyano group, or an alkoxycarbonyl group, and $R_{03}$ may represent an alkylene group and be bonded to L or Q to form a 5- or 6-membered ring;
L represents a single bond or a divalent linking group, provided that L represents a trivalent linking group when bonded to $R_{03}$ to form a 5- or 6-membered ring;
$R_1$ represents an alkyl group;
each of $R_2$ and $R_3$ independently represents a hydrogen atom, an alkyl group, a cycloalkyl group or an aryl group, and $R_2$ and $R_3$ may be bonded to each other to form a ring, provided that $R_2$ and $R_3$ do not represent a hydrogen atom at the same time; and
Q represents a group containing a carbon-carbon unsaturated bond.

<3> The actinic ray-sensitive or radiation-sensitive resin composition as described in <1> or <2>, wherein
the compositional amount (mol) of the repeating unit (B) and the repeating unit (C) in the resin (P) satisfies a relationship of the repeating unit (B)≤the repeating unit (C).

<4> The actinic ray-sensitive or radiation-sensitive resin composition as described in any one of <1> to <3>, wherein
the resin (P) further contains (D) a repeating unit which has a group capable of decomposing by the action of an alkali developer and increasing a dissolution rate in the alkali developer and which is represented by the following formula (AII):

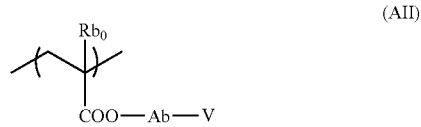

wherein
$Rb_0$ represents a hydrogen atom, a halogen atom or an alkyl group;
Ab represents a single bond, an alkylene group, a divalent linking group having a monocyclic or polycyclic alicyclic hydrocarbon structure, an ether bond, an ester bond, a carbonyl group, or a divalent linking group combining these; and
V represents a group capable of decomposing by the action of an alkali developer and increasing a dissolution rate in the alkali developer.

<5> The actinic ray-sensitive or radiation-sensitive resin composition as described in any one of <2> to <4>, wherein
Q in formula (II) is a group containing an aromatic ring.

<6> The actinic ray-sensitive or radiation-sensitive resin composition as described in <5>, wherein
Q in formula (II) is a group containing a benzene ring.

<7> The actinic ray-sensitive or radiation-sensitive resin composition as described in any one of <1> to <6>, wherein
the resin (P) contains, as the repeating unit (C), a repeating unit derived from hydroxystyrene or a derivative thereof <8> The actinic ray-sensitive or radiation-sensitive resin composition as described in any one of <1> to <7>, wherein
the repeating unit (A) has a structure capable of generating an acid anion on the side chain of the resin upon irradiation with an actinic ray or radiation.

<9> The actinic ray-sensitive or radiation-sensitive resin composition as described in any one of <1> to <8>, wherein
the solvent having a boiling temperature of 150° C. or less is contained in an amount of 65% by mass or more based on all the amount of solvents.

<10> The actinic ray-sensitive or radiation-sensitive resin composition as described in any one of <1> to <9>, wherein
the solvent having a boiling temperature of 150° C. or less is contained in an amount of 75% by mass or more based on all the amount of solvents.

<11> The actinic ray-sensitive or radiation-sensitive resin composition as described in any one of <1> to <10>, wherein
the solvent having a boiling temperature of 150° C. or less is contained in an amount of 90% by mass or more based on all the amount of solvents.

<12> The actinic ray-sensitive or radiation-sensitive resin composition as described in any one of <1> to <11>, wherein
the resin (P) consists of the repeating units (A) to (C) alone or the repeating units (A) to (D) alone, and all of the repeating unit (C) are a repeating unit represented by the following formula (II-1):

wherein
Q represents a group containing a carbon-carbon unsaturated bond.

<13> The actinic ray-sensitive or radiation-sensitive resin composition as described in any one of <1> to <12>, wherein
the proportion of a repeating unit having a cyclic structure in the main chain in the resin (P) is 30 mol % or less.
<14> The actinic ray-sensitive or radiation-sensitive resin composition as described in any one of <1> to <13>, wherein
the resin (P) does not contain a repeating unit having a cyclic structure in the main chain.
<15> The actinic ray-sensitive or radiation-sensitive resin composition as described in any one of <1> to <14>, wherein
the resin (P) has a weight average molecular weight in the range of 1,000 to 100,000.
<16> The actinic ray-sensitive or radiation-sensitive resin composition as described in any one of <1> to <15>, further comprising:
a basic compound.
<17> The actinic ray-sensitive or radiation-sensitive resin composition as described in any one of <1> to <16>, which is exposed with an electron beam, an X-ray or an EUV ray.
<18> A resist film formed with the actinic ray-sensitive or radiation-sensitive resin composition described in any of any one of <1> to <17>.
<19> A pattern-forming method comprising:
exposing and developing the resist film described in <18>.

DETAILED DESCRIPTION OF THE INVENTION

The invention will be described in detail below.

Incidentally, in the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

"Actinic rays" or "radiations" in the invention means, for example, far ultraviolet rays, extreme ultraviolet rays, X-rays, electron means and the like represented by bright line spectra of mercury lamps and excimer lasers. Further, "light" in the invention means actinic rays or radiations.

Further, "exposure" in the specification includes not only exposure with far ultraviolet rays, X-rays and EUV rays represented by mercury lamps and excimer lasers but also imaging by corpuscular rays such as electron beams, ion beams and the like unless otherwise indicated.

The actinic ray-sensitive or radiation-sensitive resin composition in the invention contains (P) a resin containing repeating units (A), (B) and (C) shown below, and a solvent having a boiling temperature of 150° C. or less:

(A) a repeating unit containing a group capable of decomposing and forming an acid upon irradiation with an actinic ray or radiation, (B) a repeating unit containing a group capable of decomposing and forming a carboxylic acid by the action of an acid, and (C) a repeating unit containing a carbon-carbon unsaturated bond.

A repeating unit containing a group capable of decomposing and forming an acid upon irradiation with an actinic ray or radiation and also containing a carbon-carbon unsaturated bond is included in the repeating unit (A).

As the repeating unit (A), any repeating unit can be used so long as it is a repeating unit capable of decomposing and generating an acid upon irradiation with an actinic ray or radiation, but the repeating unit (A) is preferably a repeating unit having a structure capable of generating an acid anion on the side chain of the resin upon irradiation with an actinic ray or radiation.

The repeating unit (A) is preferably, for example, a repeating unit represented by any of the following formulae (III), (IV) and (V):

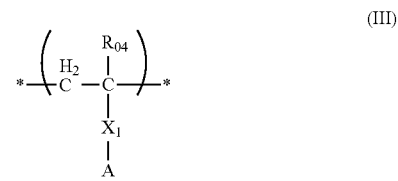

(III)

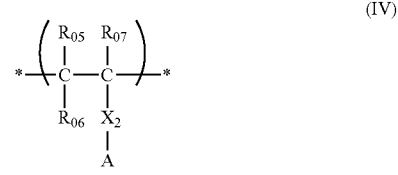

(IV)

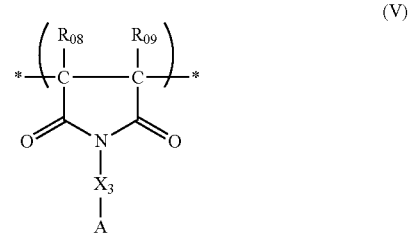

(V)

In formulae (III) to (V), each of $R_{04}$, $R_{05}$, and $R_{07}$ to $R_{09}$ independently represents a hydrogen atom, an alkyl group, a cycloalkyl group, a halogen atom, a cyano group, or an alkoxycarbonyl group.

$R_{06}$ represents a hydrogen atom, a cyano group, a carboxyl group, $-CO-OR_{25}$, or $-CO-N(R_{26})(R_{27})$. $R_{26}$ and $R_{27}$ may be bonded to form a ring with a nitrogen atom.

Each of $X_1$, $X_2$ and $X_3$ independently represents a single bond, an arylene group, an alkylene group, a cycloalkylene group, $-O-$, $-SO_2-$, $-CO-$, $-N(R_{33})-$, or a divalent linking group obtained by combining two or more of these groups.

$R_{25}$ represents an alkyl group, a cycloalkyl group, an alkenyl group, an aryl group, or an aralkyl group.

Each of $R_{26}$, $R_{27}$ and $R_{33}$ independently represents a hydrogen atom, an alkyl group, a cycloalkyl group, an alkenyl group, an aryl group, or an aralkyl group.

A represents a structural part capable of decomposing and generating an acid upon irradiation with an actinic ray or radiation.

As the alkyl group represented by $R_{04}$, $R_{05}$, and $R_{07}$ to $R_{09}$ in formulae (III) to (V), substituted or unsubstituted alkyl groups having 20 or less carbon atoms, e.g., a methyl group, an ethyl group, a propyl group, an isopropyl group, an n-butyl group, a sec-butyl group, a hexyl group, a 2-ethylhexyl group, an octyl group, and a dodecyl group are preferably exemplified, and more preferably alkyl groups having 8 or less carbon atoms are exemplified.

As the cycloalkyl group, monocyclic or polycyclic cycloalkyl groups are exemplified. Preferably, substituted or unsubstituted monocyclic cycloalkyl groups having 3 to 8 carbon atoms, e.g., a cyclopropyl group, a cyclopentyl group, and a cyclohexyl group are exemplified.

As the halogen atom, a fluorine atom, a chlorine atom, a bromine atom, and an iodine atom are exemplified, and a fluorine atom is more preferred.

As the alkyl group contained in the alkoxycarbonyl group, the same alkyl groups as in $R_{04}$, $R_{05}$, and $R_{07}$ to $R_{09}$ are preferred.

As the alkyl group represented by $R_{25}$ to $R_{27}$ and $R_{33}$, substituted or unsubstituted alkyl groups having 20 or less carbon atoms, e.g., a methyl group, an ethyl group, a propyl group, an isopropyl group, an n-butyl group, a sec-butyl group, a hexyl group, a 2-ethylhexyl group, an octyl group, and a dodecyl group are preferably exemplified, and more preferably alkyl groups having 8 or less carbon atoms are exemplified.

As the cycloalkyl group, monocyclic or polycyclic cycloalkyls groups are exemplified. Preferably, substituted or unsubstituted monocyclic cycloalkyl groups having 3 to 8 carbon atoms, e.g., a cyclopropyl group, a cyclopentyl group, and a cyclohexyl group are exemplified.

As the alkenyl group, substituted or unsubstituted alkenyl groups having 2 to 6 carbon atoms, e.g., a vinyl group, a propenyl group, an allyl group, a butenyl group, a pentenyl group, a hexenyl group, and a cyclohexenyl group are preferably exemplified.

As the aryl group, substituted or unsubstituted monocyclic or polycyclic aromatic groups having 6 to 14 carbon atoms are preferred, and specifically a phenyl group, a tolyl group, a chlorophenyl group, a methoxyphenyl group, and a naphthyl group are exemplified. Aryl groups may be bonded to each other to form a multiple ring.

As the aralkyl group, substituted or unsubstituted aralkyl groups having 7 to 15 carbon atoms, e.g., a benzyl group, a phenethyl group and a cumyl group are exemplified.

As the ring formed by bonding of $R_{26}$ and $R_{27}$ with a nitrogen atom, 5- to 8-membered rings are preferred, and specifically pyrrolidine, piperidine and piperazine are exemplified.

The arylene group represented by each of $X_1$, $X_2$ and $X_3$ is preferably a substituted or unsubstituted arylene group having 6 to 14 carbon atoms, and specifically a phenylene group, a tolylene group and a naphthylene group are exemplified.

The alkylene group may be straight chain or branched. The number of carbon atoms of the straight chain alkylene group is preferably 2 to 20, more preferably 3 to 18, and still more preferably 4 to 16. The number of carbon atoms of the branched alkylene group is preferably 4 to 20, and more preferably 5 to 18. As the specific examples, an ethylene group, a propylene group, a butylenes group, a hexylene group, and an octylene group are exemplified.

As the cycloalkylene group, preferably a substituted or unsubstituted cycloalkylene group having 5 to 8 carbon atoms, and, e.g., a cyclopentylene group and a cyclohexylene group are exemplified.

As the preferred examples of the substituents that each group in formulae (III) to (V) may have, a hydroxyl group, a halogen atom (e.g., fluorine, chlorine, bromine, iodine), a nitro group, a cyano group, an amido group, a sulfonamido group, alkyl groups exemplified in $R_{04}$ to $R_{09}$, $R_{25}$ to $R_{27}$ and $R_{33}$, alkoxy groups, e.g., a methoxy group, an ethoxy group, a hydroxyethoxy group, a propoxy group, a hydroxypropoxy group, and a butoxy group, alkoxycarbonyl groups, e.g., a methoxycarbonyl group and an ethoxycarbonyl group, acyl groups, e.g., a formyl group, an acetyl group and a benzoyl group, acyloxy groups, e.g., an acetoxy group and a butyryloxy group, and a carboxy group are exemplified. The number of substituents is preferably 8 or less.

A represents a structural part capable of decomposing and generating an acid upon irradiation with an actinic ray or radiation, specifically a photo-initiator for cationic photopolymerization, a photo-initiator for radical photopolymerization, a photo-decoloring agent for a dye, a photo-discoloring agent, and the structural parts of known compounds capable of generating an acid by the action of a light used in microresist and the like are exemplified.

As the structural part capable of generating an acid anion upon irradiation with an actinic ray or radiation, for example, onium structural parts such as a diazonium salt, an ammonium salt, a phosphonium salt, an iodonium salt, a sulfonium salt, a selenonium salt, and an arsonium salt are exemplified.

An ionic structural part containing a sulfonium salt or an iodonium salt is more preferred as A. More specifically, as A capable of generating an anion on the side chain of a resin upon irradiation with an actinic ray or radiation, a group represented by the following formula (ZI) or (ZII) is preferred. In the formulae, the straight lines extending from $Z^-$ in the left direction are bonding hands extending toward the main chain of the repeating unit (A).

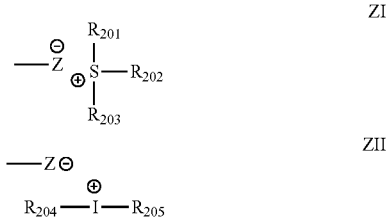

In formula (ZI), each of $R_{201}$, $R_{202}$ and $R_{203}$ independently represents an organic group.

The number of carbon atoms in the organic group represented by each of $R_{201}$, $R_{202}$ and $R_{203}$ is generally 1 to 30 and preferably 1 to 20.

Further, two of $R_{201}$, $R_{202}$ and $R_{203}$ may be bonded to each other to form a ring, and an oxygen atom, a sulfur atom, an ester bond, an amido bond, or a carbonyl group may be contained in the ring. As the group formed by two of $R_{201}$, $R_{202}$ and $R_{203}$ by bonding, an alkylene group (e.g., a butylene group, a pentylene group) can be exemplified.

$Z^-$ represents an acid anion decomposed and generated upon irradiation with an actinic ray or radiation, and a non-nucleophilic anion is preferred. As the non-nucleophilic anion, e.g., a sulfonate anion, a carboxylate anion, a phosphate anion, a sulfonylimide anion, a bis(alkylsulfonyl)imide anion, and a tris(alkylsulfonyl)methyl anion can be exemplified.

A non-nucleophilic anion is an anion having an extremely low ability of causing nucleophilic reaction and capable of inhibiting aging decomposition by intramolecular nucleophilic reaction. The aging stability of a resin is improved and the aging stability of a resist is also improved by the presence of such a non-nucleophilic anion.

As the organic group represented by each of $R_{201}$, $R_{202}$ and $R_{203}$, an aryl group, an alkyl group, a cycloalkyl group, a cycloalkenyl group and an indolyl group are exemplified. Here, in the cycloalkyl group and cycloalkenyl group, at least one of carbon atoms forming a ring may be carbonyl carbon.

It is preferred that at least one of $R_{201}$, $R_{202}$ and $R_{203}$ is an aryl group, and more preferably all of the three are aryl groups.

As the aryl group represented by each of $R_{201}$, $R_{202}$ and $R_{203}$, a phenyl group and a naphthyl group are preferred, and a phenyl group is more preferred.

As the alkyl group, cycloalkyl group and cycloalkenyl group represented by each of $R_{201}$, $R_{202}$ and $R_{203}$, a straight chain or branched alkyl group having 1 to 10 carbon atoms (e.g., a methyl group, an ethyl group, a propyl group, a butyl group, a pentyl group), a cycloalkyl group having 3 to 10 carbon atoms (e.g., a cyclopentyl group, a cyclohexyl group, a norbonyl group), and a cycloalkenyl group having 3 to 10 carbon atoms (e.g., a cyclopentadienyl group, a cyclohexenyl group) are respectively exemplified.

The organic groups such as an aryl group, an alkyl group, a cycloalkyl group, a cycloalkenyl group and an indolyl group represented by $R_{201}$, $R_{202}$ and $R_{203}$ may further have a substituent. As the substituents, a nitro group, a halogen atom, e.g., a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxylalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), and a cycloalkenylalkyl group (preferably having 4 to 20 carbon atoms) are exemplified, but the substituents are not restricted to these groups.

In the cycloalkyl group and cycloalkenyl group as the substituents that each group represented by $R_{201}$, $R_{202}$ and $R_{203}$ may have, at least one of carbon atoms forming a ring may be carbonyl carbon.

Each of the substituents that each group represented by $R_{201}$, $R_{202}$ and $R_{203}$ may have may further have a substituent, and as the examples of such further substituents, the same substituents as described above as the examples of the substituents that each group represented by $R_{201}$, $R_{202}$ and $R_{203}$ may have can be exemplified, but an alkyl group and a cycloalkyl group are preferred.

As preferred structures in the case where at least one of $R_{201}$, $R_{202}$ and $R_{203}$ is not an aryl group, the cationic structures such as the compounds disclosed in JP-A-2004-233661, paragraphs [0046] and [0047], JP-A-2003-35948, paragraphs [0040] to [0046], the compounds represented by formulae (I-1) to (I-70) in U.S. Patent Application No. 2003/0224288, and the compounds represented by formulae (IA-1) to (IA-54), and formulae (IB-1) to (IB-24) in U.S. Patent Application No. 2003/0077540 can be exemplified.

In formula (ZII), each of $R_{204}$ and $R_{205}$ independently represents an aryl group, an alkyl group or a cycloalkyl group. These aryl, alkyl and cycloalkyl groups are the same as the groups described as the aryl, alkyl and cycloalkyl groups as $R_{201}$, $R_{202}$ and $R_{203}$ in the group represented by formula (ZI).

The aryl group represented by each of $R_{204}$ to $R_{207}$ may be an aryl group having a heterocyclic structure having an oxygen atom, a nitrogen atom or a sulfur atom. As the aryl groups having a heterocyclic structure, for example, a pyrrole residue (a group formed by depriving pyrrole of one hydrogen atom), a furan residue (a group formed by depriving furan of one hydrogen atom), a thiophene residue (a group formed by depriving thiophene of one hydrogen atom), an indole residue (a group formed by depriving indole of one hydrogen atom), a benzofuran residue (a group formed by depriving benzofuran of one hydrogen atom), and a benzothiophene residue (a group formed by depriving benzothiophene of one hydrogen atom) can be exemplified.

The aryl group, alkyl group and cycloalkyl group represented by each of $R_{204}$ and $R_{205}$ may have a substituent. As the substituents, the same groups as the groups which the aryl group, alkyl group and cycloalkyl group represented by $R_{201}$ to $R_{203}$ in formula (ZI) may have are exemplified.

$Z^-$ represents an acid anion decomposed and generated upon irradiation with an actinic ray or radiation, and a non-nucleophilic anion is preferred. The same anions as those represented by $Z^-$ in formula (ZI) are exemplified.

As A capable of generating a cation on the side chain upon irradiation with an actinic ray or radiation, a group represented by the following formula (ZCI) or (ZCII) is also preferred. In the formulae, the straight lines extending from $s^+$ and $I^+$ in the left direction are bonding hands extending toward the main chain of the repeating unit (A).

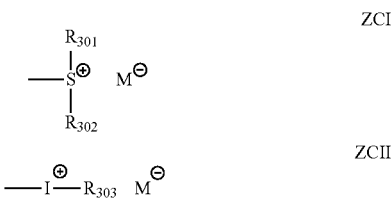

In formulae (ZCI) and (ZCII), each of $R_{301}$ and $R_{302}$ independently represents an organic group.

The number of carbon atoms in the organic group represented by each of $R_{301}$ and $R_{302}$ is generally 1 to 30 and preferably 1 to 20.

Further, $R_{301}$ and $R_{302}$ may be bonded to each other to form a ring, and an oxygen atom, a sulfur atom, an ester bond, an amido bond, or a carbonyl group may be contained in the ring. As the group formed by bonding of $R_{301}$ and $R_{302}$, an alkylene group (e.g., a butylene group, a pentylene group) can be exemplified.

As the organic group represented by $R_{301}$ and $R_{302}$, specifically the aryl group, alkyl group and cycloalkyl group given as the examples of $R_{201}$ to $R_{203}$ in formula (ZI) can be exemplified.

$M^-$ represents a non-nucleophilic anion-containing compound, for example, a sulfonate anion-containing compound, a carboxylate anion-containing compound, a phosphate anion-containing compound, a sulfonylimide anion-containing compound, a bis(alkylsulfonyl)imide anion-containing compound, and a tris(alkylsulfonyl)methyl anion-containing compound can be exemplified.

$R_{303}$ represents an organic group. The number of carbon atoms of the organic group represented by $R_{303}$ is generally 1 to 30 and preferably 1 to 20. As the organic group represented by $R_{303}$, specifically the aryl group, alkyl group and cycloalkyl group shown as the specific examples of $R_{204}$ and $R_{205}$ in formula (ZII) can be exemplified.

The repeating unit (A) more preferably has a structure capable of generating an acid anion on the side chain of a resin upon irradiation with an actinic ray or radiation. By selecting such a structure, diffusion of generated acid anion can be restrained and effective from the aspect of the improvements of resolution and line edge roughness.

The preferred specific examples of A are shown below but the invention is by no means limited thereto.

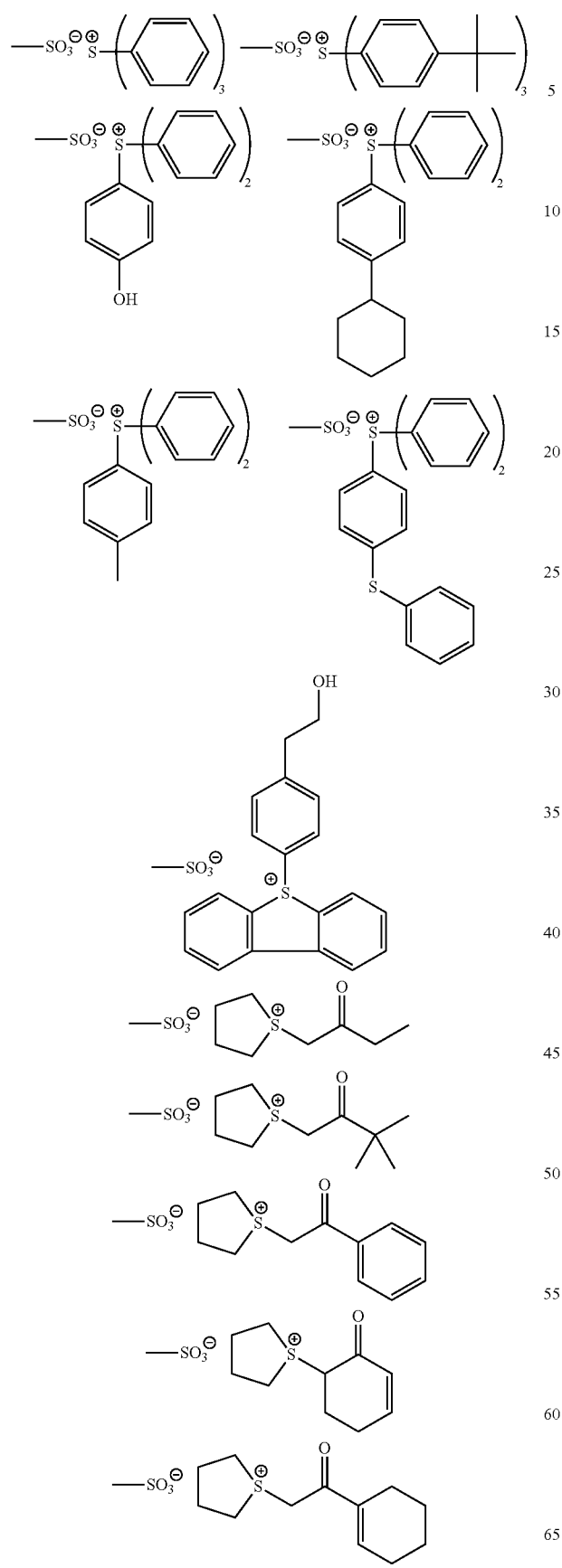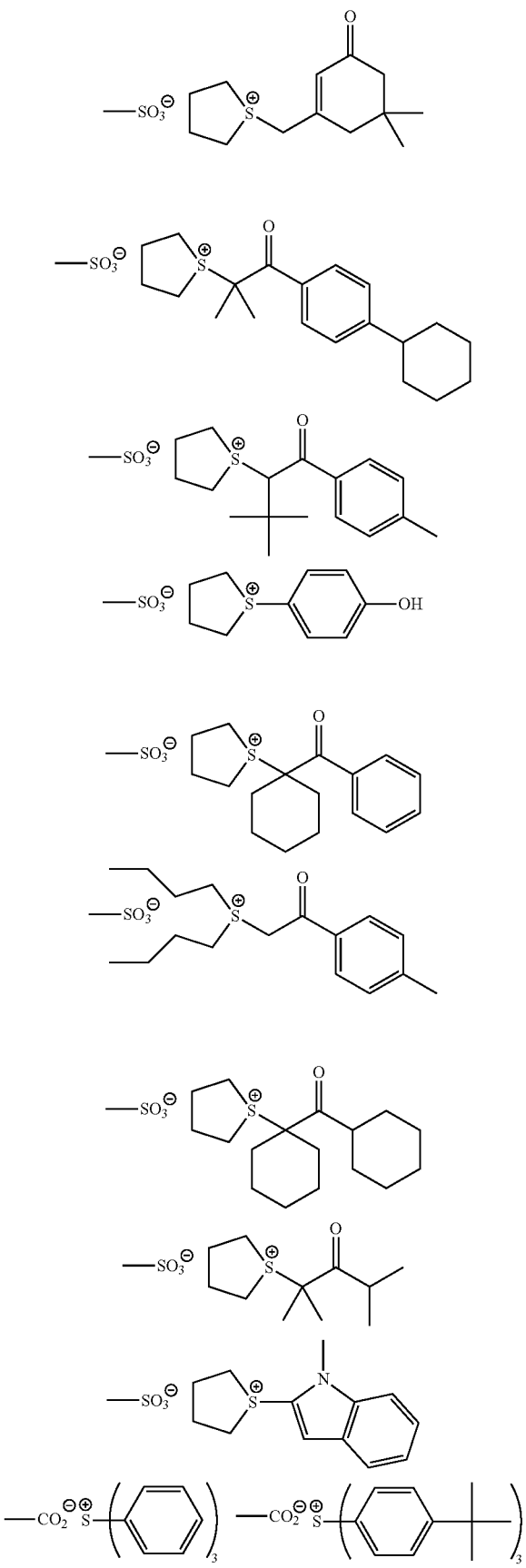

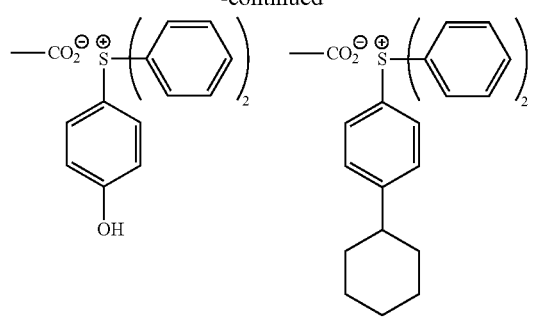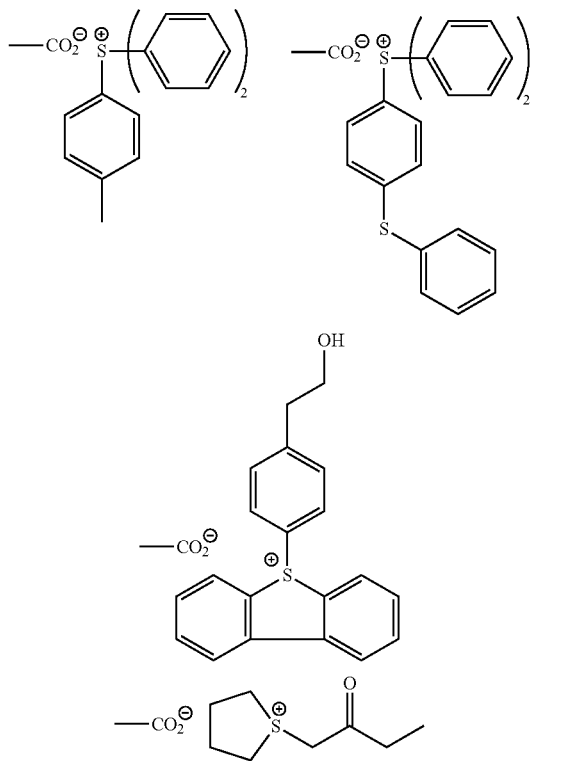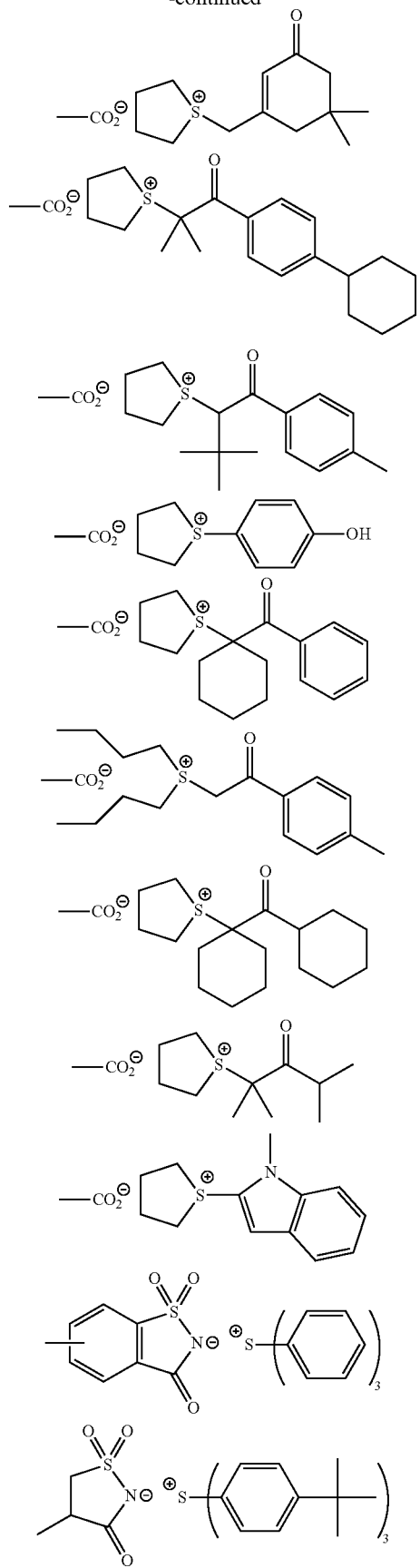

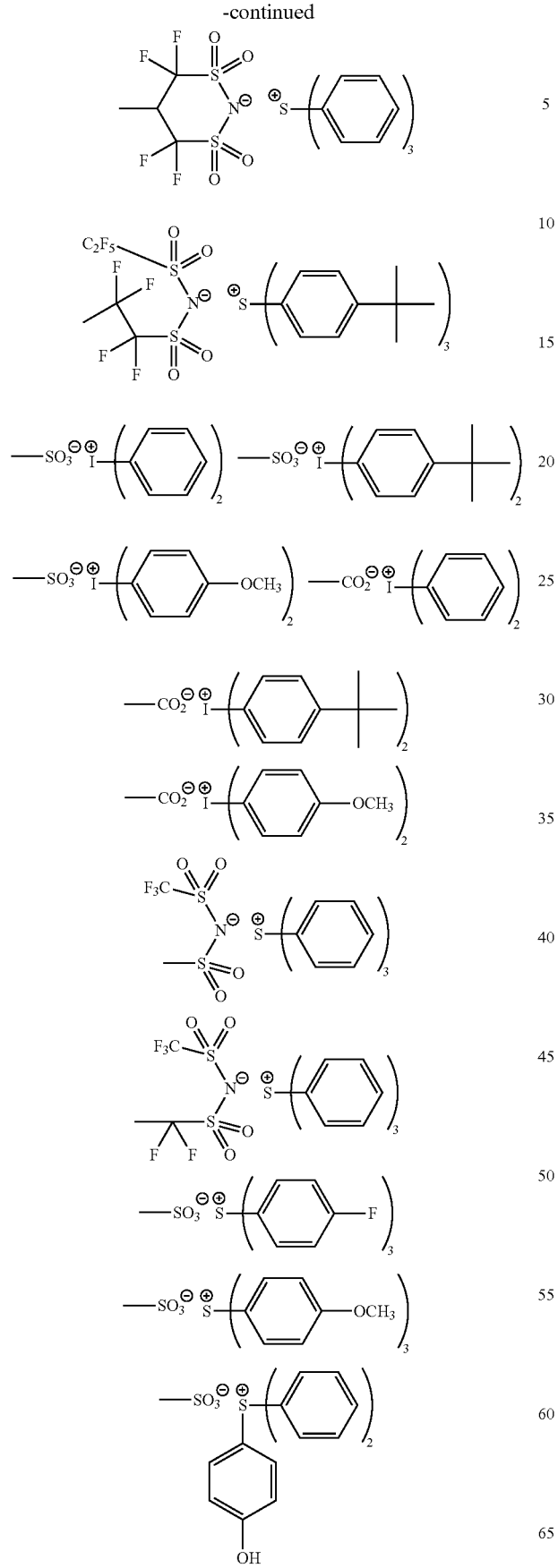
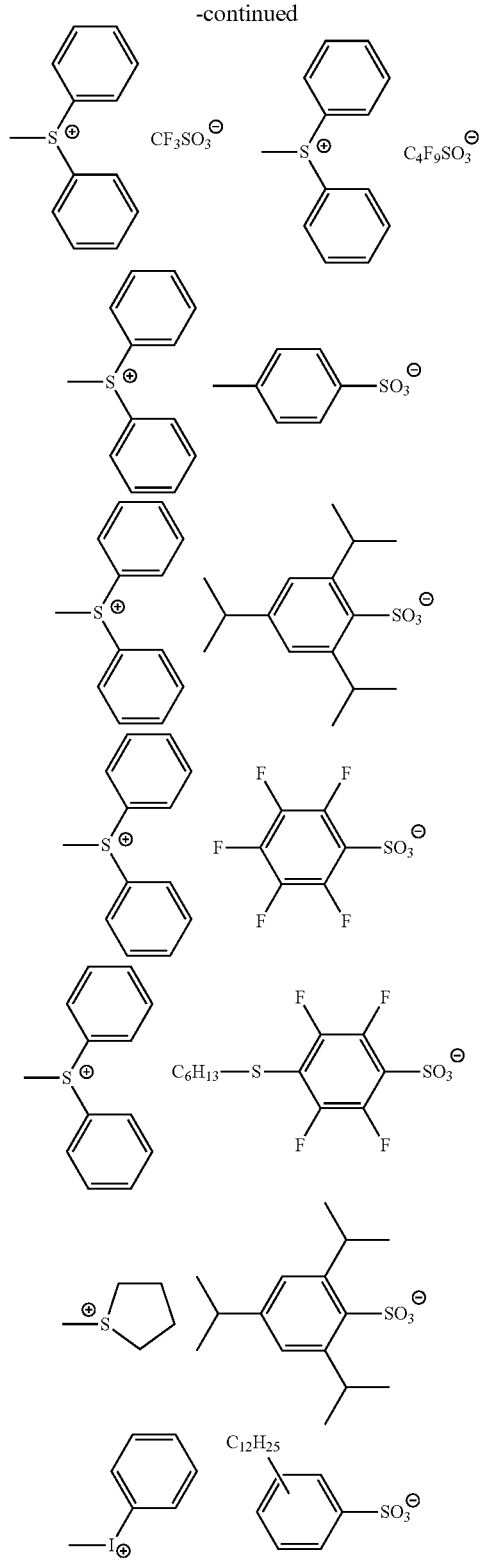
The content of the repeating unit (A) in the resin (P) of the invention is preferably in the range of 0.5 to 80 mol % of all the repeating units, more preferably in the range of 1 to 60 mol %, and especially preferably in the range of 2 to 40 mol %. One kind of repeating unit (A) may be used alone, or two or more kinds may be used in combination.

The synthesizing method of a monomer corresponding to repeating unit (A) is not especially restricted but, for example, a synthesizing method of exchanging an acid anion having a polymerizable unsaturated bond corresponding to the repeating unit with a halide of a known onium salt can be exemplified.

More specifically describing, a monomer corresponding to objective repeating unit (A) can be synthesized by stirring a metal ion salt of an acid having a polymerizable unsaturated bond corresponding to the repeating unit (e.g., a sodium ion, a potassium ion, etc.) or ammonium salt (ammonium, triethyl ammonium, etc.) and an onium salt having a halogen ion (a chloride ion, a bromide ion, an iodide ion, etc.) in the presence of water or methanol to perform anion exchange reaction, and then separating and washing operations with an organic solvent, e.g., dichloromethane, chloroform, ethyl acetate, methyl isobutyl ketone, tetrahydroxyfuran, or the like, and water.

Further, the monomer can also be synthesized by stirring the above compounds in the presence of an organic solvent separable from water, e.g., dichloromethane, chloroform, ethyl acetate, methyl isobutyl ketone, tetrahydroxyfuran, or the like, and water to perform anion exchange reaction, and then separating and washing operations with water.

The specific examples of repeating units (A) are shown below, but the invention is by no means restricted thereto.

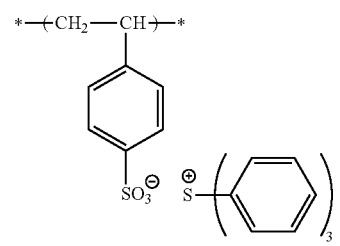

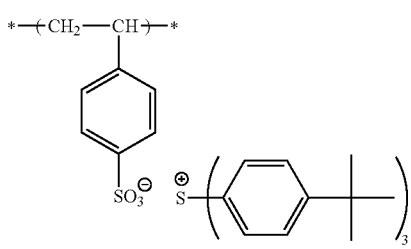

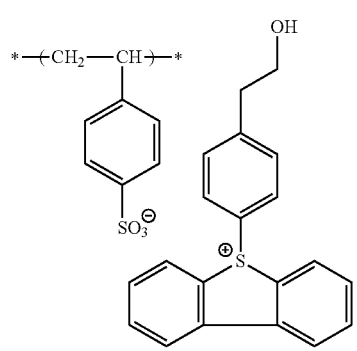

-continued

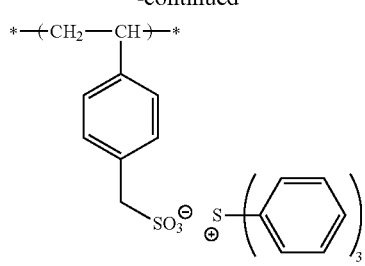

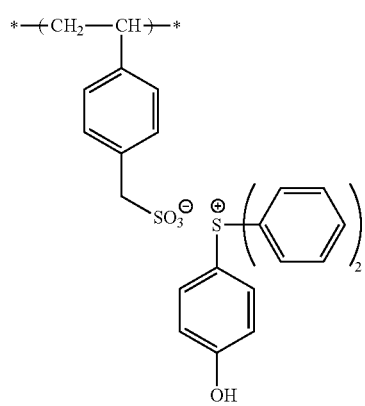

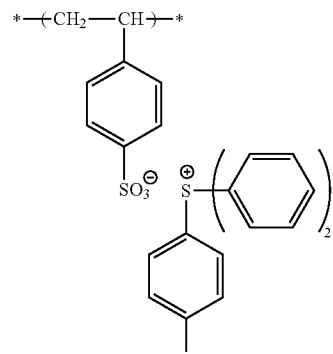

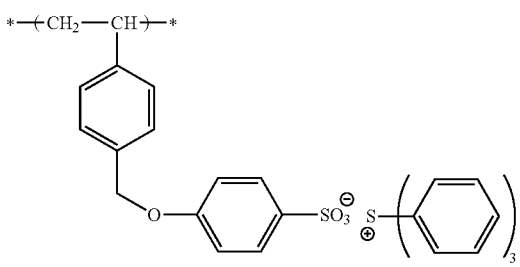

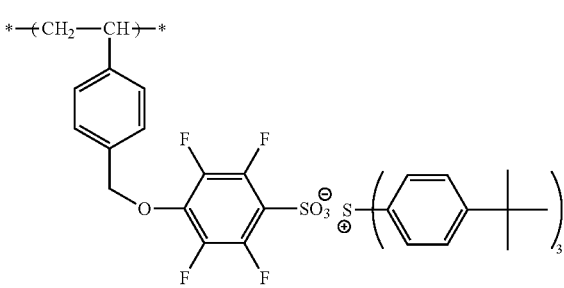

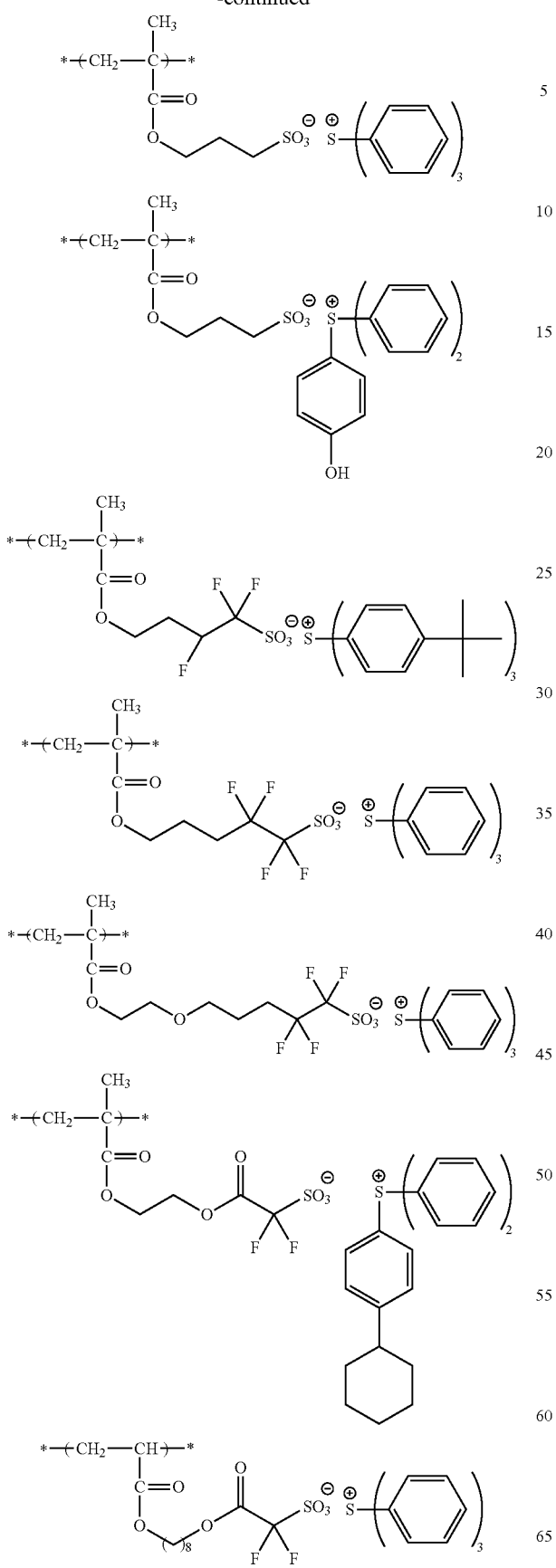
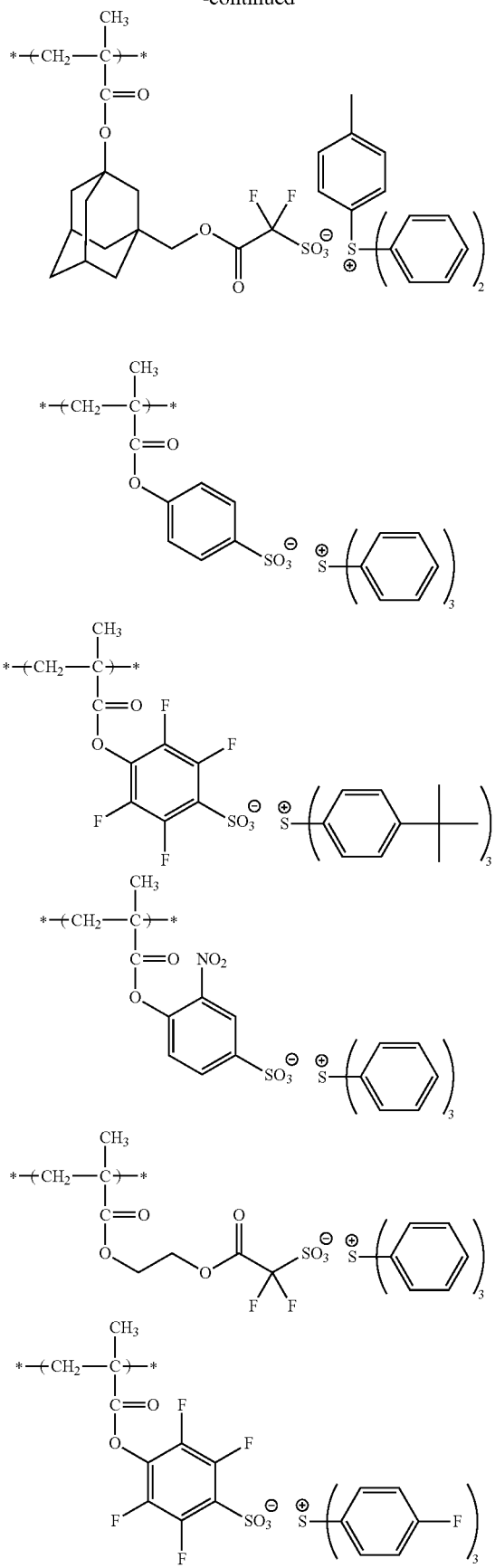

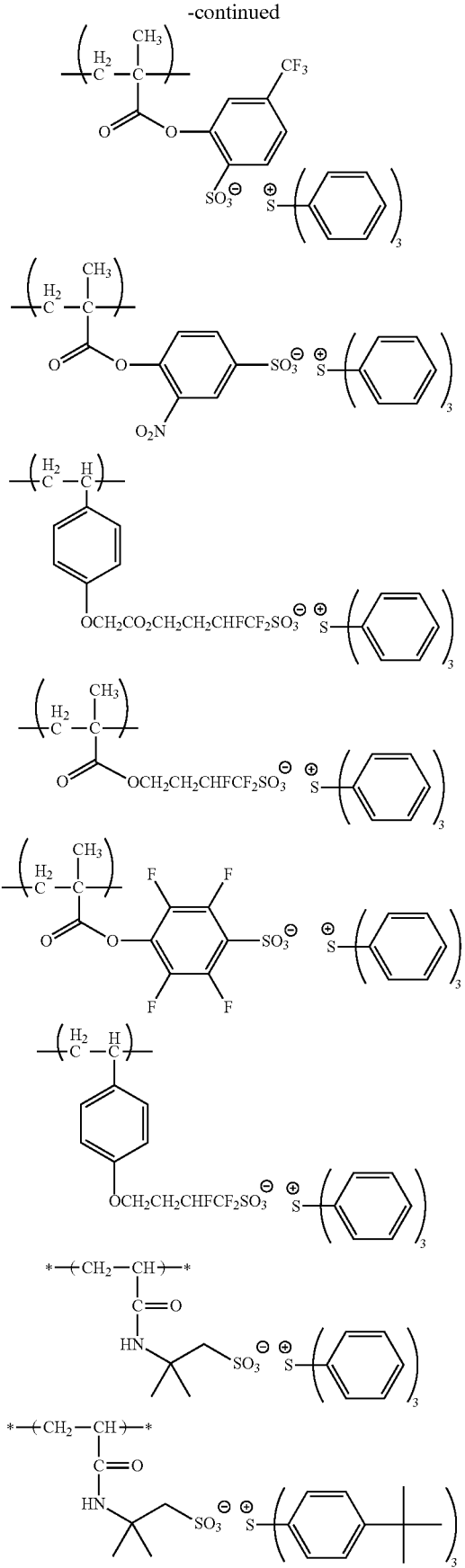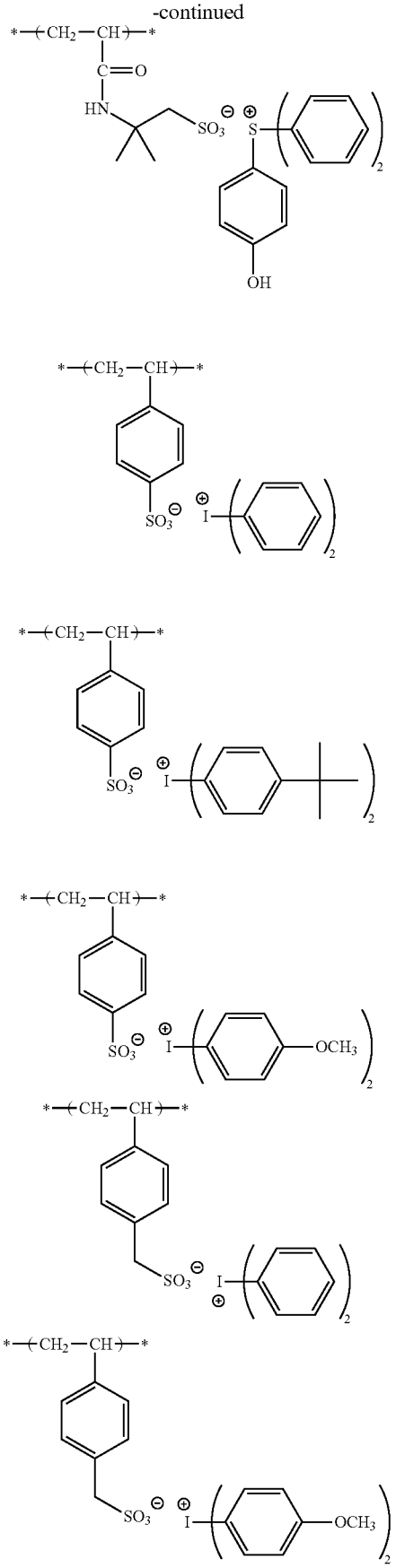

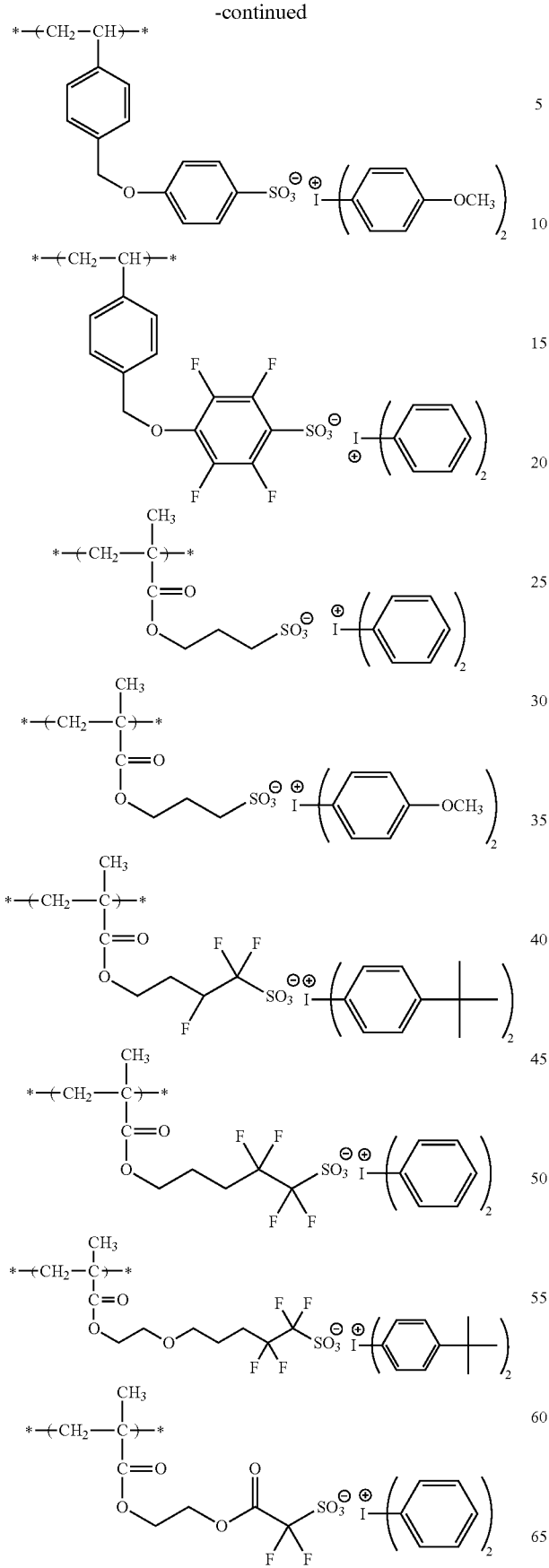
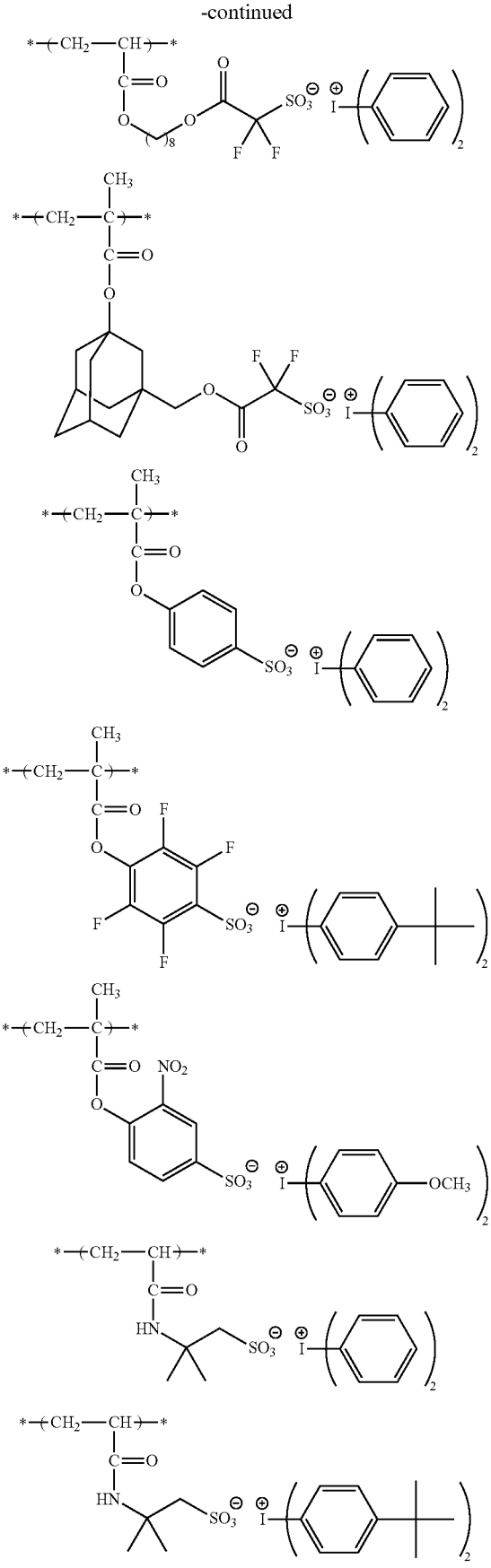

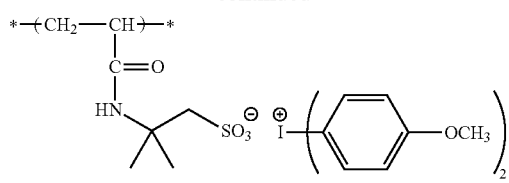
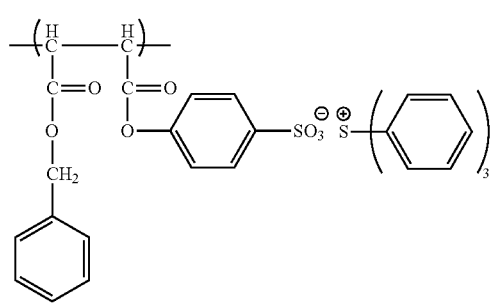
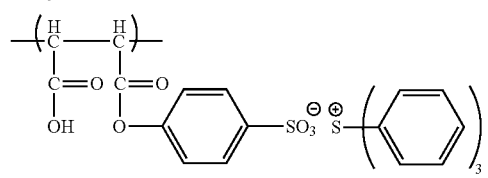
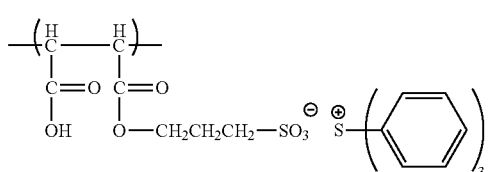
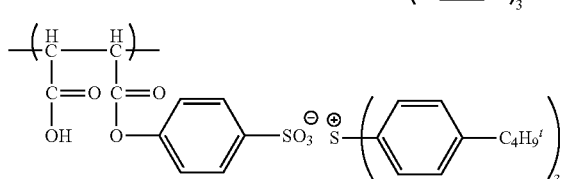
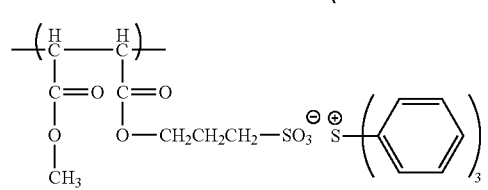
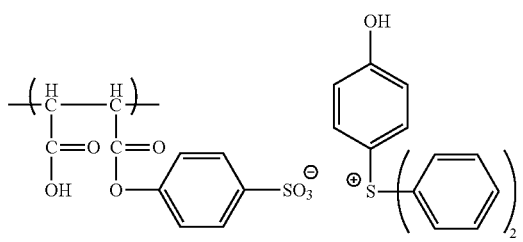
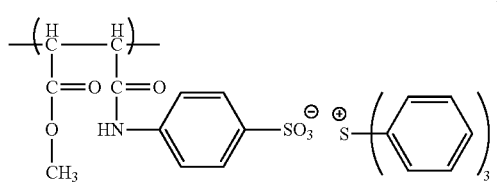
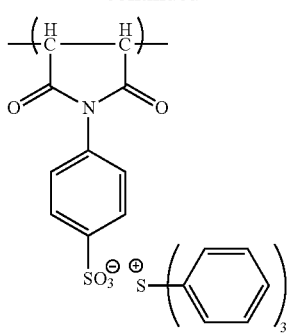
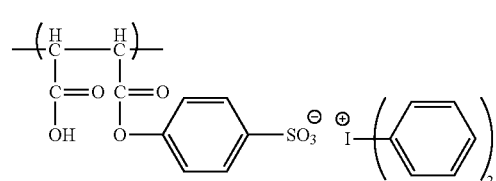
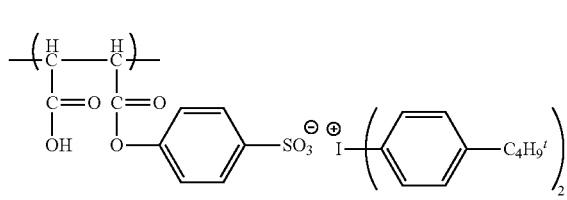
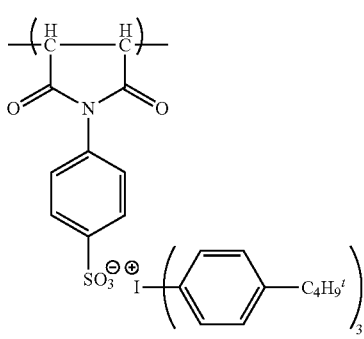
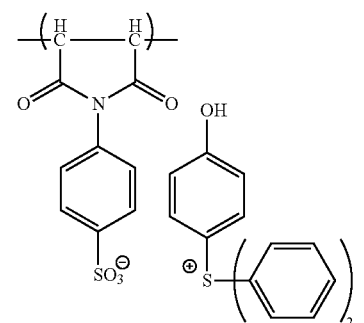
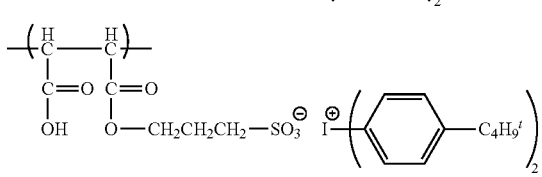

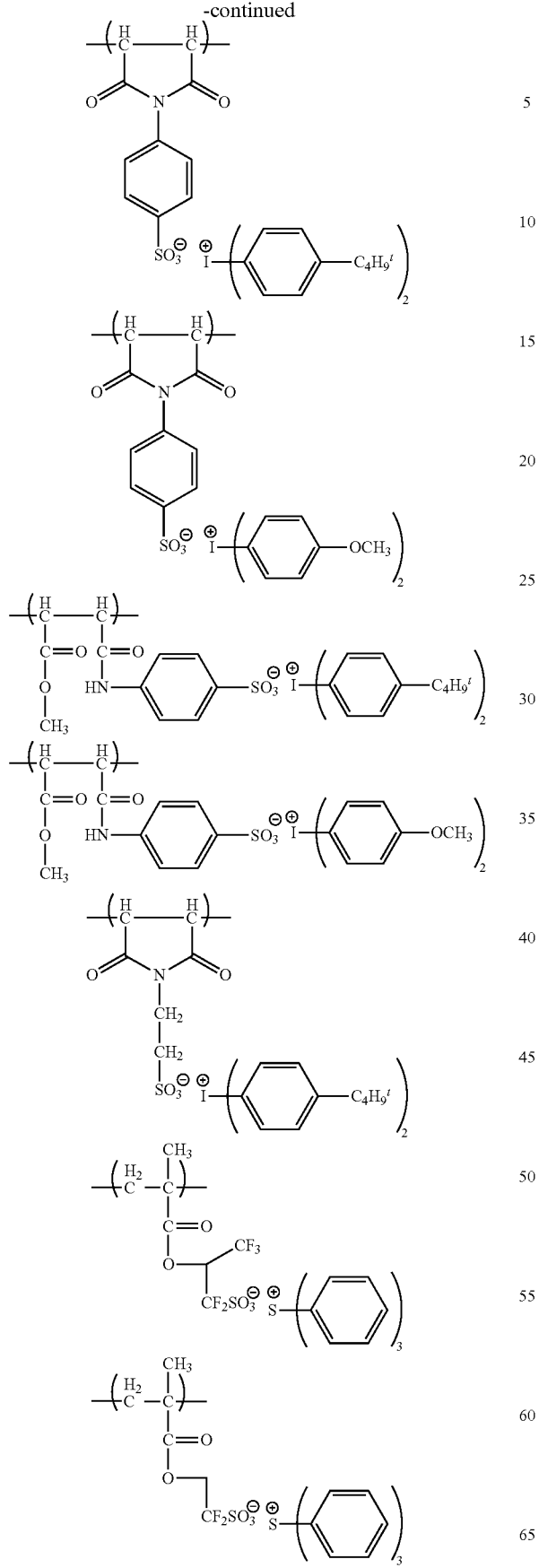
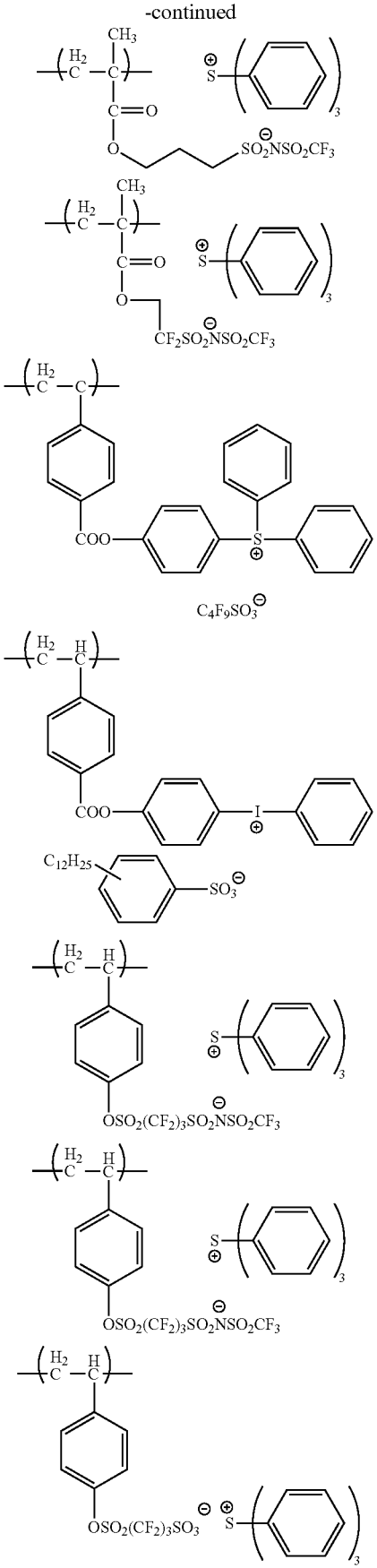

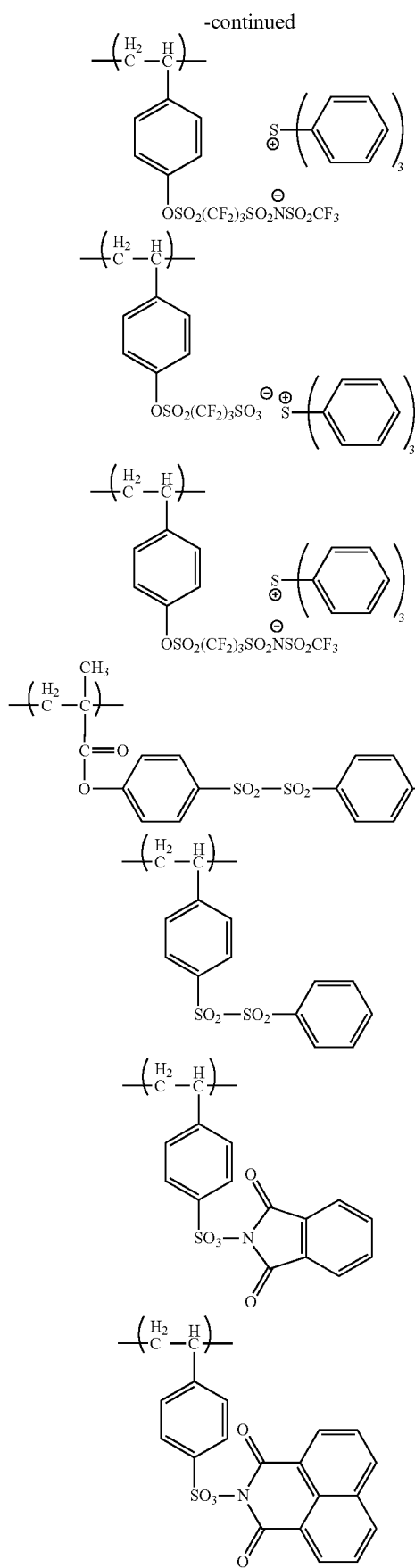

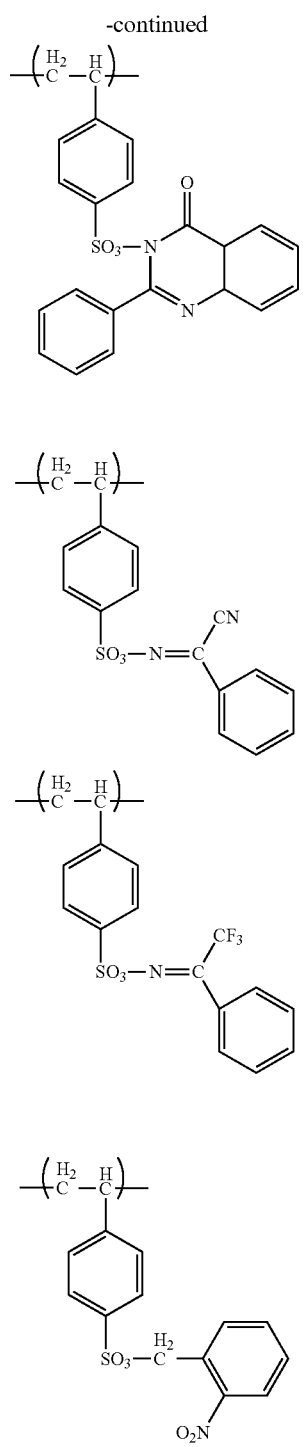

Repeating unit (A) may be a repeating unit having a nonionic acid-generating part, such as the exemplified compounds (a31) to (a126) and (a145) to (a196) in JP-A-10-221852.

As the repeating unit (B), any repeating unit can be used so long as it is a repeating unit containing a group capable of decomposing and forming a carboxylic acid by the action of an acid.

A repeating unit represented by the following formula (I) is preferably used as the repeating unit (B).

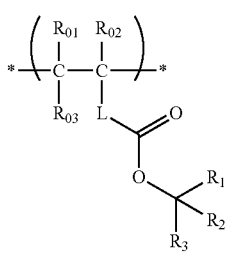

(I)

In formula (I), each of $R_{01}$, $R_{02}$ and $R_{03}$ independently represents a hydrogen atom, an alkyl group, a cycloalkyl group, a halogen atom, a cyano group, or an alkoxycarbonyl group. $R_{03}$ also may represent an alkylene group and be bonded to L to form a 5- or 6-membered ring. L represents a single bond or a divalent linking group (provided that L represents a trivalent linking group when bonded to $R_{03}$ to form a 5- or 6-membered ring). $R_1$ represents an alkyl group, and each of $R_2$ and $R_3$ independently represents a hydrogen atom, an alkyl group, a cycloalkyl group or an aryl group. $R_2$ and $R_3$ may be bonded to each other to form a ring, provided that $R_2$ and $R_3$ do not represent a hydrogen atom at the same time.

As the alkyl group, cycloalkyl group, halogen atom and alkoxycarbonyl group represented by any of $R_{01}$ to $R_{03}$, the same groups as described above in $R_{04}$ to $R_{05}$ and $R_{07}$ to $R_{09}$ can be exemplified.

As the divalent linking group represented by L, an alkylene group, an arylene group, an aralkylene group, —COO-$L_1$-, —O-$L_1$-, and a group formed by combining two or more of the above can be exemplified. $L_1$ represents an alkylene group, a cycloalkylene group, an arylene group, or an aralkylene group.

L preferably represents a single bond, —COO-$L_1$- ($L_1$ preferably represents an alkylene group having 1 to 5 carbon atoms, more preferably a methylene group or a propylene group), or an arylene group.

The alkyl group represented by each of $R_1$ to $R_3$ is preferably an alkyl group having 1 to 20 carbon atoms, more preferably an alkyl group having 1 to 10 carbon atoms, and especially preferably an alkyl group having 1 to 4 carbon atoms, e.g., a methyl group, an ethyl group, an n-propyl group, an isopropyl group, an n-butyl group, an isobutyl group, or a t-butyl group.

The cycloalkyl group represented by each of $R_2$ and $R_3$ preferably has 1 to 20 carbon atoms, which may be monocyclic such as a cyclopentyl group or a cyclohexyl group, or may be polycyclic such as a norbonyl group, a tetracyclodecanyl group, or a tetracyclododecanyl group, but monocyclic is more preferred from the viewpoint of the solubility in a resist solvent.

The ring formed by bonding of $R_2$ and $R_3$ to each other preferably has 3 to 20 carbon atoms, which may be monocyclic such as a cyclopentyl group or a cyclohexyl group, or may be polycyclic such as a norbonyl group, a tetracyclodecanyl group, or a tetracyclododecanyl group, but monocyclic is more preferred from the viewpoint of the solubility in a resist solvent. When $R_2$ and $R_3$ are bonded to each other to form a ring, $R_1$ preferably represents an alkyl group having 1 to 3 carbon atoms, and more preferably represents a methyl group or an ethyl group.

The aryl group represented by each of $R_2$ and $R_3$ preferably has 6 to 20 carbon atoms, e.g., a phenyl group and a naphthyl group are exemplified. When either $R_2$ or $R_3$ represents a hydrogen atom, another is preferably an aryl group.

The content of the repeating unit (B) in the resin (P) is preferably in the range of 5 to 90 mol % of all the repeating units, more preferably in the range of 10 to 80 mol %, and still more preferably in the range of 20 to 70 mol %. One kind of repeating unit (B) may be used alone, or two or more kinds may be used in combination.

The synthesizing method of a monomer corresponding to the repeating unit (B) is not especially restricted and ordinary synthesizing methods of polymerizable group-containing esters can be used.

The specific examples of repeating units (B) in the resin (P) are shown below, but the invention is not restricted thereto.

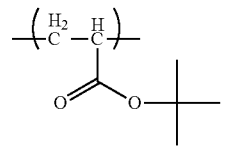

(I-1)

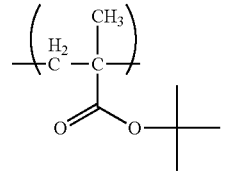

(I-2)

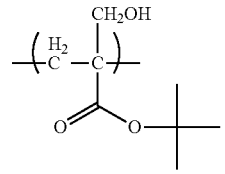

(I-3)

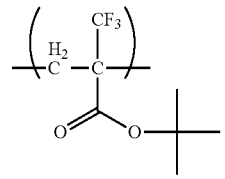

(I-4)

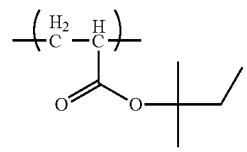

(I-5)

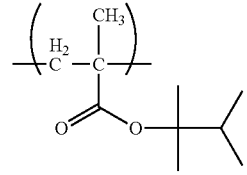

(I-6)

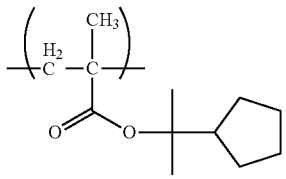

(I-7)

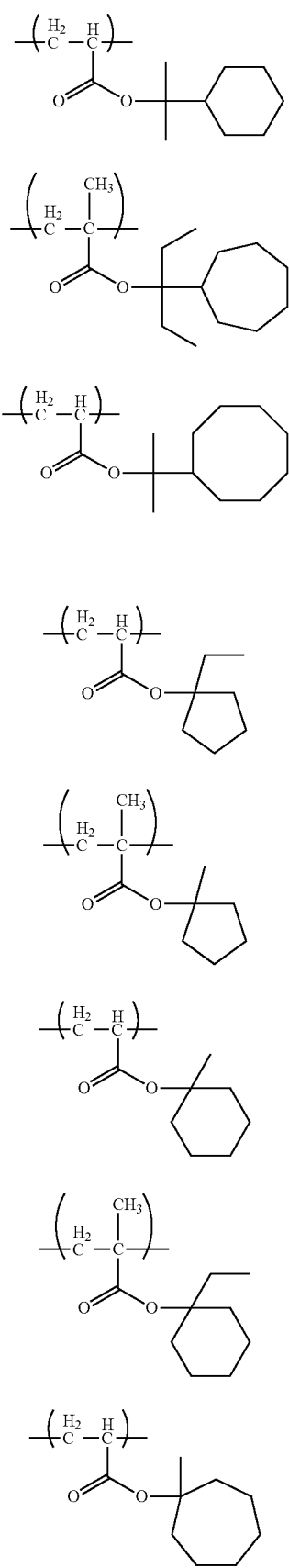
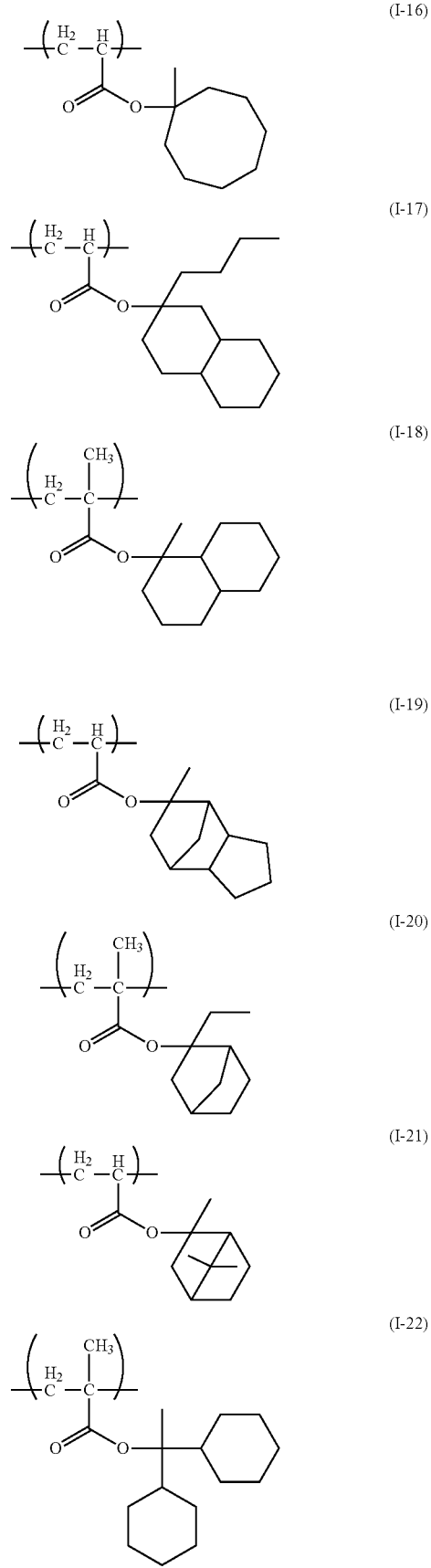

(I-23) 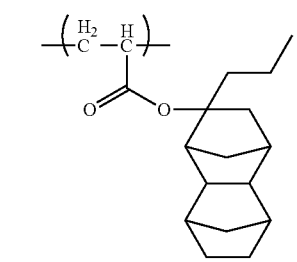
(I-24) 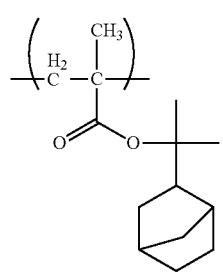
(I-25) 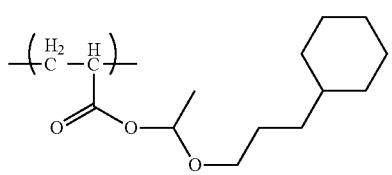
(I-26) 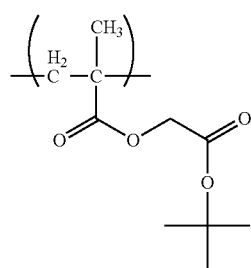
(I-27) 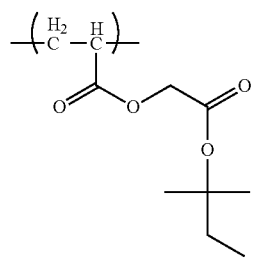
(I-28) 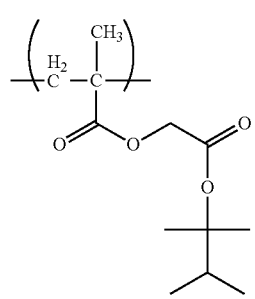
(I-29) 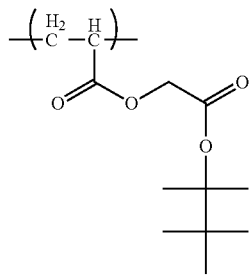
(I-30) 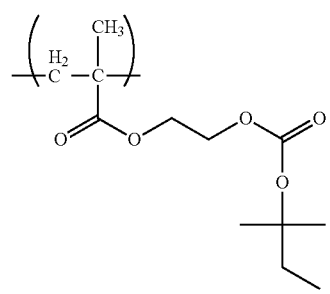
(I-31) 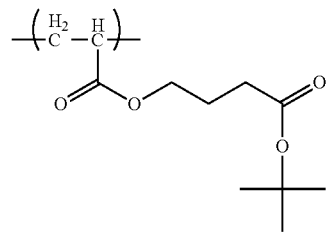
(I-32) 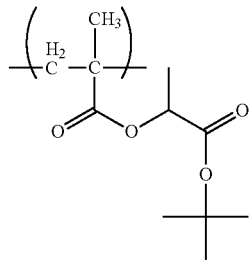
(I-33) 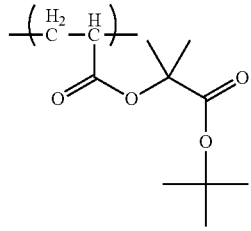
(I-34) 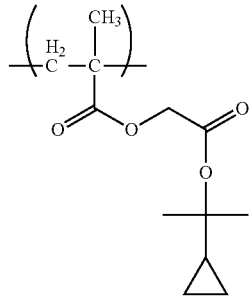

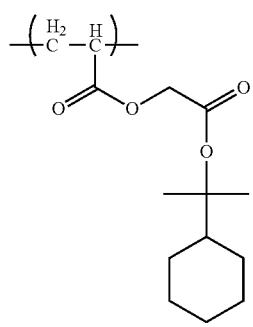 (I-35)
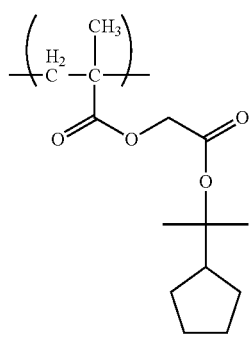 (I-39)
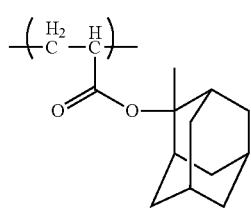 (I-40)
(I-36)
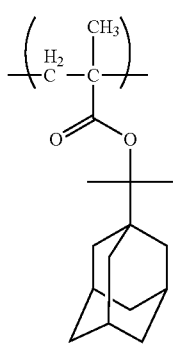 (I-41)
(I-37)
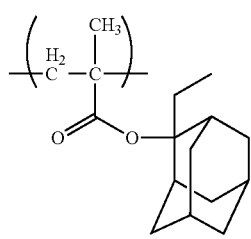 (I-42)
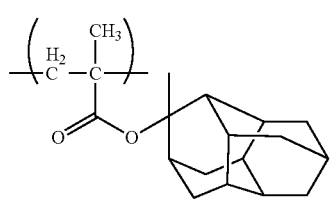 (I-43)
(I-38)
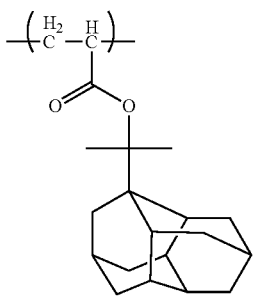 (I-44)

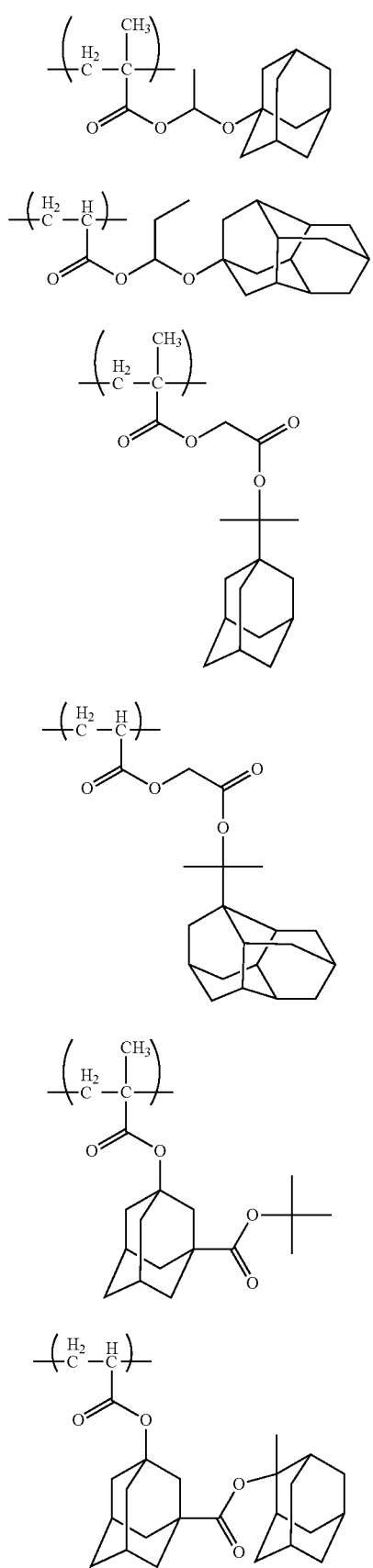
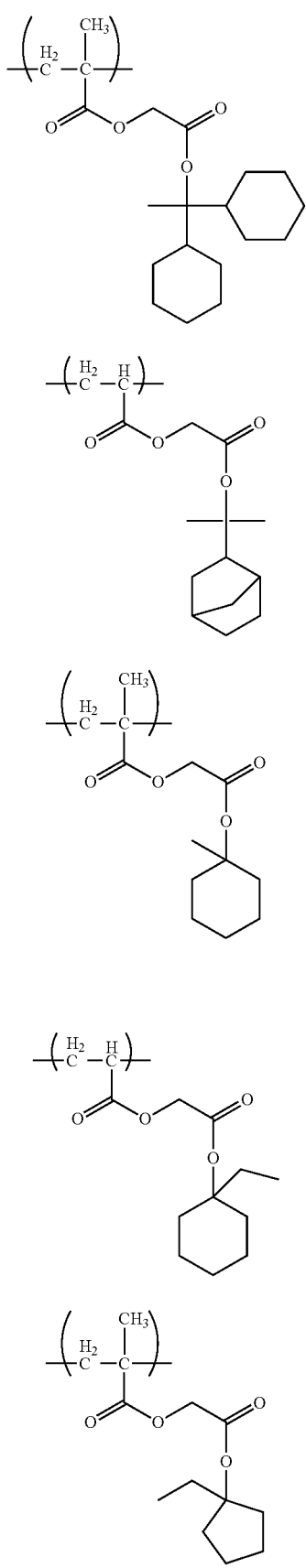

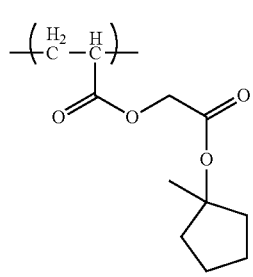 (I-56)
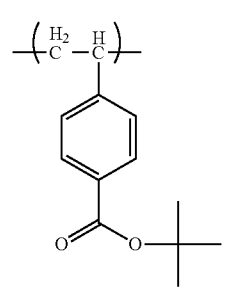 (I-57)
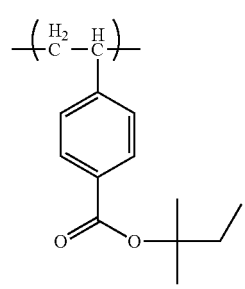 (I-58)
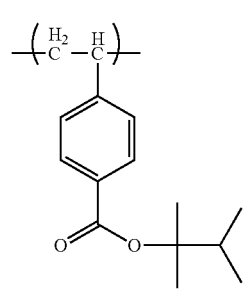 (I-59)
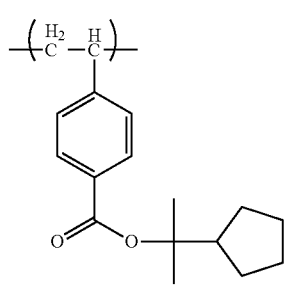 (I-60)
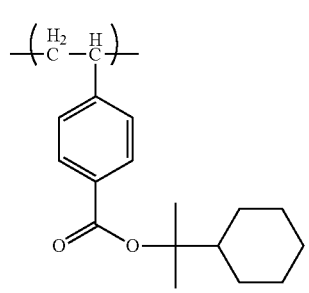 (I-61)
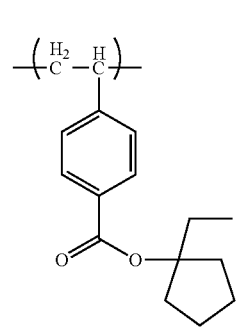 (I-62)
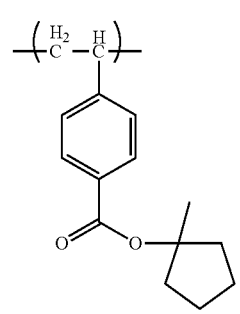 (I-63)
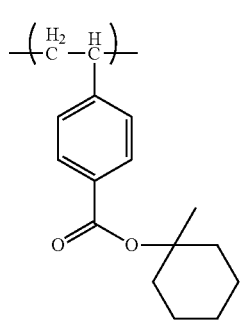 (I-64)
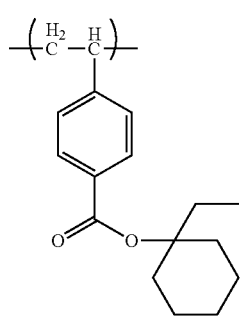 (I-65)

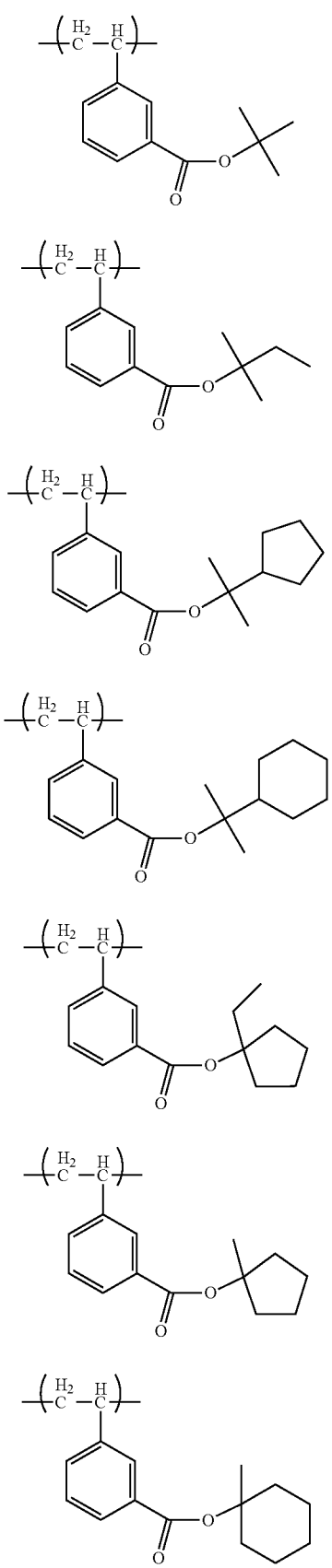
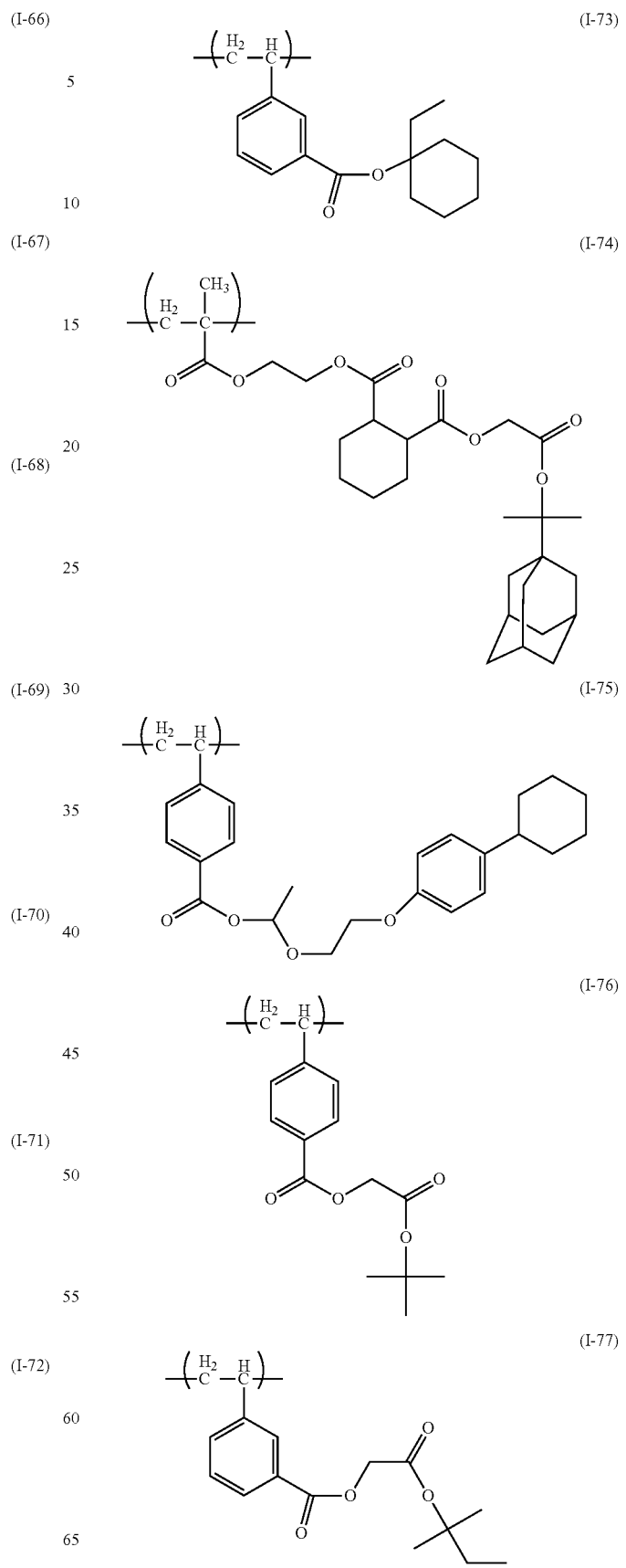

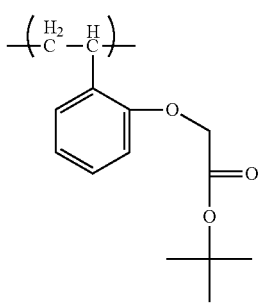 (I-78)
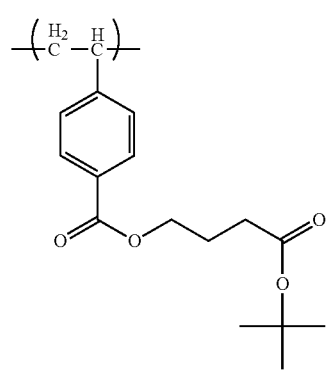 (I-79)
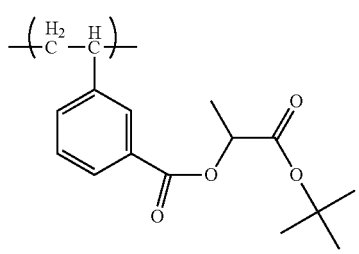 (I-80)
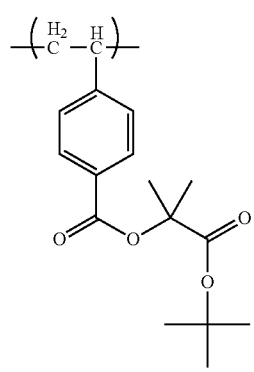 (I-81)
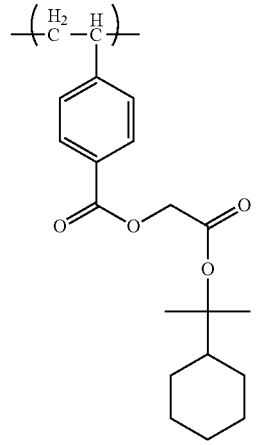 (I-82)
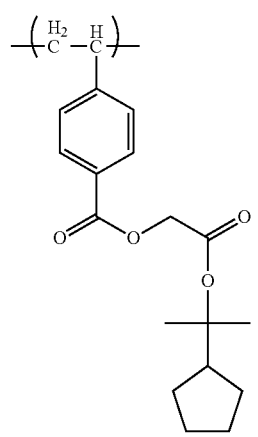 (I-83)
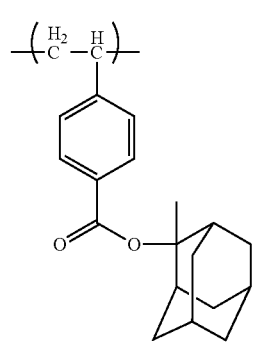 (I-84)
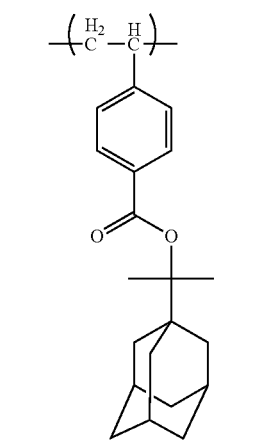 (I-85)

(I-86) 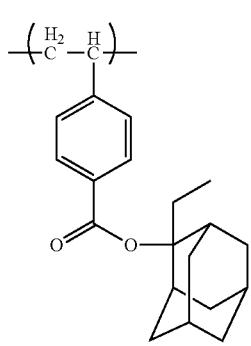
(I-87) 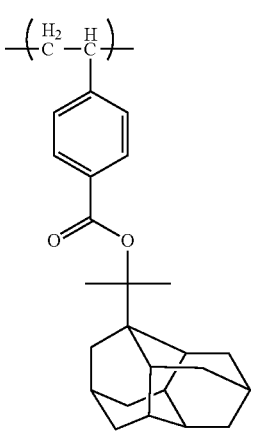
(I-88) 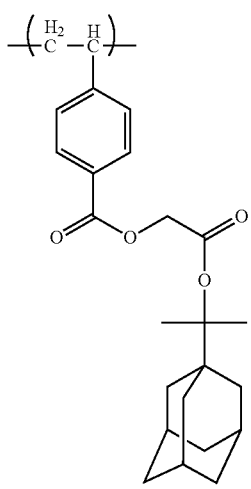
(I-89) 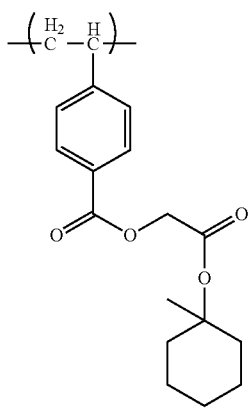
(I-90) 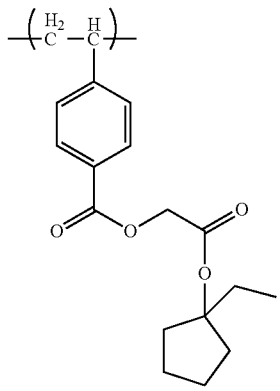
(I-91) 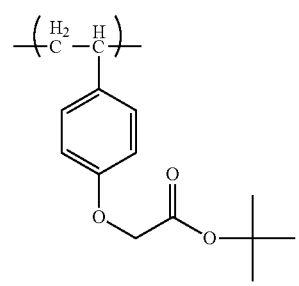
(I-92) 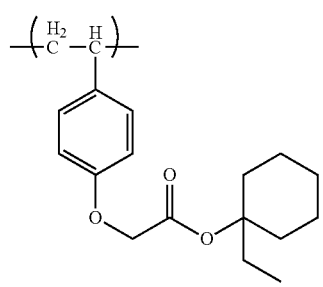
(I-93) 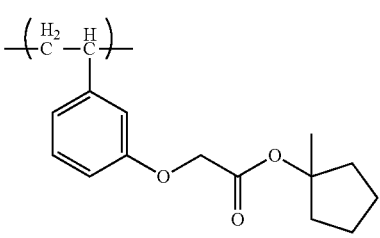
(I-94) 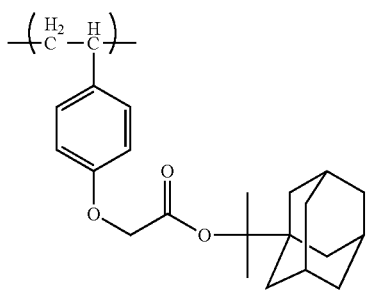

-continued

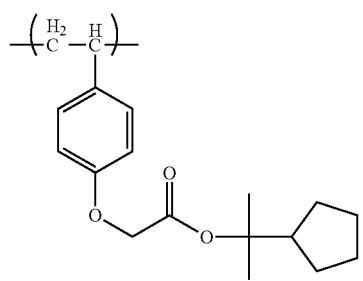
(I-96)

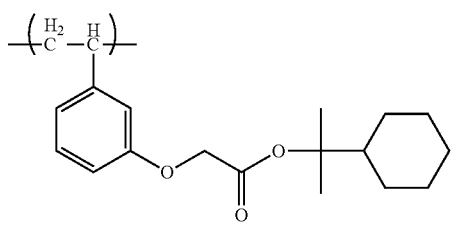
(I-97)

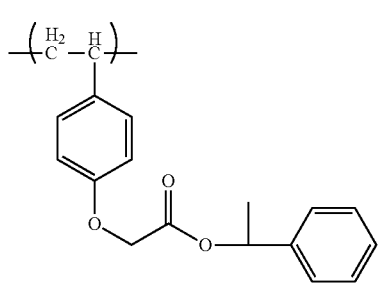
(I-98)

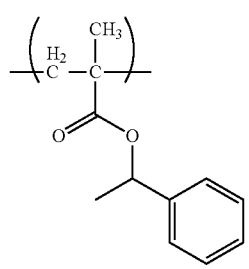
(I-99)

Any repeating unit can be used as the repeating unit (C) so long as it is a repeating unit containing a carbon-carbon unsaturated bond. Even when repeating unit (A) contains a carbon-carbon unsaturated bond, this case is not included in the repeating unit (C). The repeating unit (C) is preferably a repeating unit represented by the following formula (II).

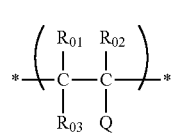
(II)

In formula (II), $R_{01}$, $R_{02}$ and $R_{03}$ have the same meaning as described in formula (I), and Q represents a group containing a carbon-carbon unsaturated bond. In formula (II), each of $R_{01}$, $R_{02}$ and $R_{03}$ preferably represents a hydrogen atom, and Q preferably represents a group containing an aromatic ring, and more preferably a substituted or unsubstituted aromatic group having 1 to 20 carbon atoms. Here, the examples of the aromatic groups include the following:

Phenyl, naphthyl, anthranyl, phenanthryl, fluorenyl, triphenylenyl, naphthacenyl, biphenyl, pyrrolinyl, furanyl, thiophenyl, imidazolyl, oxazolyl, thiazolyl, pyridyl, pyrazinyl, pyrimidyl, pyridazyl, indolizyl, benzofuranyl, benzothiophenyl, isobenzofuranyl, quinolizyl, quinolinyl, phthalazyl, naphthyridyl, quinoxalyl, quinoxazolyl, isoquinolinyl, carbazolyl, acridyl, phenanthrolyl, thianthrenyl, chromenyl, xanthenyl, phenoxathiinyl, phenothiazyl, and phenazyl. Of these aromatic groups, aromatic hydrocarbon rings are preferred, phenyl, naphthyl, anthranyl and phenanthryl are more preferred, and phenyl (a benzene ring) is still more preferred.

When the resin (P) consists of the repeating units (A) to (C) alone, the repeating unit (C) is preferably a repeating unit represented by the following formula (II-1).

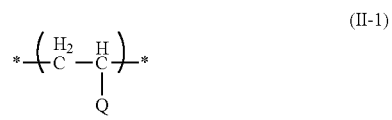
(II-1)

Q represents a group containing a carbon-carbon unsaturated bond.

The content of the repeating unit (C) in the resin (P) is preferably in the range of 5 to 90 mol % to all the repeating units, more preferably in the range of 10 to 80 mol %, and still more preferably in the range of 20 to 70 mol %. One kind of repeating unit (C) may be used alone, or two or more kinds may be used in combination, but it is preferred to contain at least one kind of repeating unit derived from hydroxystyrene (preferably p-hydroxystyrene) and derivatives thereof. As the hydroxystyrene derivatives, for example, hydroxystyrenes containing fluorine-substituted alcohol-substituted groups are exemplified.

In the invention, the compositional ratio of the repeating unit (C) (mol) is preferably equal to or higher than the compositional ratio of the repeating unit (B). Here, of the repeating units (B), repeating units having a carbon-carbon unsaturated bond are also included in the repeating unit (C).

The synthesizing method of monomers corresponding to the repeating unit (C) is not especially restricted, but the monomers can be synthesized by referring to the synthesizing methods of aromatic compounds containing a polymerizable carbon-carbon double bond described in, for example, J. Med. Chem., Vol. 34 (5), 1675-1692 (1991), ditto, Vol. 35 (25), 4665-4675 (1992), J. Org. Chem., Vol. 45 (18), 3657-3664 (1980), Adv. Synth. Catal., Vol. 349 (1-2), 152-156 (2007), J. Org. Chem., Vol. 28, 1921-1922 (1963), Synth. Commun., Vol. 28 (15), 2677-2682 (1989), and the synthesizing methods cited in these documents.

The specific examples of repeating units (C) in the resin (P) are shown below, but the invention is not restricted thereto. In the formulae, a represents an integer of 0 to 2.

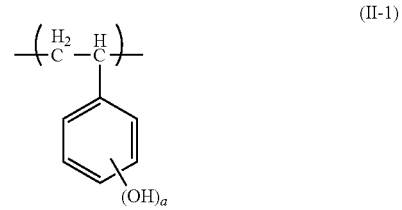
(II-1)

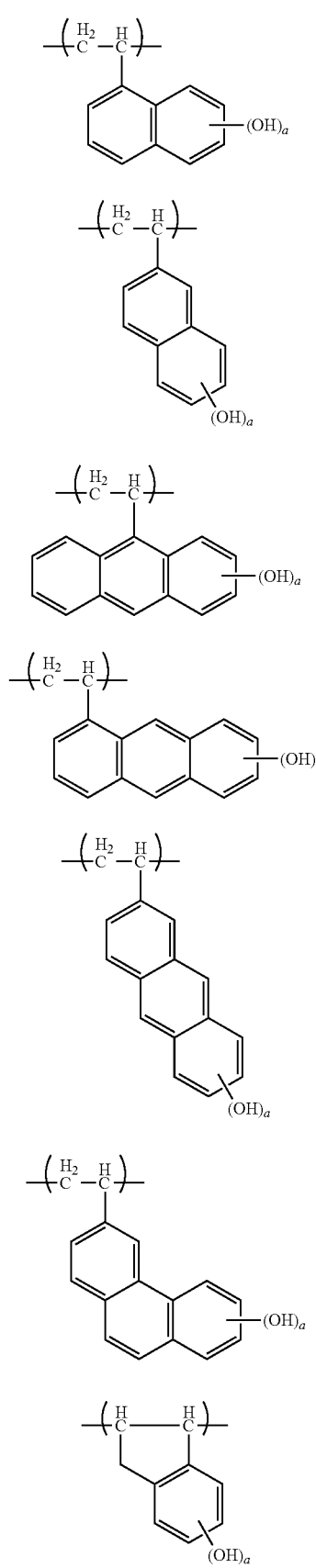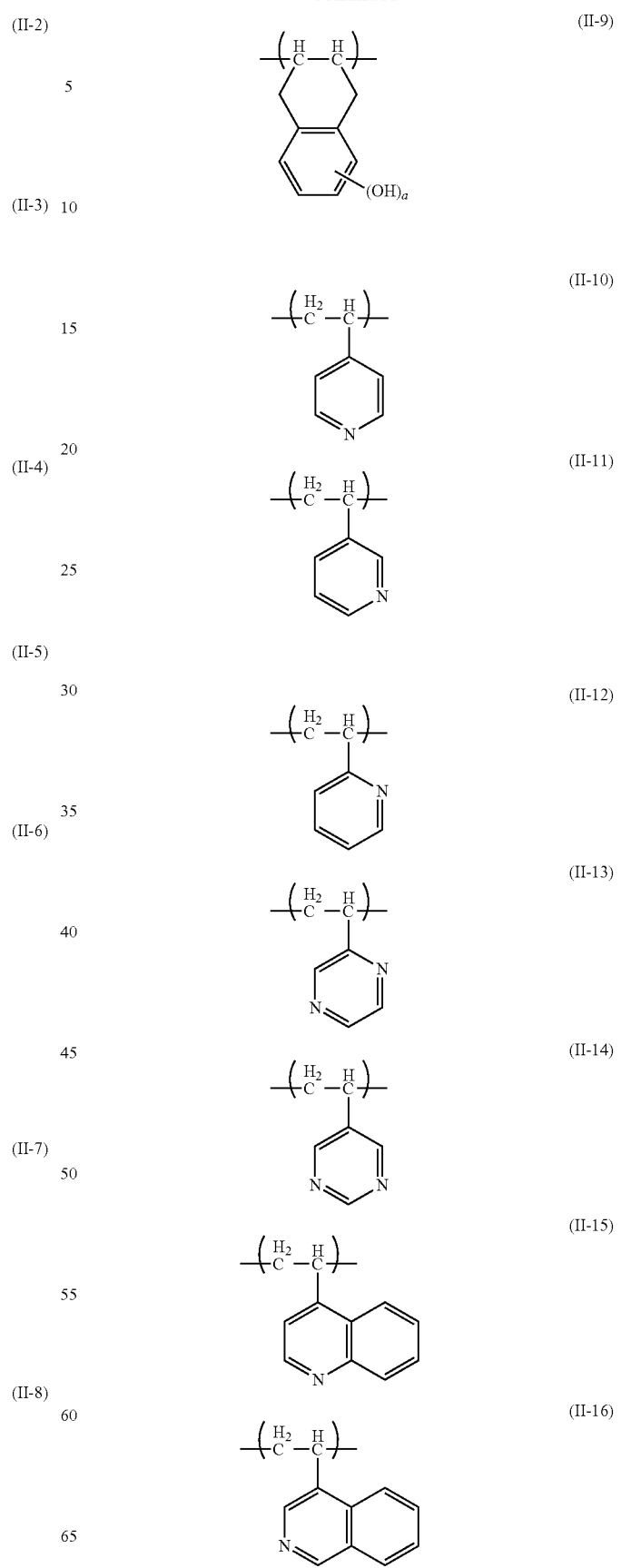

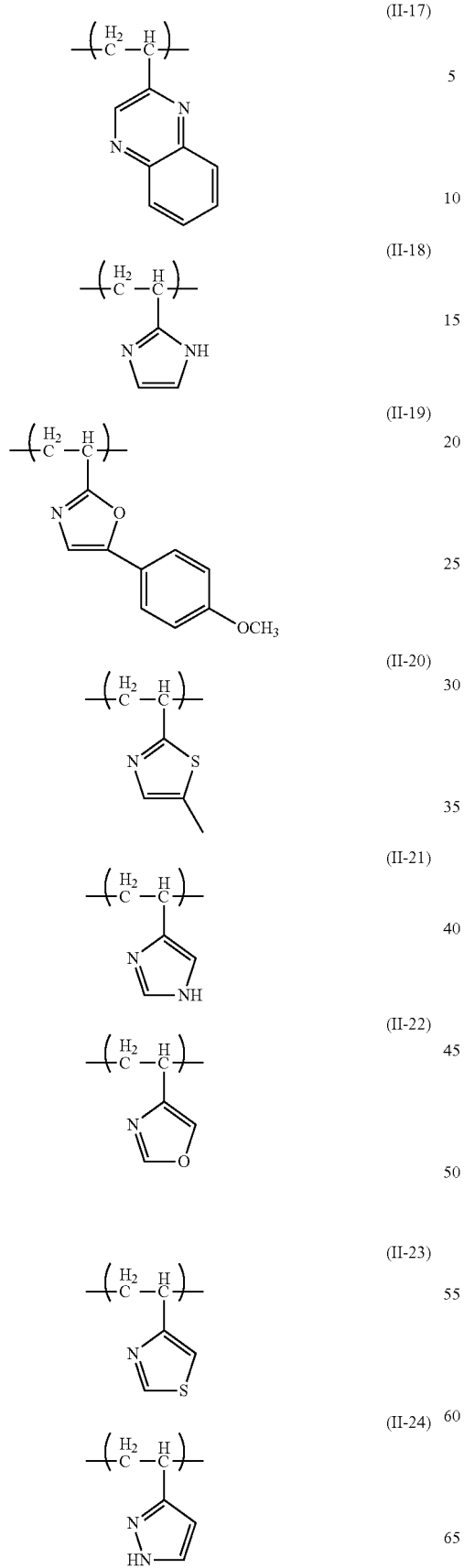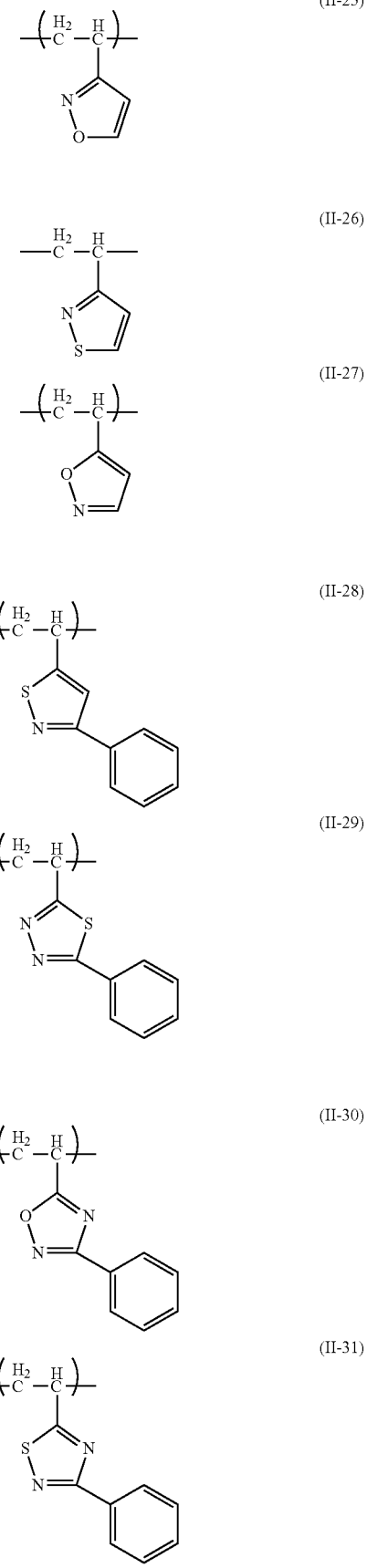

(II-32) 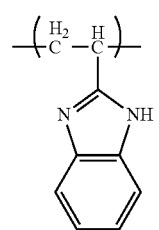
(II-33) 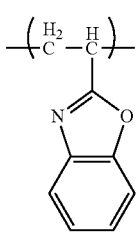
(II-34) 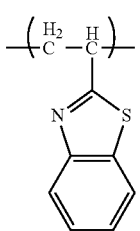
(II-35) 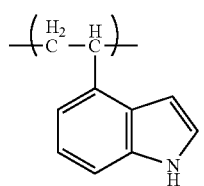
(II-36) 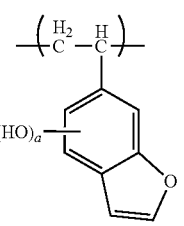
(II-37) 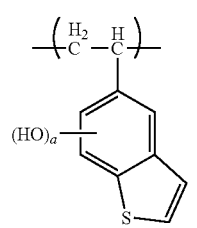
(II-38) 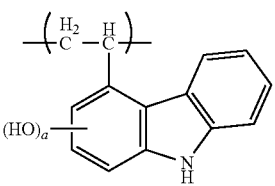
(II-39) 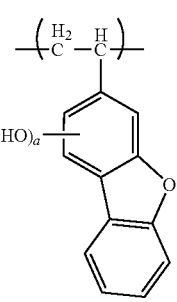
(II-40) 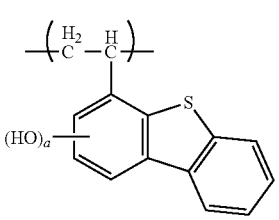
(II-41) 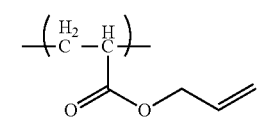
(II-42) 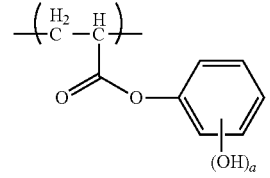
(II-43) 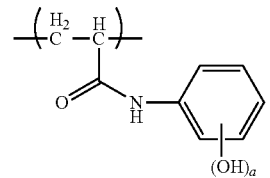
(II-44) 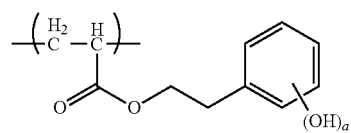
(II-45) 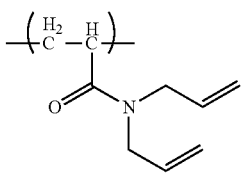
(II-46) 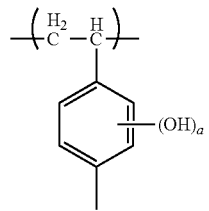

(II-47) 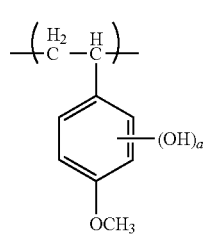
(II-48) 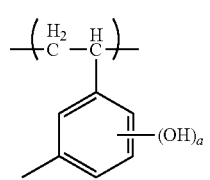
(II-49) 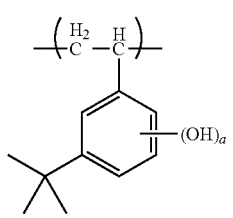
(II-50) 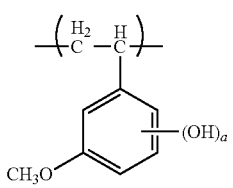
(II-51) 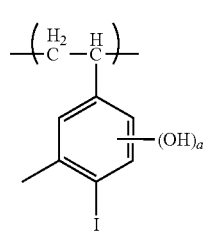
(II-52) 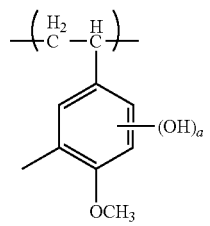
(II-53) 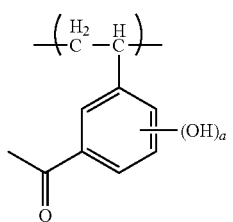
(II-54) 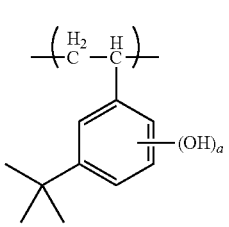
(II-55) 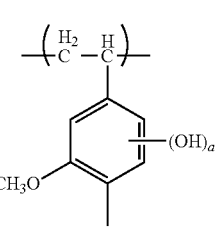
(II-56) 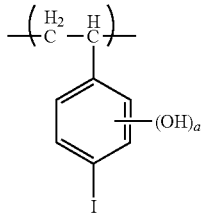
(II-57) 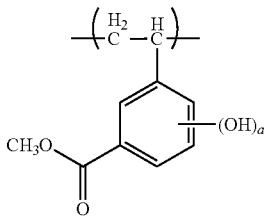
(II-58) 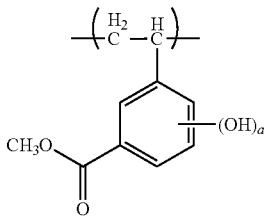
(II-59) 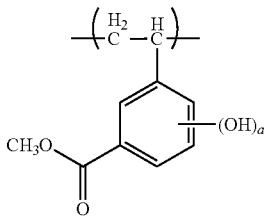
(II-60) 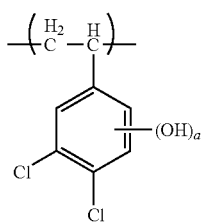

-continued (II-61)
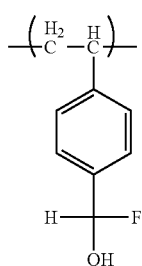

(II-62)
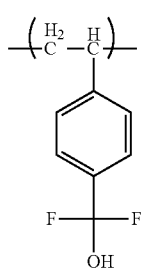

(II-63)
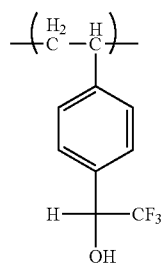

(II-64)
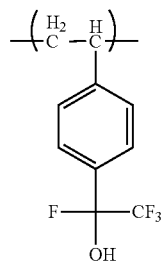

(II-65)
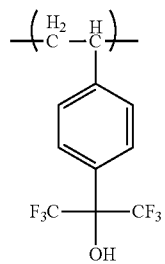

It is preferred for the resin in the invention to further contain (D) a repeating unit which has a group capable of decomposing by the action of an alkali developer and increasing a dissolution rate in the alkali developer and which is represented by the following formula (AII).

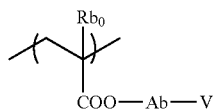
(AII)

In formula (AII), $Rb_0$ represents a hydrogen atom, a halogen atom, or an alkyl group (preferably having 1 to 4 carbon atoms).

As preferred substituents that the alkyl group represented by $Rb_0$ may have, a hydroxyl group and a halogen atom are exemplified. As the examples of the halogen atoms represented by $Rb_0$, a fluorine atom, a chlorine atom, a bromine atom and an iodine atom are exemplified. The preferred are a hydrogen atom, a methyl group, a hydroxymethyl group, and a trifluoromethyl group, and a hydrogen atom and a methyl group are especially preferred.

Ab represents a single bond, an alkylene group, a divalent linking group having a monocyclic or polycyclic alicyclic hydrocarbon structure, an ether bond, an ester bond, a carbonyl group, or a divalent linking group combining these groups, and preferably a single bond or a divalent linking group represented by $-Ab_1-CO_2-$.

$Ab_1$ represents a straight chain or branched alkylene group, or a monocyclic or polycyclic cycloalkylene group, and preferably a methylene group, an ethylene group, a cyclohexylene group, an adamantylene group, or a norbornylene group.

V represents a group capable of decomposing by the action of an alkali developer and increasing a dissolution rate in the alkali developer, preferably a group having an ester bond, and more preferably a group having a lactone structure.

As groups having a lactone structure, any group having a lactone structure can be used, but preferably groups having 5- to 7-membered ring lactone structures, and 5- to 7-membered ring lactone structures condensed with other ring structures in the form of forming a bicyclo structure or a spiro structure are preferred. It is more preferred to have a repeating unit having lactone structure represented by any of the following formulae (LC1-1) to (LC1-17). A lactone structure may be directly bonded to the main chain. Preferred lactone structures are (LC1-1), (LC1-4), (LC1-5), (LC1-6), (LC1-13), (LC1-14) and (LC1-17).

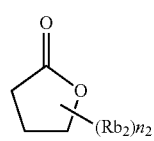
LC1-1

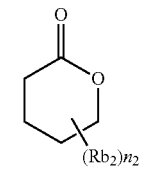
LC1-2

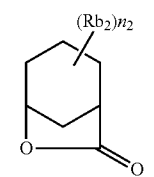
LC1-3

LC1-4 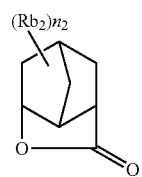

LC1-5 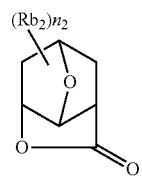

LC1-6 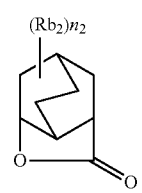

LC1-7 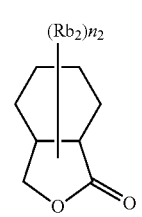

LC1-8 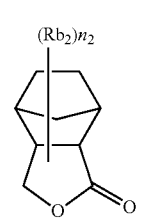

LC1-9 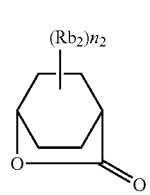

LC1-10 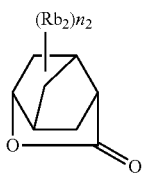

LC1-11 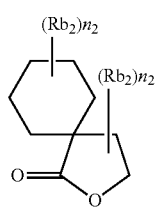

LC1-12 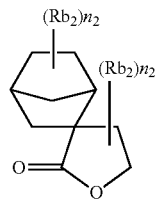

LC1-13 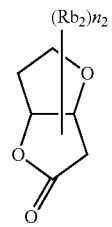

LC1-14 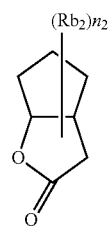

LC1-15 

LC1-16 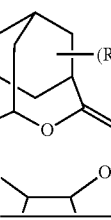

LC1-17 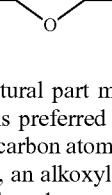

The lactone structural part may have or may not have a substituent ($Rb_2$). As preferred substituents ($Rb_2$), an alkyl group having 1 to 8 carbon atoms, a cycloalkyl group having 4 to 7 carbon atoms, an alkoxyl group having 1 to 8 carbon atoms, an alkoxycarbonyl group having 2 to 8 carbon atoms, a carboxyl group, a halogen atom, a hydroxyl group, a cyano group, and an acid-decomposable group are exemplified, and more preferred substituents are an alkyl group having 1 to 4 carbon atoms, a cyano group, and an acid-decomposable group. $n_2$ represents an integer of 0 to 4. When $n_2$ is 2 or more, each substituent may be the same with or different from every other substituent. A plurality of substituents ($Rb_2$) may be bonded to each other to form a ring.

Repeating units having a lactone structure generally have optical isomers, and any optical isomer may be used. One kind of optical isomer may be used alone, or a plurality of optical isomers may be used as mixture. When one kind of optical isomer is mainly used, optical purity (ee) is preferably 90% or more and more preferably 95% or more.

The content of the repeating unit (D) in the resin (P) is preferably in the range of 0.5 to 80 mol % to all the repeating units, more preferably in the range of 1 to 60 mol %, and still more preferably in the range of 2 to 40 mol %. One kind of repeating unit (D) may be used alone, or two or more kinds may be used in combination. By the use of a specific lactone structure, line edge roughness and development defect are bettered.

The specific examples of repeating units (D) in the resin (P) are shown below, but the invention is not restricted thereto. In the formulae, Rx represents H, $CH_3$, $CH_2OH$ or $CF_3$.

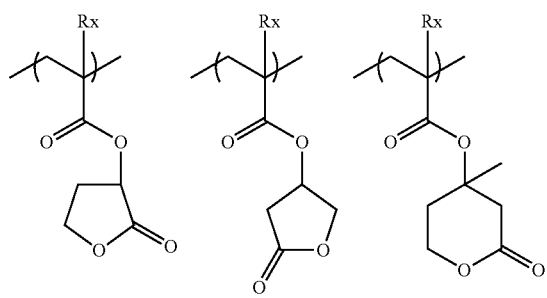

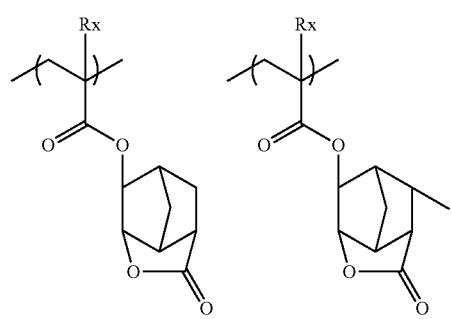

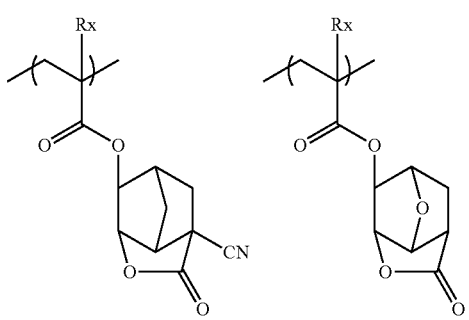

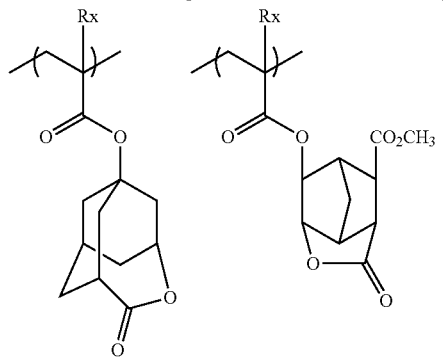

-continued

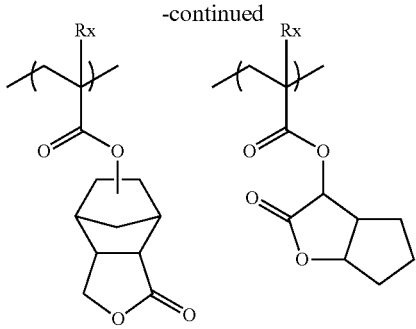

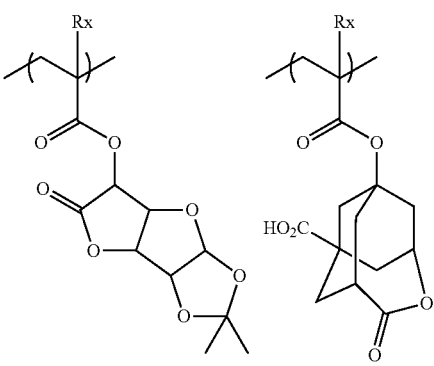

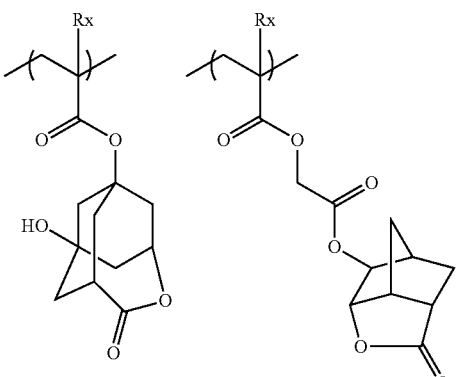

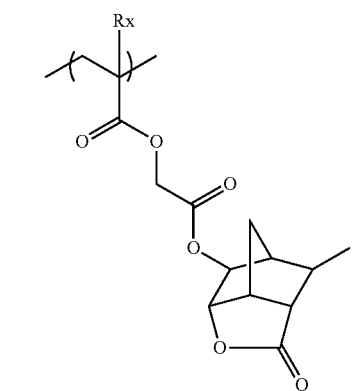

-continued
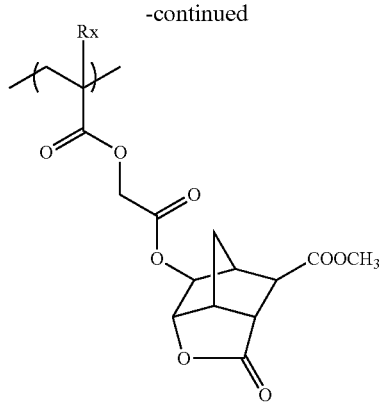
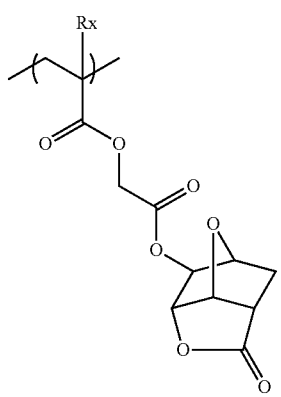
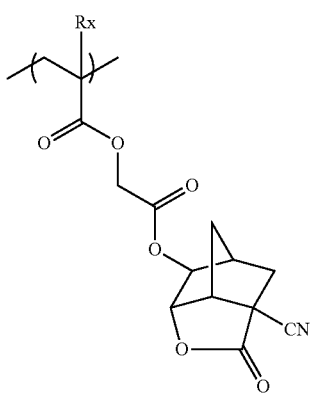
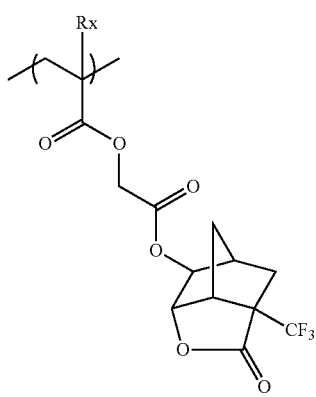
-continued
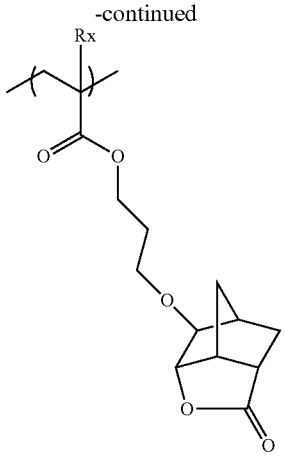
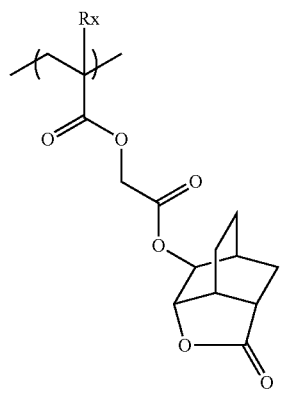
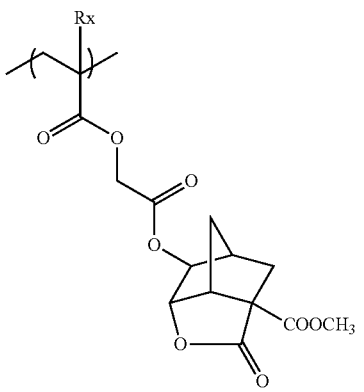
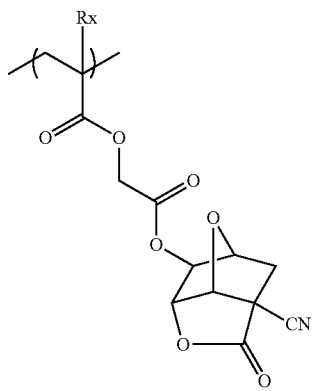

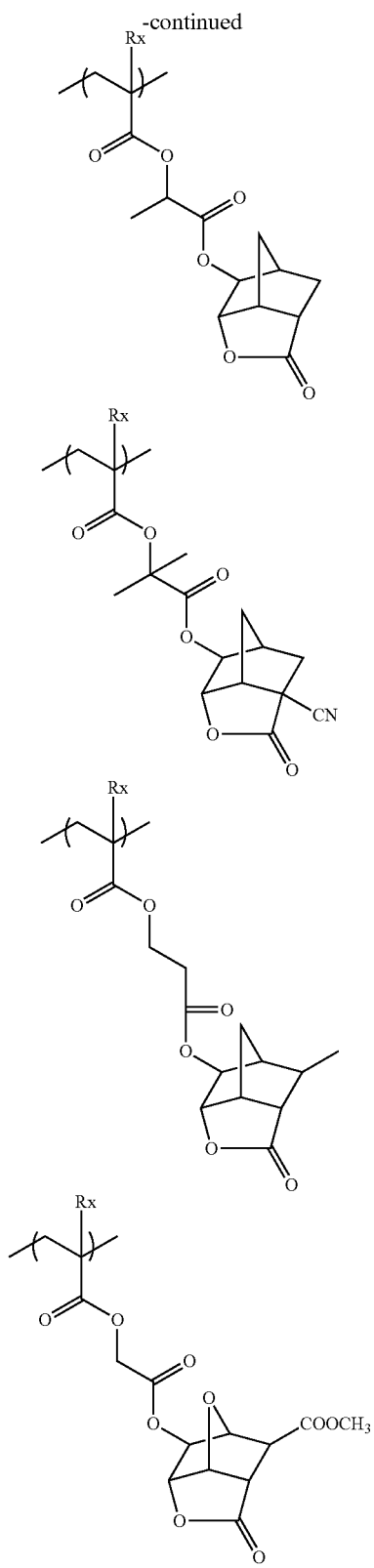

The form of the resin (P) of the invention may be any type of random, block, comb and star types.

The resin (P) according to the invention containing repeating units (A) to (C) or (A) to (D) can be synthesized by, for example, radical polymerization, cationic polymerization, or anionic polymerization of unsaturated monomer corresponding to each structure. It is also possible to obtain an objective resin by polymerization with an unsaturated monomer corresponding to precursor of each structure, and then by performing polymeric reaction.

The molecular weight of the resin (P) in the invention is not especially restricted, but the weight average molecular weight is preferably in the range of 1,000 to 100,000, more preferably in the range of 1,500 to 20,000, and especially preferably in the range of 2,000 to 10,000. The weight average molecular weight of the resin here shows the polystyrene equivalent molecular weight measured by GPC (carrier: THF or N-methyl-2-pyrrolidone (NMP)).

Polydispersity (Mw/Mn) is preferably 1.00 to 5.00, more preferably 1.03 to 3.50, and still more preferably 1.05 to 2.50.

For the purpose of improving the performances of resin, the resin (P) of the invention may further contain repeating units derived from other polymerizable monomers so long as dry etching resistance is not conspicuously damaged.

The content of repeating units derived from other polymerizable monomers in the resin is generally 50 mol % or less of all the repeating units and preferably 30 mol % or less. As other usable polymerizable monomers, the following are included. For example, the polymerizable monomers include compounds having one addition polymerizable unsaturated bond selected from (meth)acrylates, (meth)acrylamides, allyl compounds, vinyl ethers, vinyl esters, styrenes, and crotonates.

Specifically, as (meth)acrylates, e.g., methyl(meth)acrylate, ethyl(meth)acrylate, propyl(meth)acrylate, t-butyl (meth)acrylate, amyl(meth)acrylate, cyclohexyl(meth)acrylate, ethylhexyl(meth)acrylate, octyl(meth)acrylate, t-octyl (meth)acrylate, 2-chloroethyl(meth)acrylate, 2-hydroxyethyl (meth)acrylate, glycidyl(meth)acrylate, benzyl(meth) acrylate, and phenyl(meth)acrylate are exemplified.

As (meth)acrylamides, e.g., (meth)acrylamide, N-alkyl (meth)acrylamide (as the alkyl group, an alkyl group having 1 to 10 carbon atoms, e.g., a methyl group, an ethyl group, a propyl group, a butyl group, a t-butyl group, a heptyl group, an octyl group, a cyclohexyl group, a benzyl group, a hydroxyethyl group, a benzyl group, etc.), N-aryl(meth)acrylamide (as the aryl group, e.g., a phenyl group, a tolyl group, a nitrophenyl group, a naphthyl group, a cyanophenyl group, a hydroxyphenyl group, a carboxyphenyl group, etc.), N,N-dialkyl(meth)acrylamide (as the alkyl group, an alkyl group having 1 to 10 carbon atoms, e.g., a methyl group, an ethyl group, a butyl group, an isobutyl group, an ethylhexyl group, a cyclohexyl group, etc.), N,N,-aryl-(meth)acrylamide (as the aryl group, e.g., a phenyl group), N-methyl-N-phenyl-acrylamide, N-hydroxyethyl-N-methylacrylamide, and N-2-acetamidoethyl-N-acetyl-acrylamide are exemplified.

As allyl compounds, e.g., allyl esters (e.g., allyl acetate, allyl caproate, allyl caprylate, allyl laurate, allyl palmitate, allyl stearate, allyl benzoate, allyl acetoacetate, allyl lactate, etc.), and allyloxy ethanol are exemplified.

As vinyl ethers, e.g., alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethyl amino ethyl vinyl ether, diethylaminoethyl vinyl ether, butylaminoethyl vinyl ether, benzyl vinyl ether, tetrahydrofurfuryl vinyl ether, etc.), and vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether, etc.) are exemplified.

As vinyl esters, e.g., vinyl butyrate, vinyl isobutyrate, vinyl trimethylacetate, vinyl diethylacetate, vinyl valate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate, etc., are exemplified.

As crotonates, e.g., alkyl crotonate (e.g., butyl crotonate, hexyl crotonate, glycerol monocrotonate, etc.) are exemplified.

As dialkyl itaconates, e.g., dimethyl itaconate, diethyl itaconate, dibutyl itaconate, etc., are exemplified.

As dialkyl esters of maleic acid or fumaric acid, e.g., dimethyl maleate, dibutyl fumarate, etc., are exemplified.

Besides the above, maleic anhydride, maleimide, acrylonitrile, methacrylonitrile, and maleilonitrile can be exemplified. Further, addition polymerizable unsaturated compounds capable of copolymerization with the repeating units according to the invention can be used with no particular limitation.

The resin (P) of the invention may be one kind alone, or two or more kinds may be used in combination. The content of the resin (P) is preferably 30 to 100% by mass based on all the solids content in the actinic ray-sensitive or radiation-sensitive resin composition of the invention, more preferably 50 to 100% by mass, and especially preferably 70 to 100% by mass.

As the specific examples of the resin (P), resins having one or more repeating units selected from resins having one or more repeating units selected from the specific examples of formulae (III) to (V)/one or more repeating units selected from the specific examples of formula (I)/one or more repeating units selected from the specific examples of formula (II) are exemplified.

In particular, it is preferred that the resin (P) consists of the repeating units (A) to (C) alone or the repeating units (A) to (D) alone, and all of the repeating unit (C) are the repeating unit represented by formula (II-1). The repeating unit (C) may comprise one or more repeating units represented by formula (II-1).

Also in the resin (P), it is preferred that the proportion of the repeating unit having a cyclic structure in the main chain is 30 mol % or less, and it is more preferred not to contain the repeating unit at all.

More preferred specific examples of resins (P) are shown below but the invention is not restricted thereto.

(P-1)

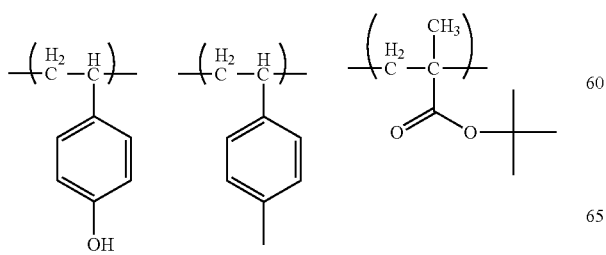

(P-2)

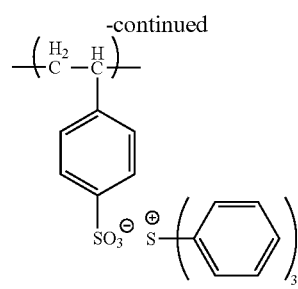

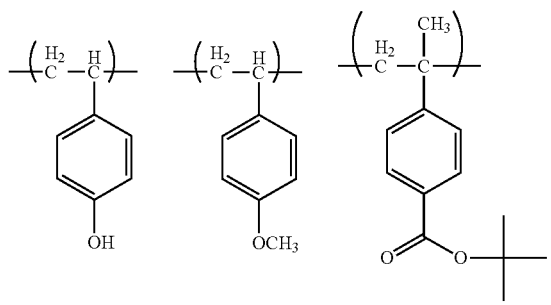

(P-3)

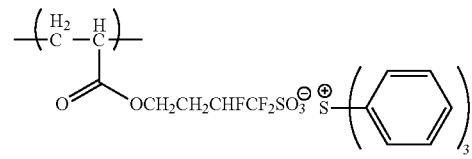

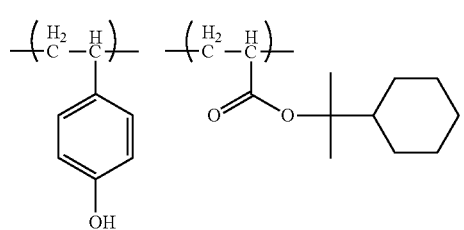

(P-4)

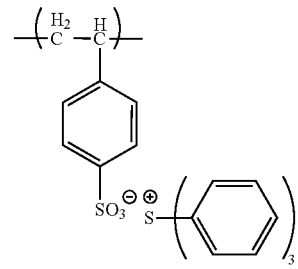

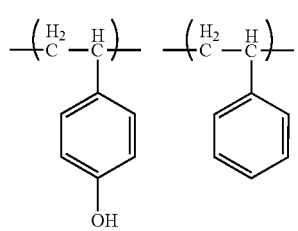

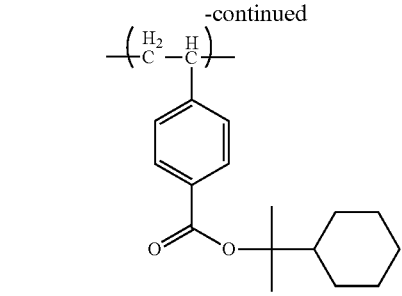
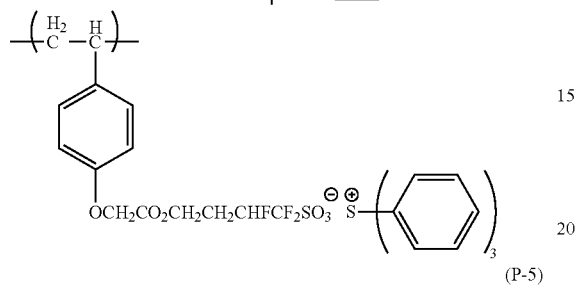
(P-5)
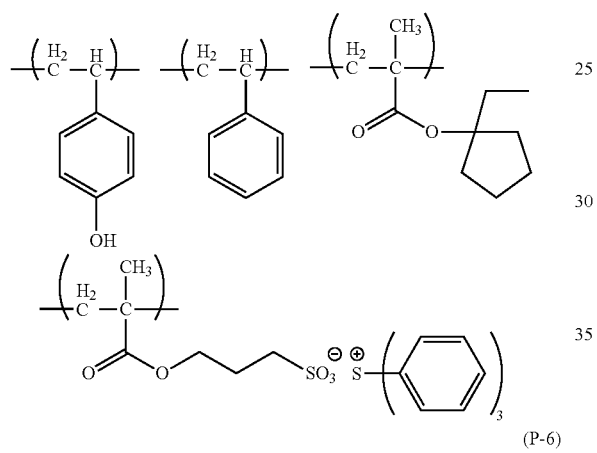
(P-6)
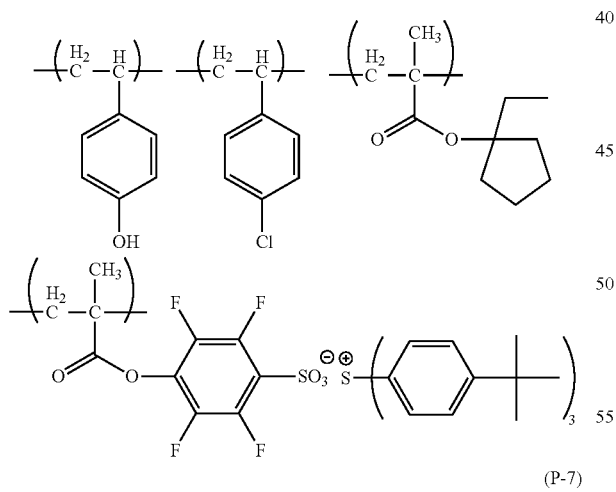
(P-7)
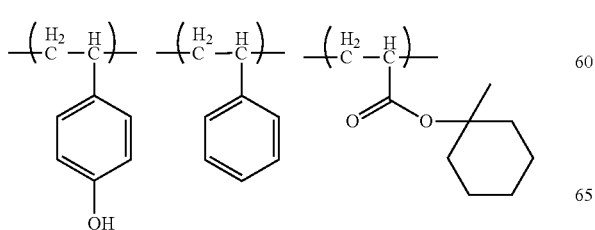
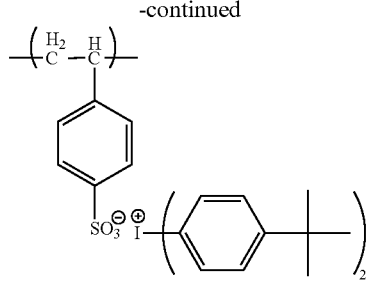
(P-8)
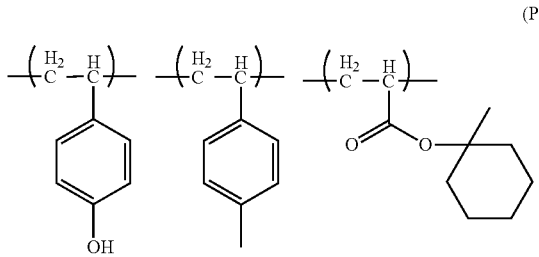
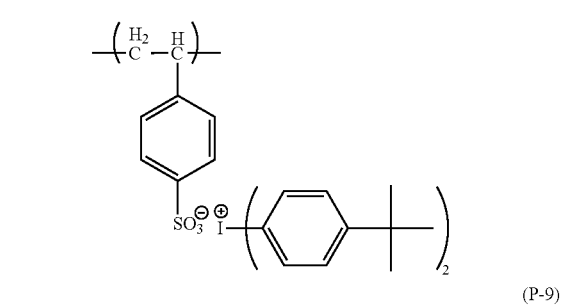
(P-9)
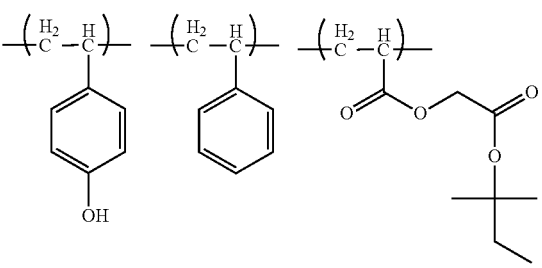
(P-10)
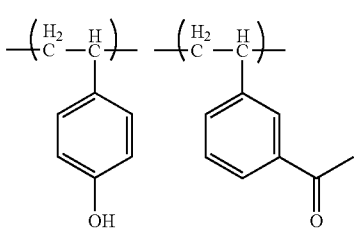

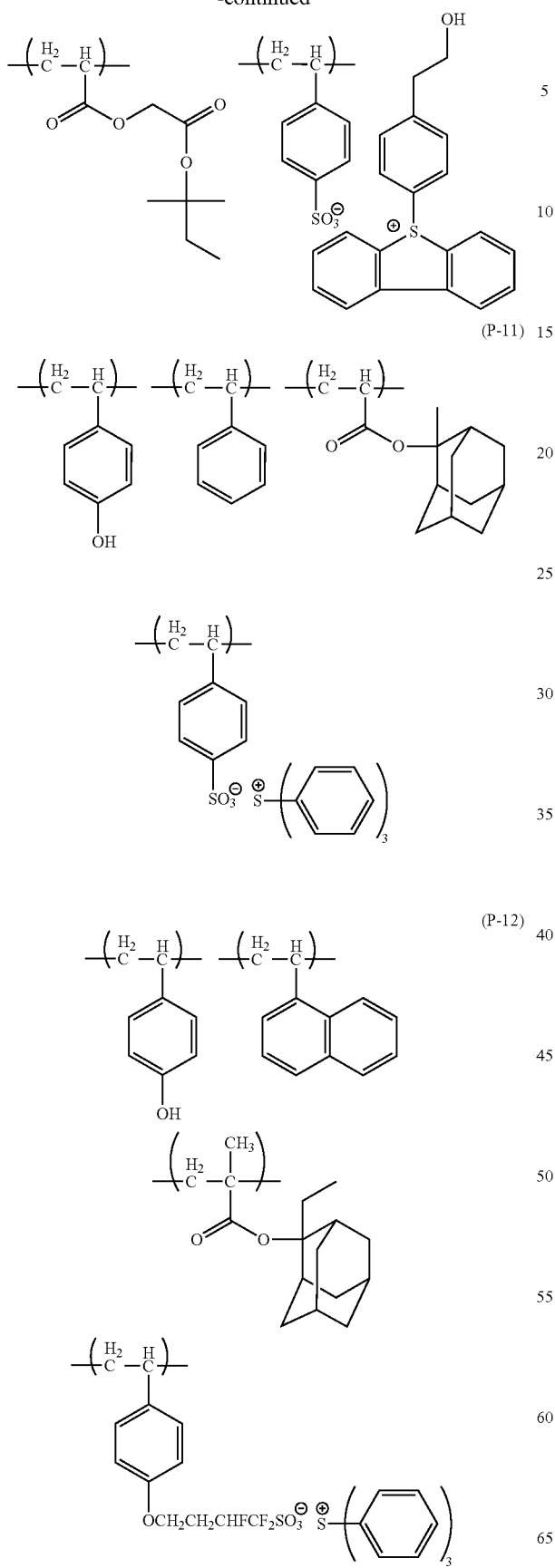
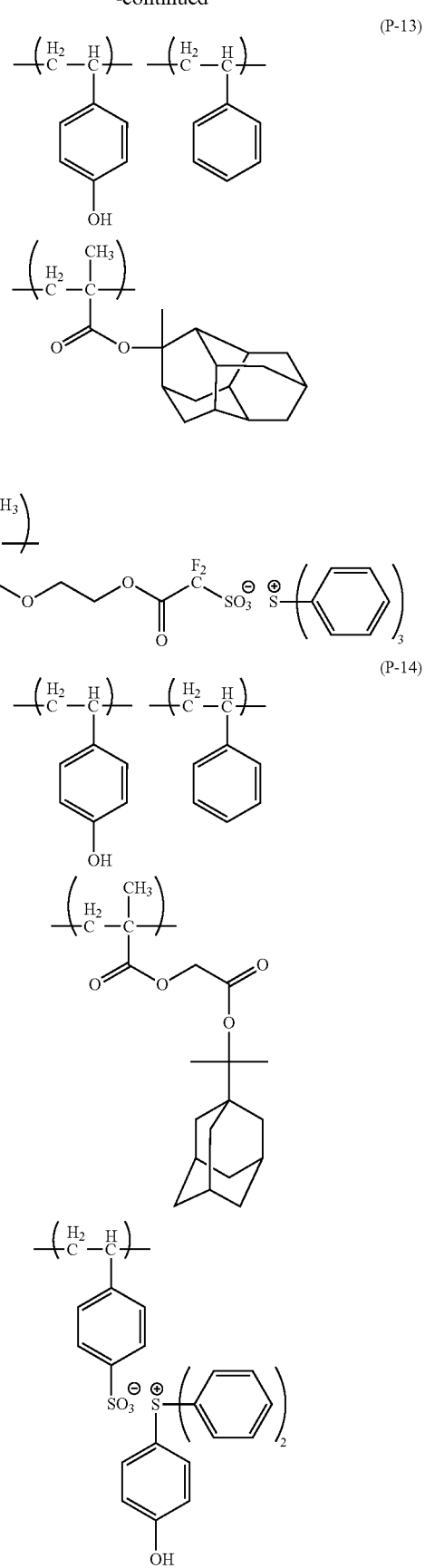

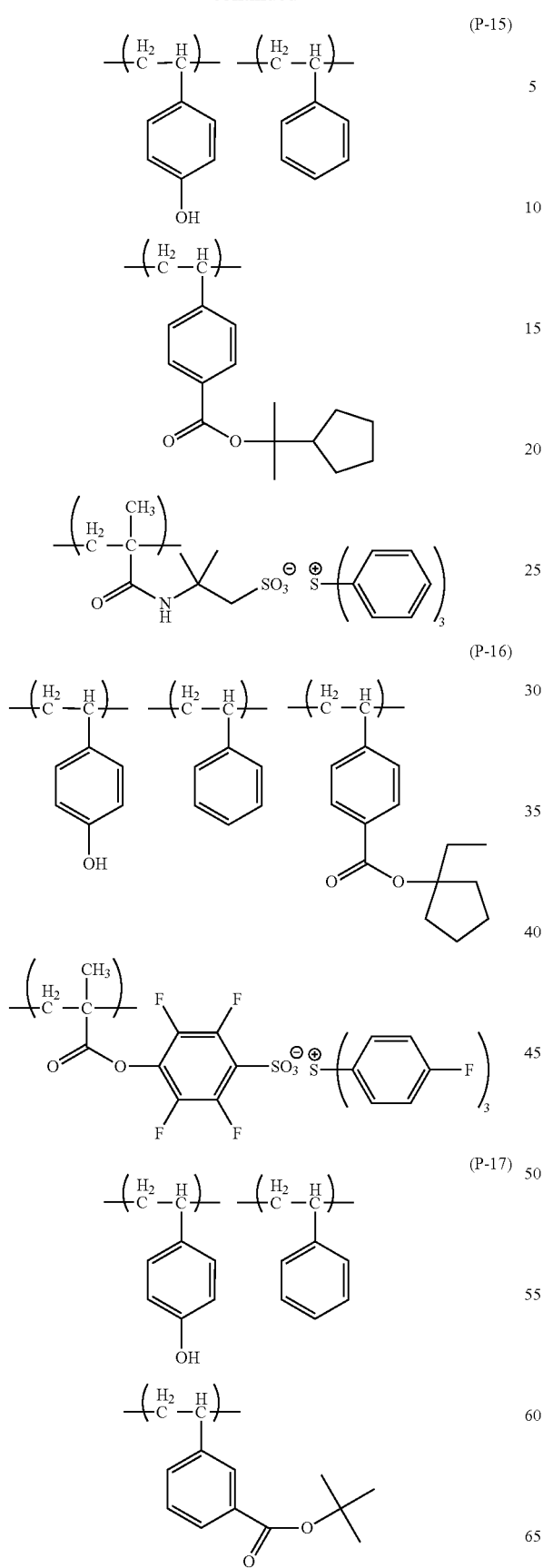
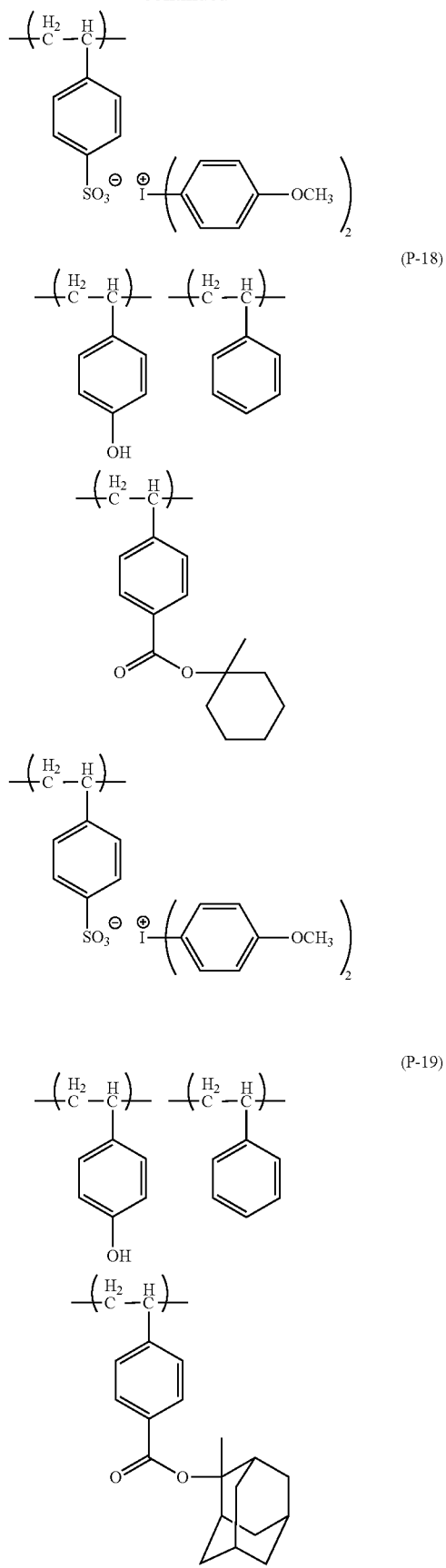

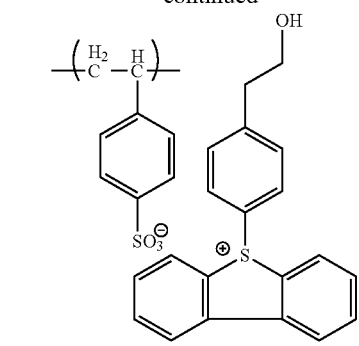
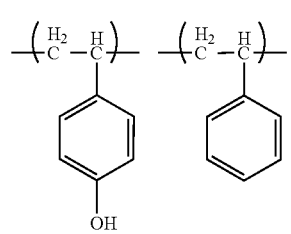
(P-20)
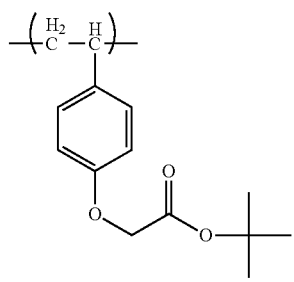
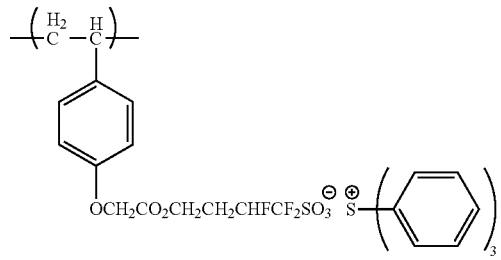
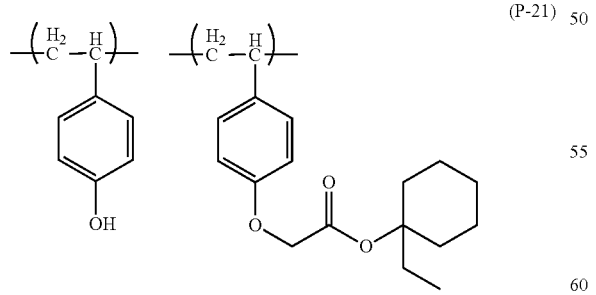
(P-21)
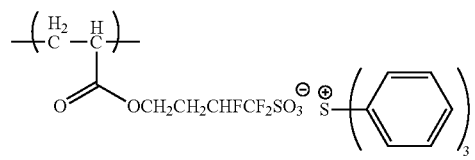
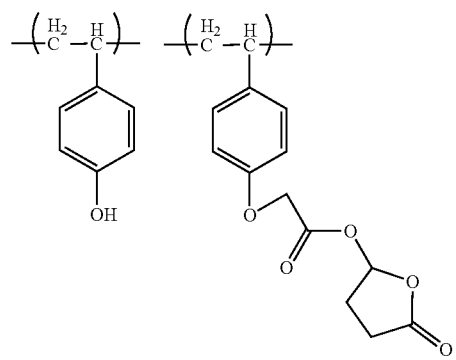
(P-22)
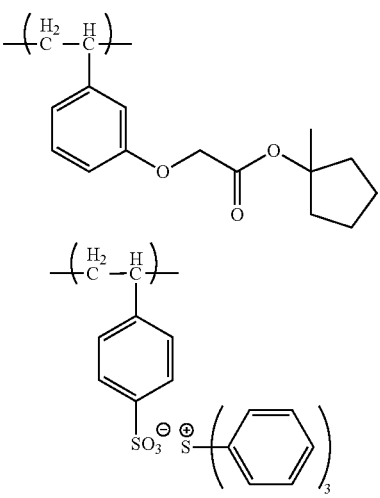
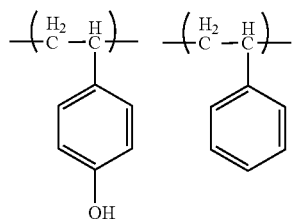
(P-23)
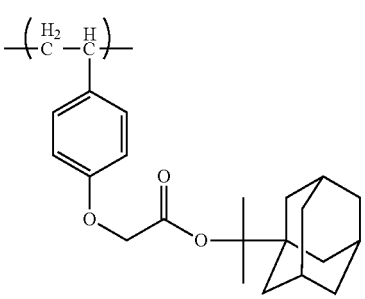
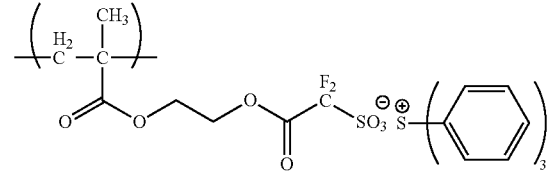

(P-24)
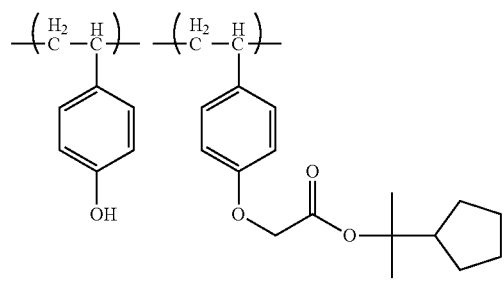
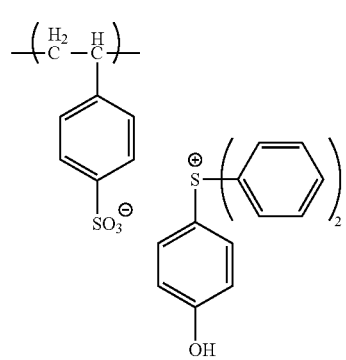
(P-25)
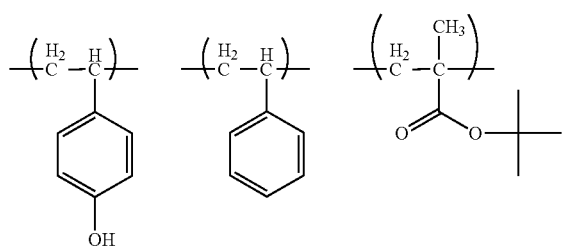
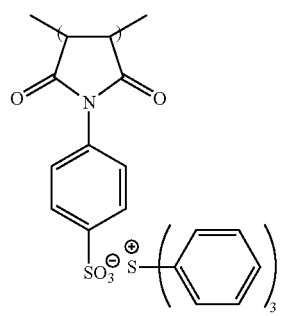
(P-26)
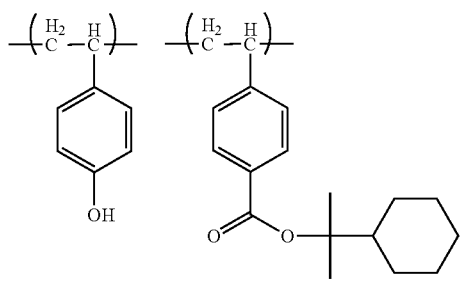
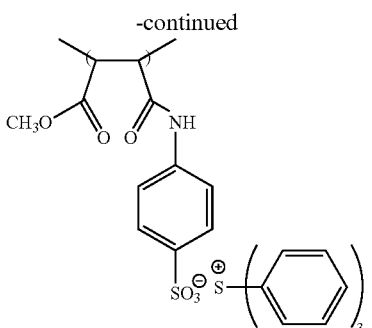
(P-27)
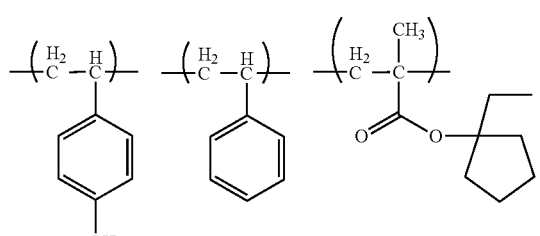
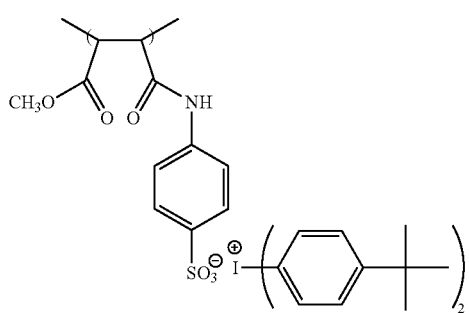
(P-28)
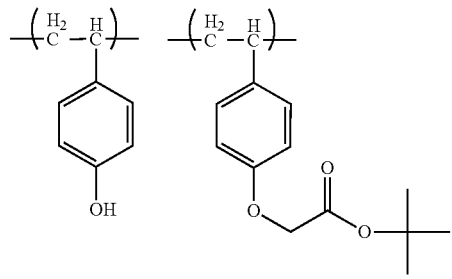
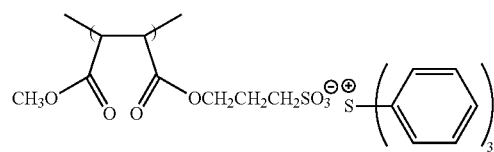
(P-29)
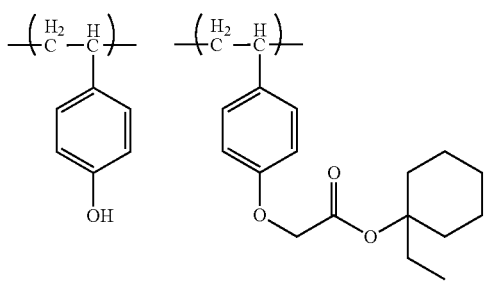

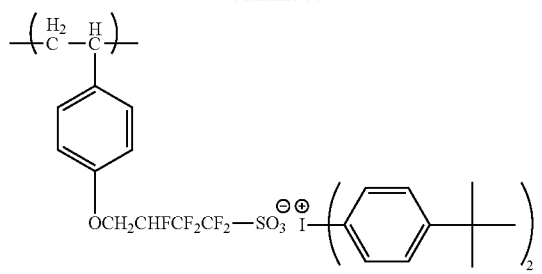
(P-30)
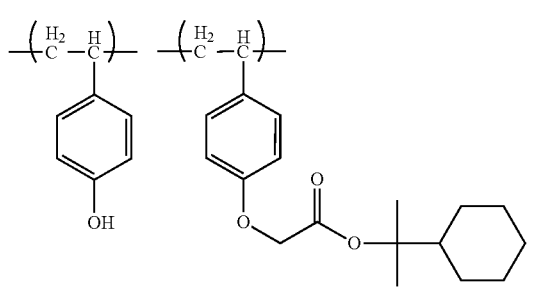
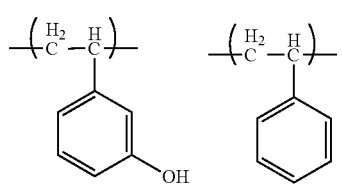
(P-31)
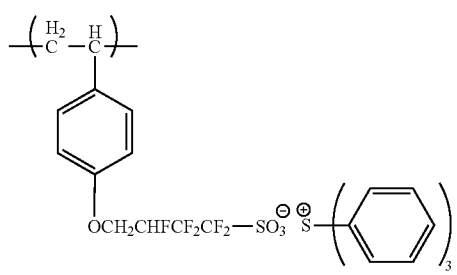
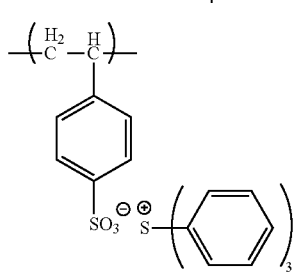
(P-32)
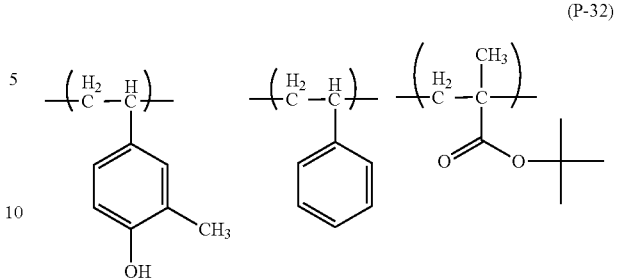
(P-33)
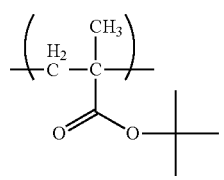
(P-34)
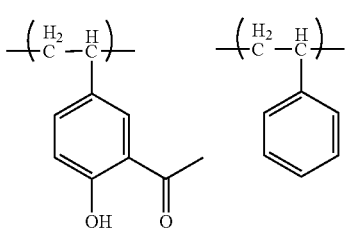

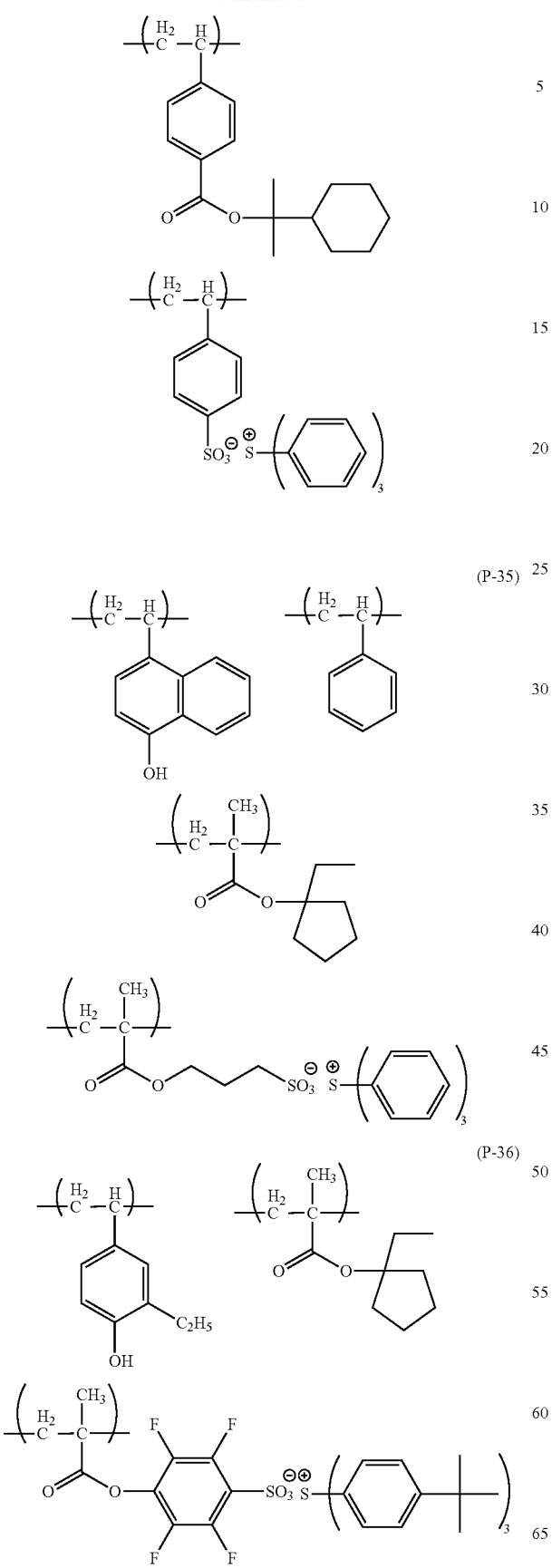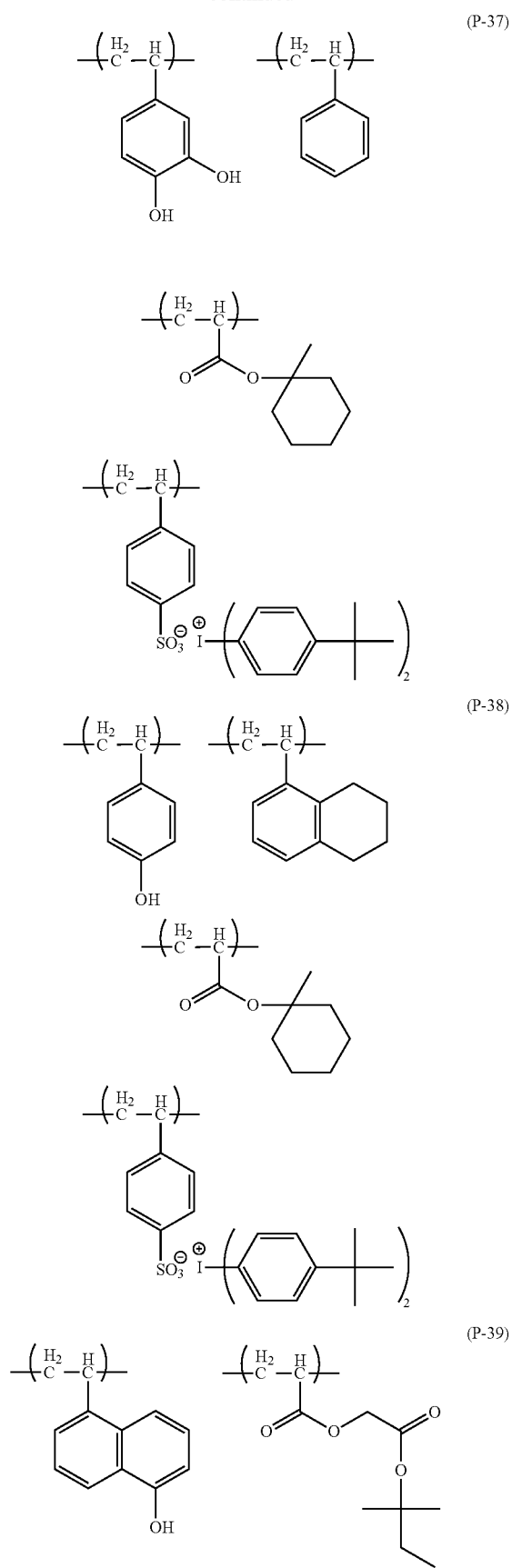

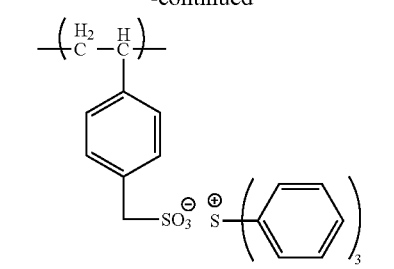
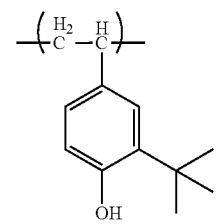
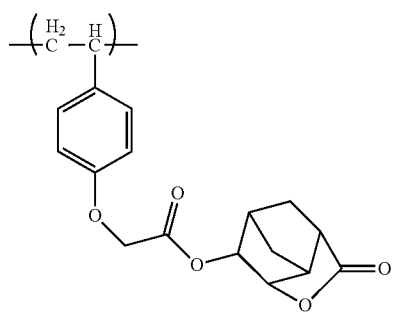
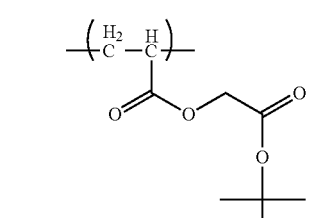
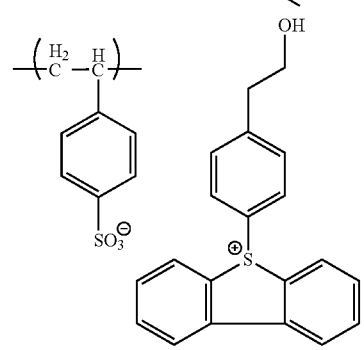
(P-41)
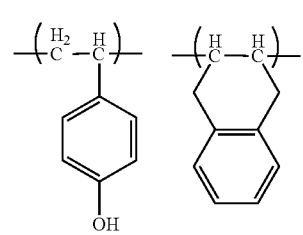
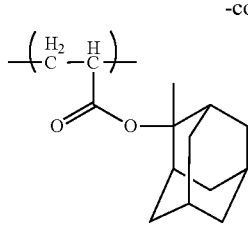 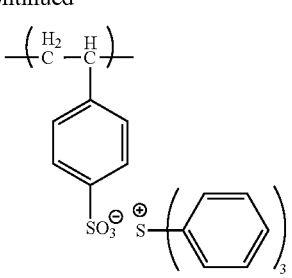
(P-42)
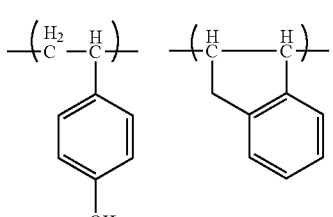
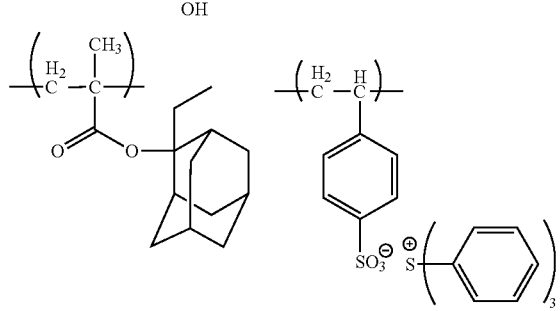
(P-43)
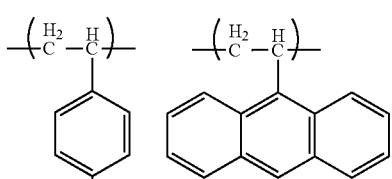
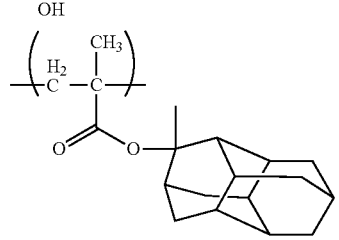
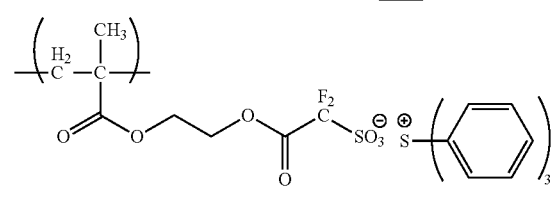
(P-44)
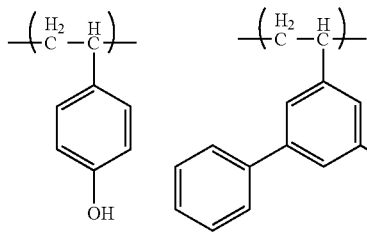

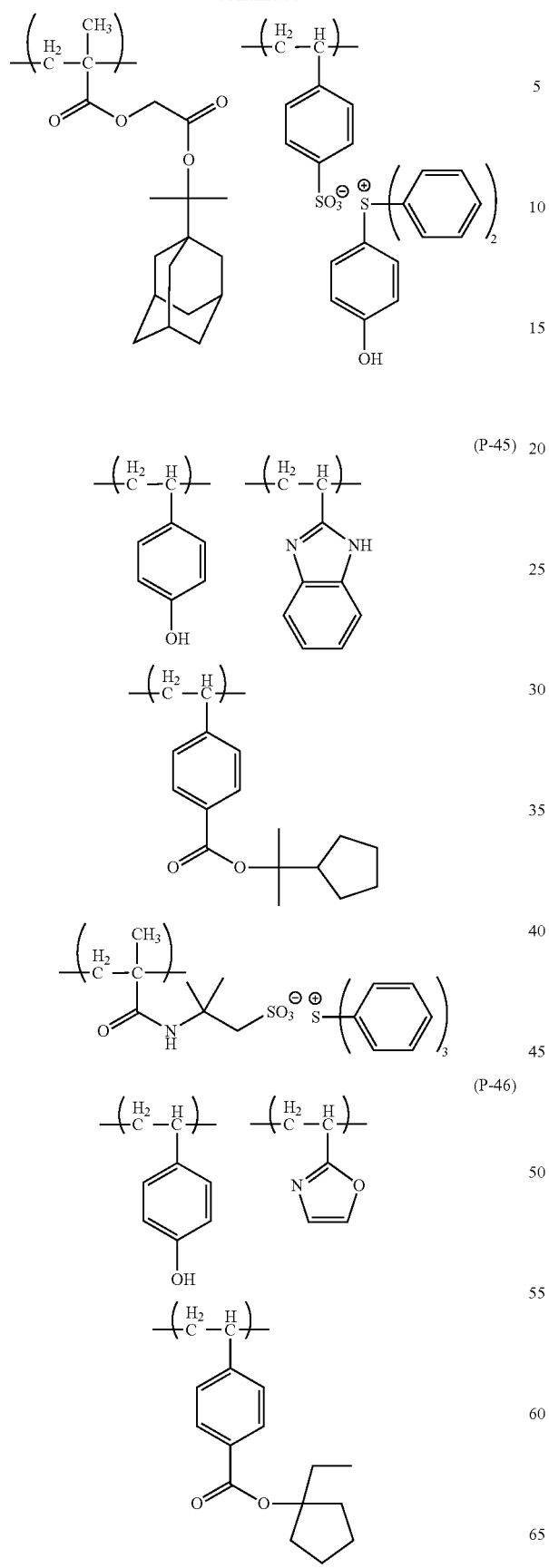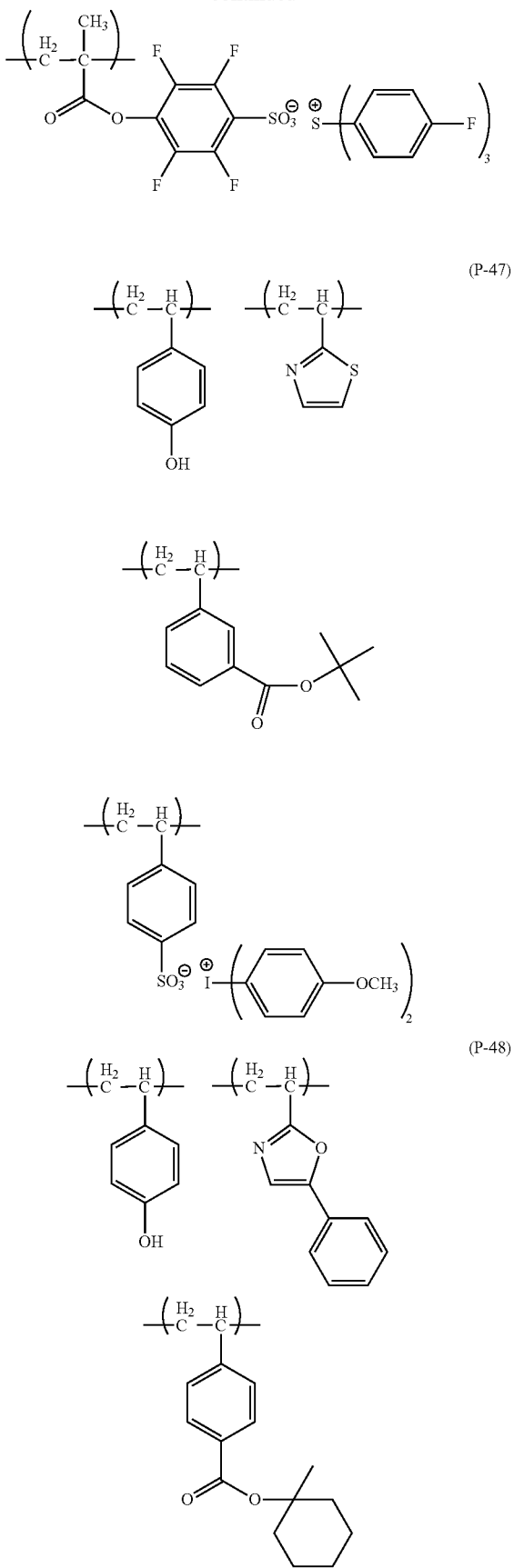

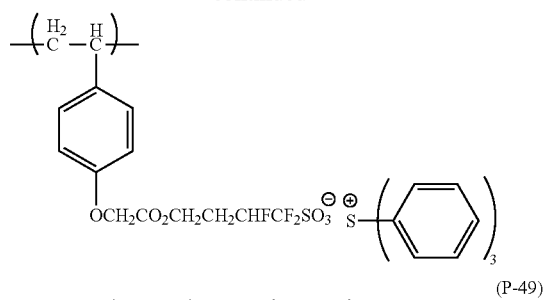
(P-49)
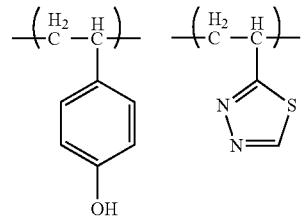
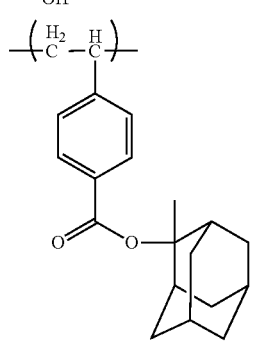
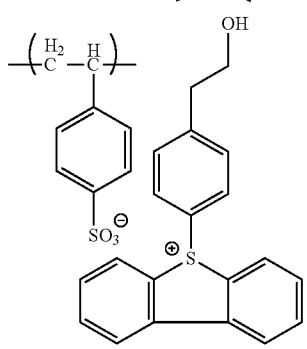
(P-50)
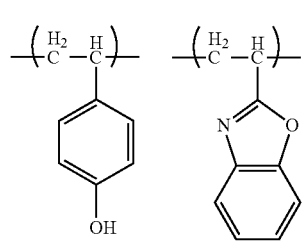
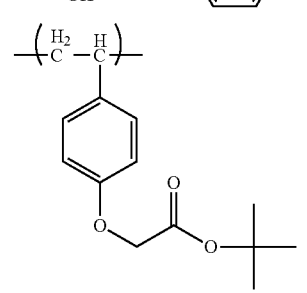
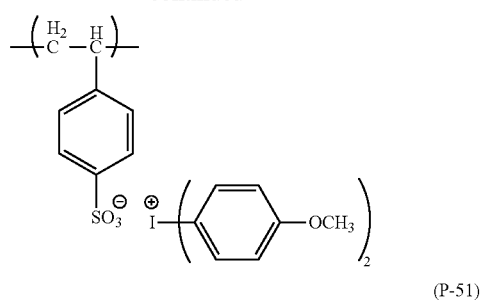
(P-51)
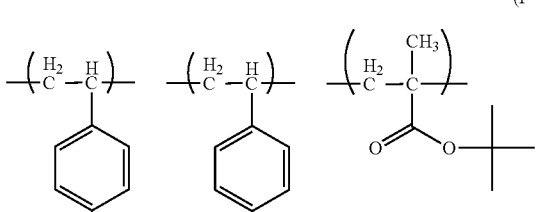
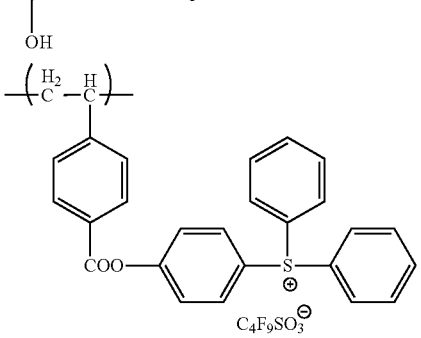
(P-52)
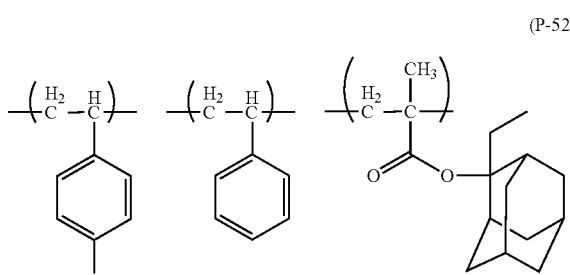
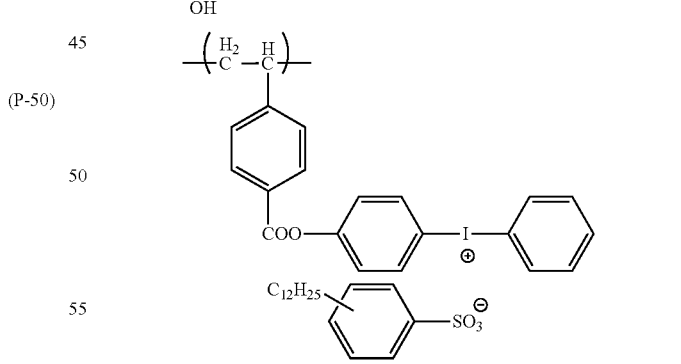
(P-53)
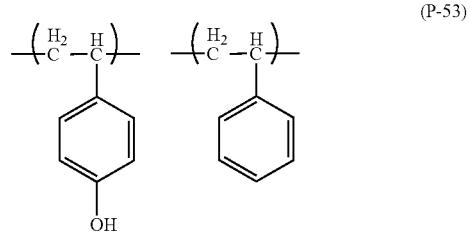

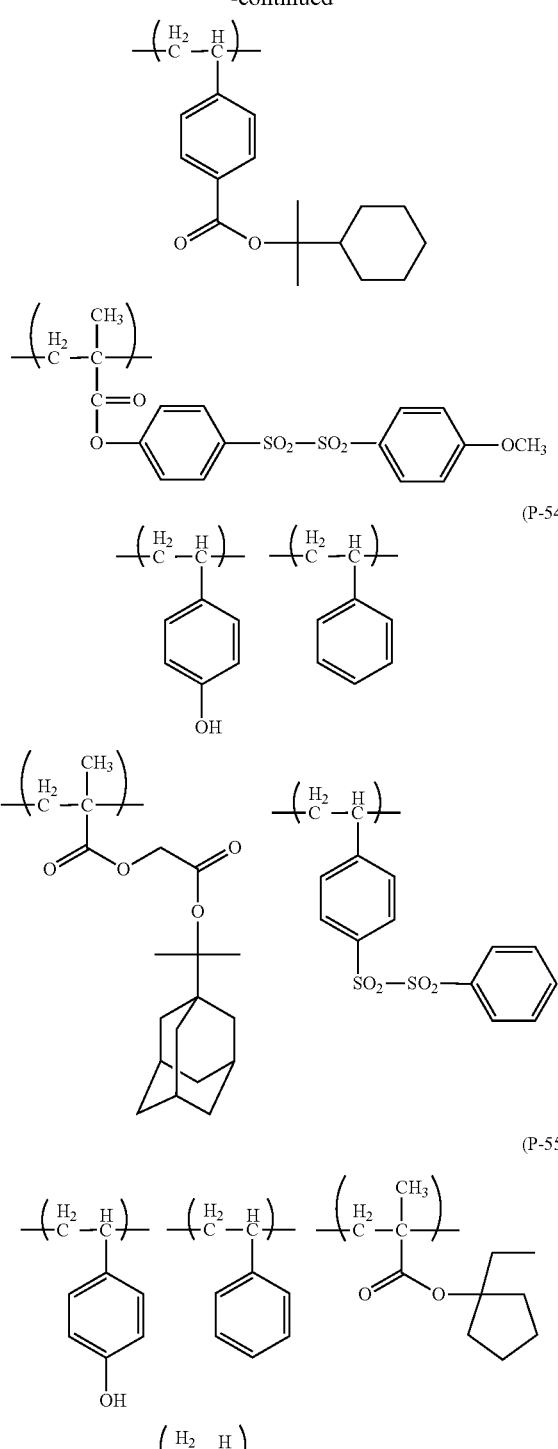
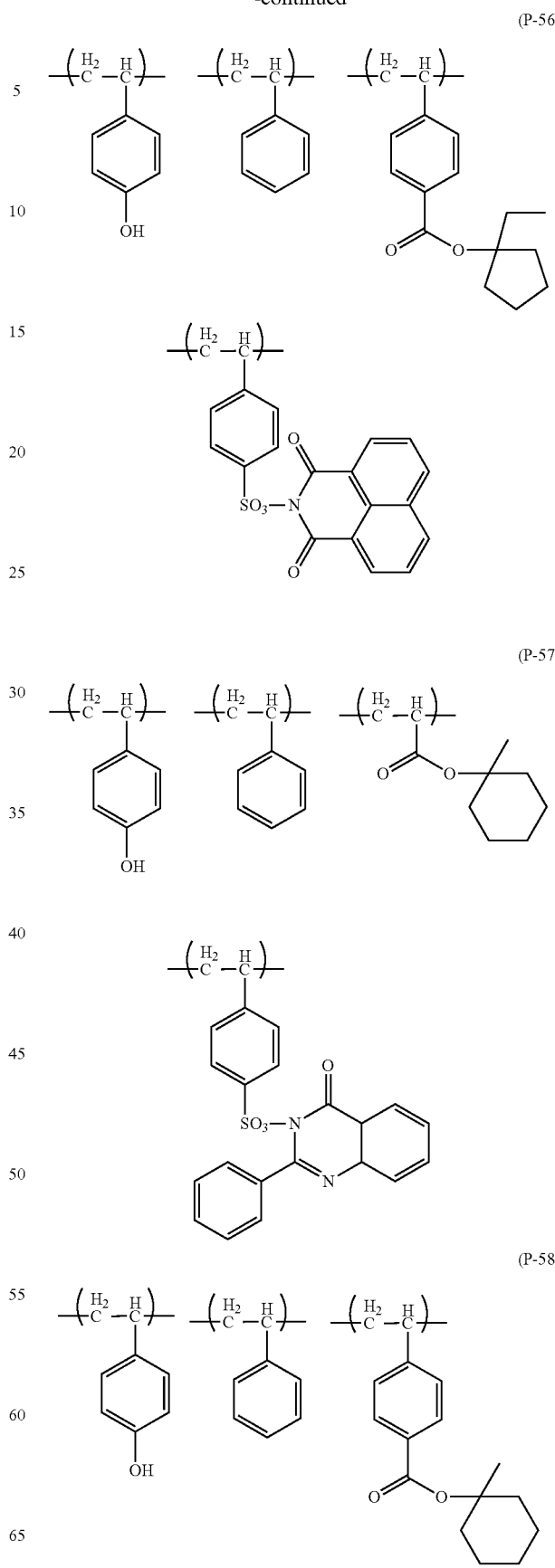

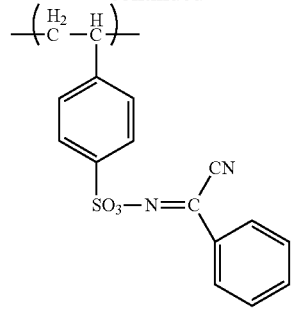
(P-59)
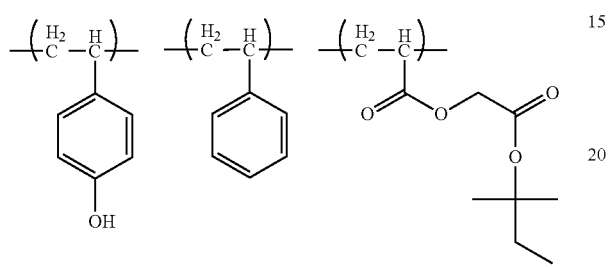
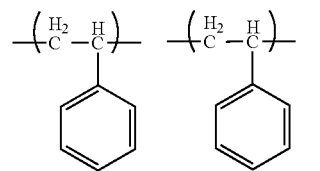
(P-60)
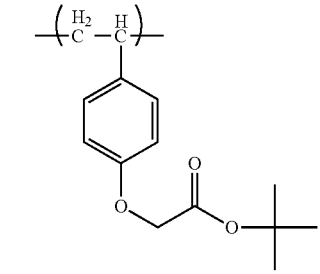
(P-61)
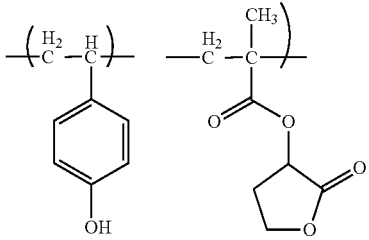
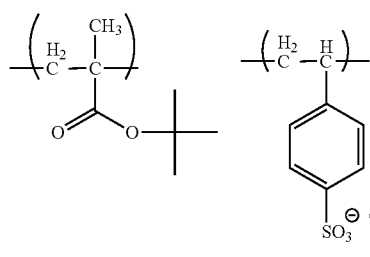
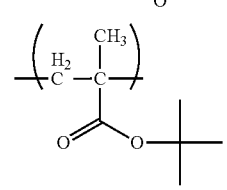
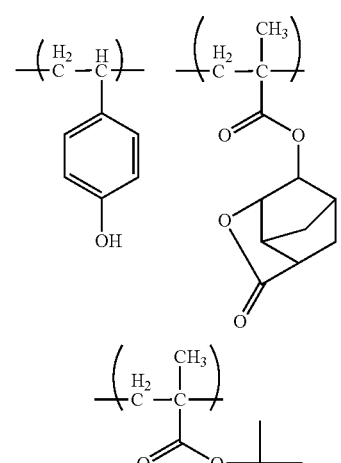
(P-62)
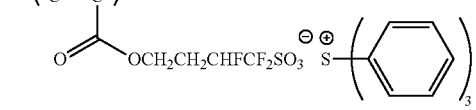
(P-63)
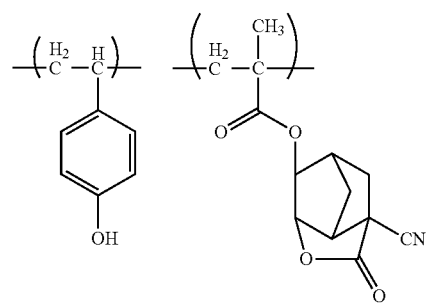

-continued
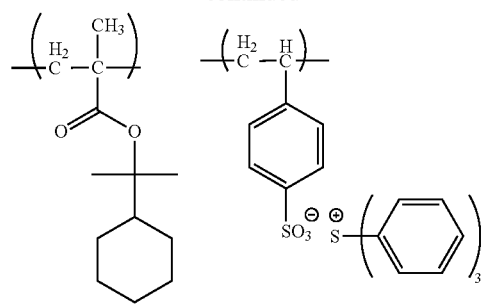
(P-64)
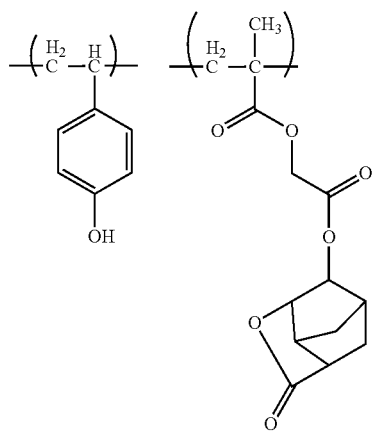
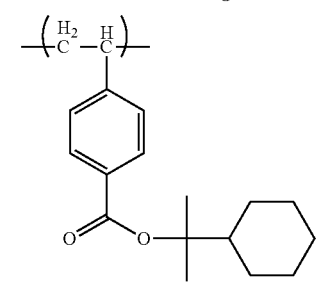
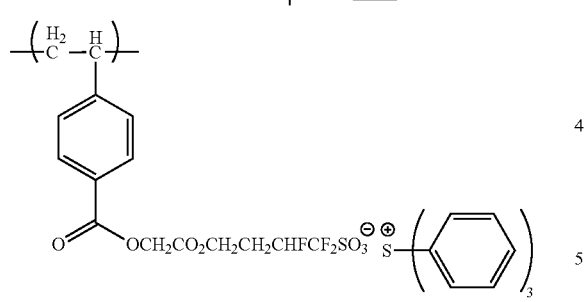
(P-65)
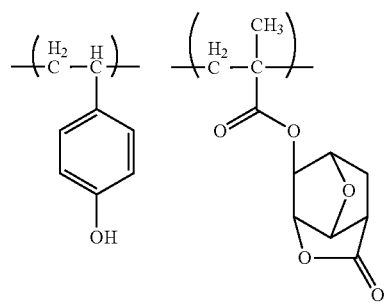
-continued
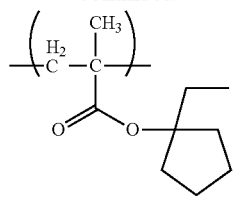
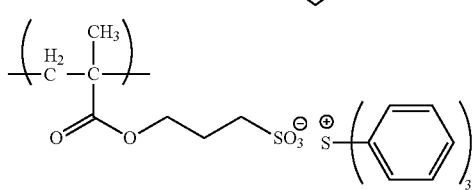
(P-66)
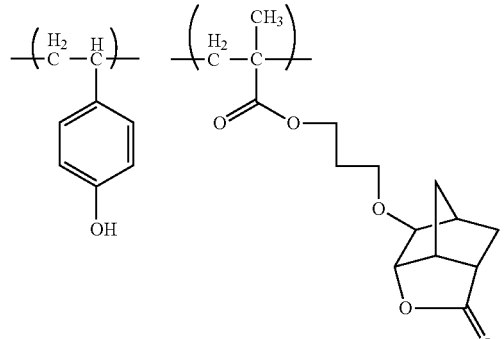
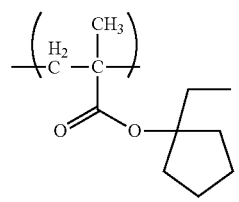
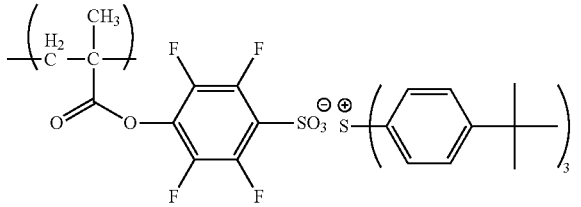
(P-67)
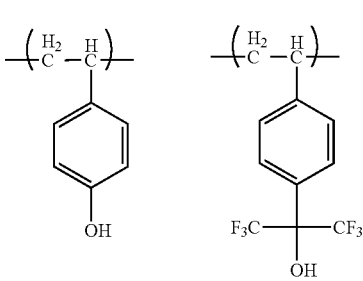
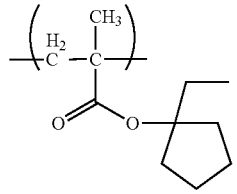

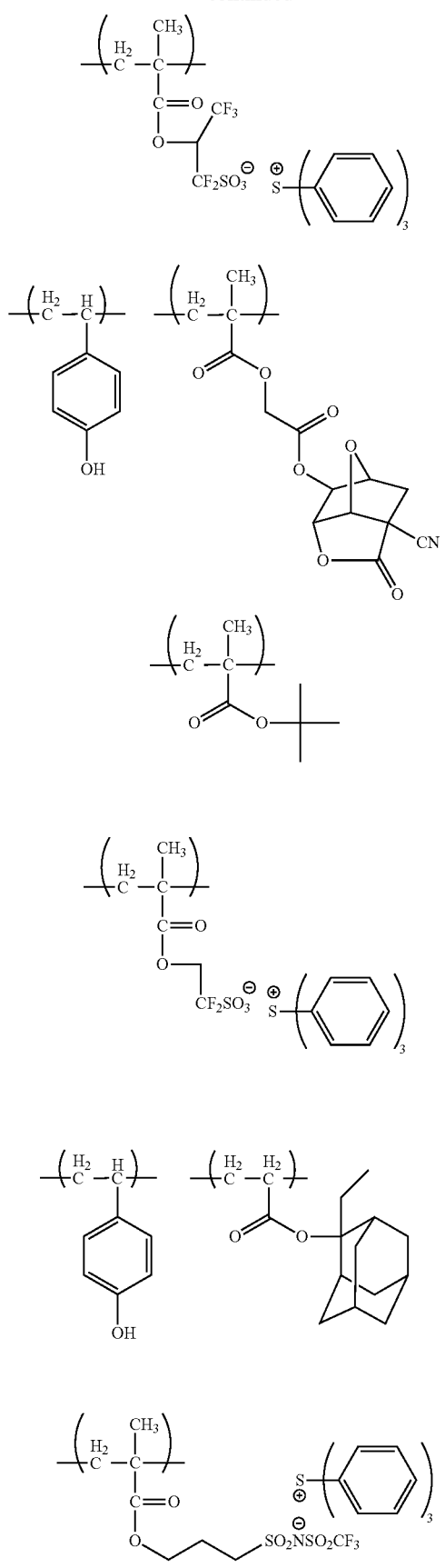
(P-68)
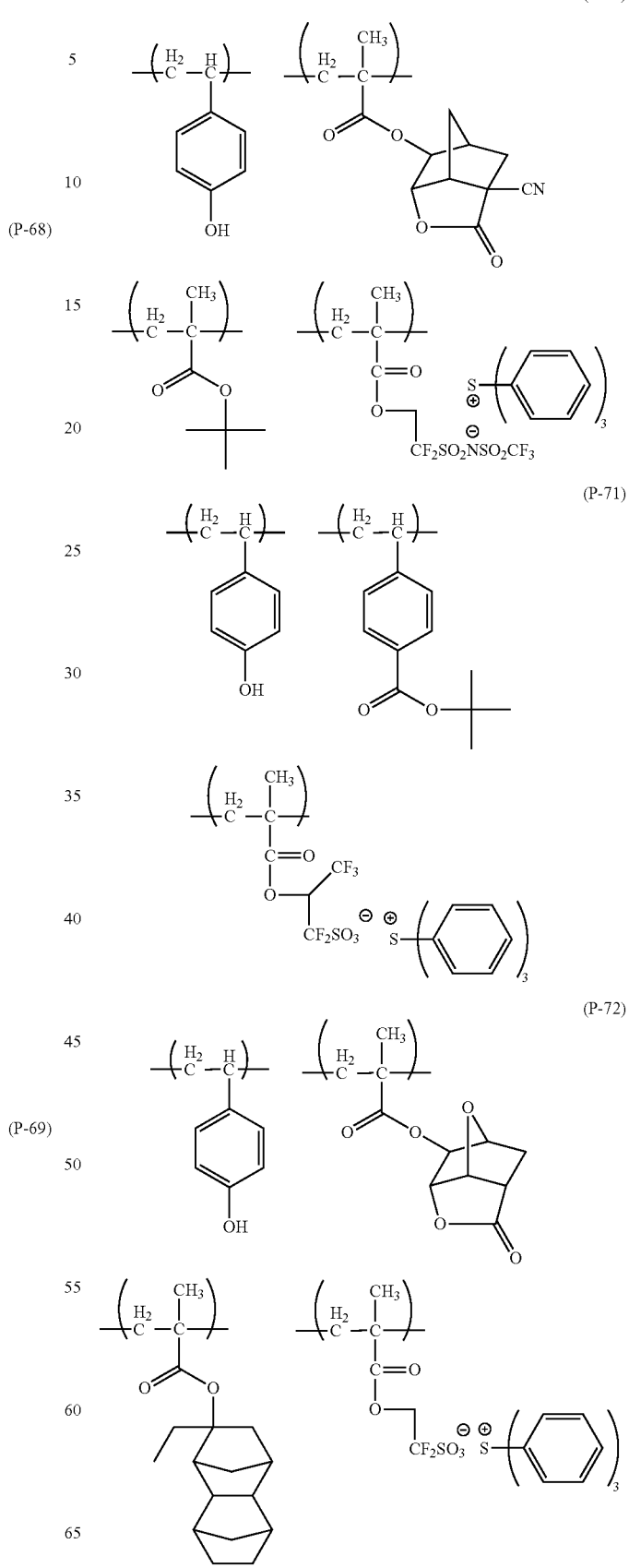
(P-70)
(P-71)
(P-72)

(P-73)
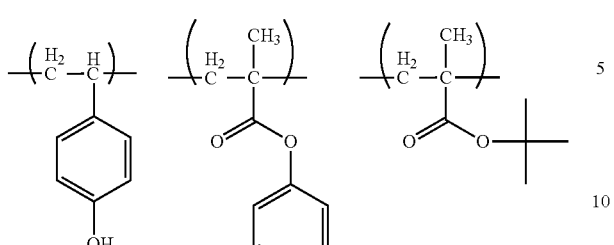
(P-74)
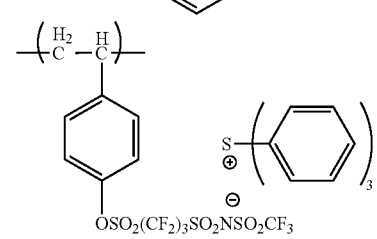
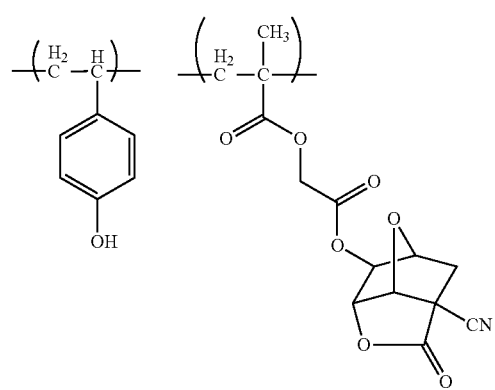
(P-75)
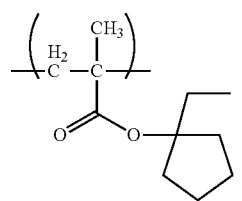
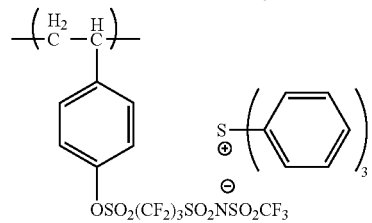
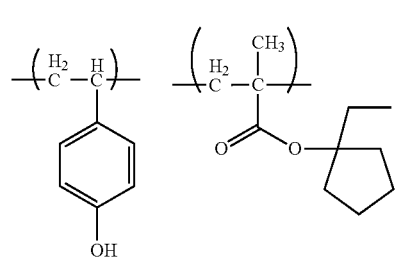
(P-76)
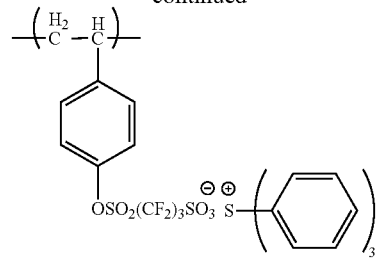
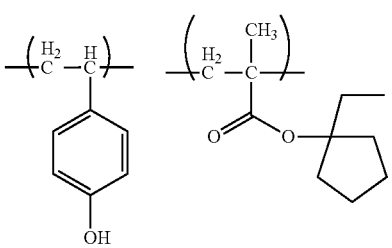
(P-77)
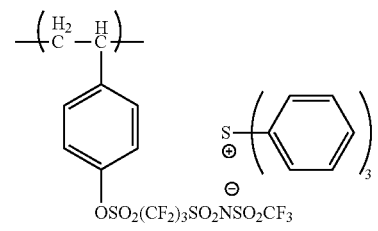
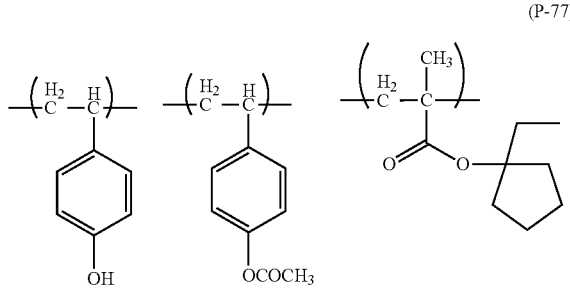
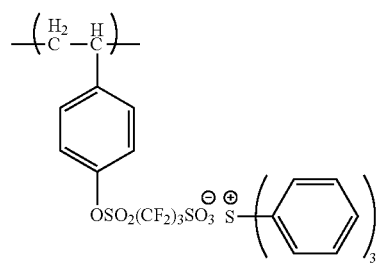
(P-78)
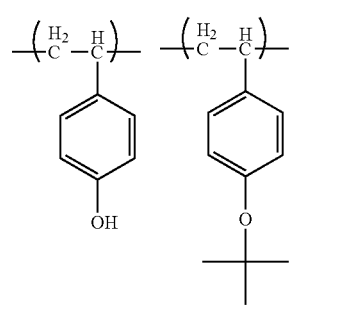

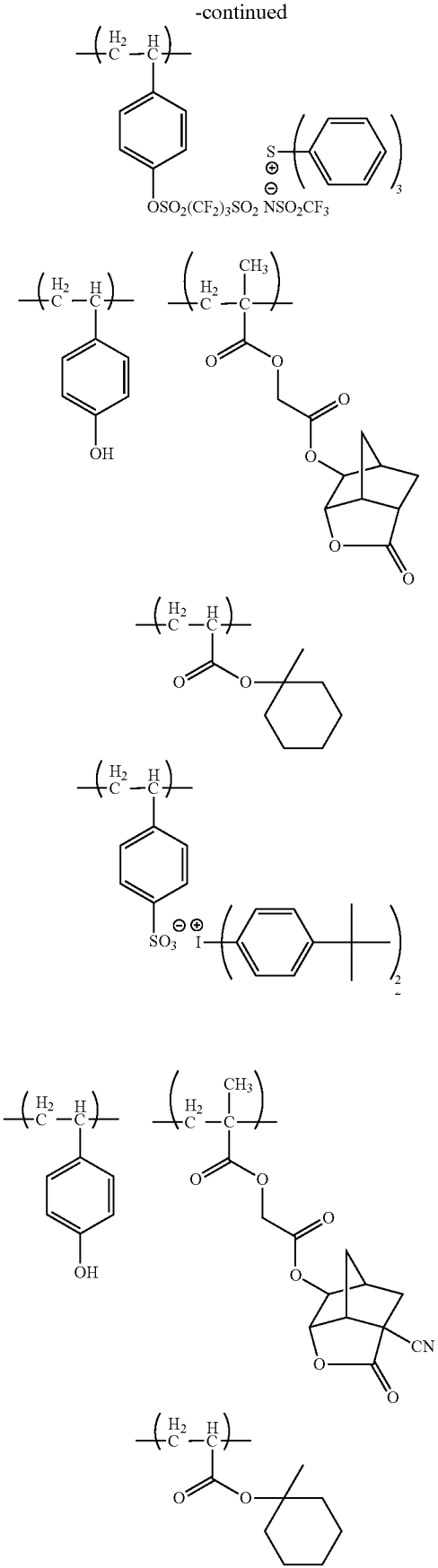
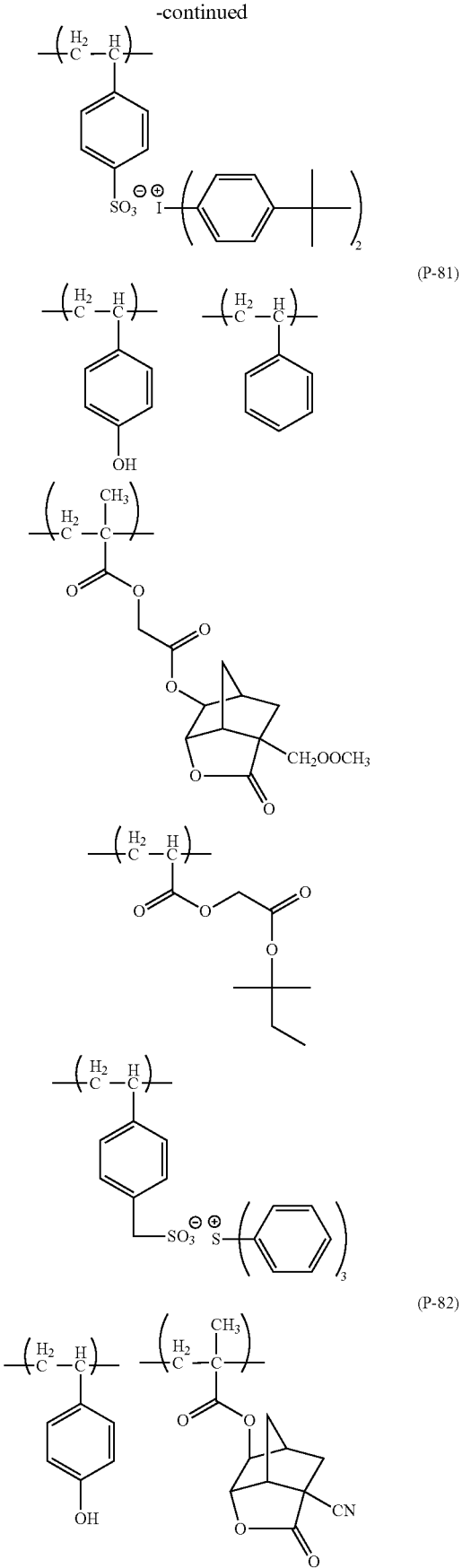

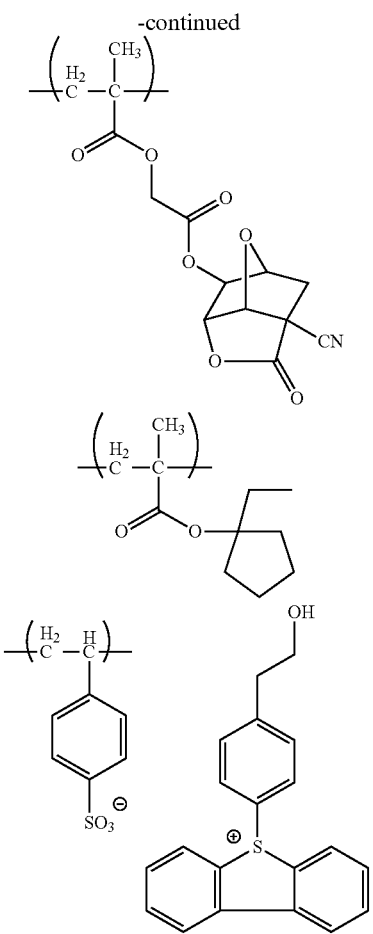

The actinic ray-sensitive or radiation-sensitive resin composition in the invention contains a solvent having a boiling temperature of 150° C. or less at normal pressure (760 mmHg).

A solvent having a boiling temperature of 150° C. or less at normal pressure may be used alone, or two or more kinds may be used in combination. Further, a solvent having a boiling temperature exceeding 150° C. at normal pressure may be used in combination. In the composition of the invention, the content of a solvent having a boiling temperature of 150° C. or less is preferably 50% by mass or more of all the amount of solvents, more preferably 65% by mass or more, still more preferably 70 to 100% by mass, especially preferably 75% by mass or more, and most preferably 90% by mass or more.

The boiling temperature of a solvent having a boiling temperature of 150° C. or less is preferably 50 to 150° C., and more preferably 80 to 150° C.

A solvent having a boiling temperature of 150° C. or less is preferably an organic solvent, and such a solvent can be selected from, for example, alkylene glycol monoalkyl ether carboxylate, alkylene glycol monoalkyl ether, alkyl lactate ester, alkylalkoxy propionate, cyclic lactone, a monoketone compound which may have a ring, alkylene carbonate, alkylalkoxy acetate, and alkyl pyruvate.

For example, a solvent having a boiling temperature of 150° C. or less at normal pressure is selected from the following exemplified solvents and one kind alone or two or more kinds may be used as mixture, further, such a solvent may be used in combination with a solvent having a boiling temperature exceeding 150° C. at normal pressure. Incidentally, in connecting with the following exemplified solvents, when there is no description about the pressure, the boiling temperature is the one at normal pressure. Further, when the boiling temperature at pressure other than 760 mmHg is described, it means that the solvent is a solvent having a high boiling temperature, and the solvent shows a boiling temperature higher than 150° C. at 760 mmHg.

As alkylene glycol monoalkyl ether carboxylate, e.g., propylene glycol monomethyl ether acetate (PGMEA, 1-methoxy-2-acetoxypropane) (b.p.: 146° C.), propylene glycol monoethyl ether acetate (b.p.: 164-165° C.), propylene glycol monopropyl ether acetate (b.p.: 173-174° C./740 mmHg), ethylene glycol monomethyl ether acetate (b.p.: 143° C.), and ethylene glycol monoethyl ether acetate (b.p.: 156° C.) are preferably exemplified.

As alkylene glycol monoalkyl ether, e.g., propylene glycol monomethyl ether (PGME, 1-methoxy-2-propanol) (b.p.: 119° C.), propylene glycol monoethyl ether (b.p.: 130-131° C.), propylene glycol monopropyl ether (b.p.: 148° C.), propylene glycol monobutyl ether (b.p.: 169-170° C.), ethylene glycol monomethyl ether (b.p.: 124-125° C.), and ethylene glycol monoethyl ether (b.p.: 134-135° C.) are preferably exemplified.

As alkyl lactate ester, e.g., methyl lactate (b.p.: 145° C.), ethyl lactate (b.p.: 154° C.), propyl lactate (b.p.: 169-172° C.), and butyl lactate (b.p.: 185-187° C.) are preferably exemplified.

As alkylalkoxy propionate, e.g., ethyl-3-ethoxy propionate (b.p.: 169-170° C.), methyl-3-ethoxy propionate (b.p.: 138-141° C.), and ethyl-3-methoxy propionate (b.p.: 156-158° C.) are preferably exemplified.

As cyclic lactone, e.g., β-propiolactone (b.p.: 162° C.), β-butyrolactone (b.p.: 71-73° C./29 mmHg), γ-butyrolactone (b.p.: 204-205° C.), α-methyl-γ-butyrolactone (b.p.: 78-81° C./10 mmHg), β-methyl-γ-butyrolactone (b.p.: 87-88° C./10 mmHg), γ-valerolactone (b.p.: 82-85° C./10 mmHg), γ-caprolactone (b.p.: 219° C.), γ-octanoic lactone (b.p.: 234° C.), and α-hydroxy-γ-butyrolactone (b.p.: 133° C./10 mmHg) are preferably exemplified.

As monoketone compounds which may have a ring, e.g., 2-butanone (b.p.: 80° C.), 3-methylbutanone (b.p.: 94-95° C.), pinacolone (b.p.: 106° C.), 2-pentanone (b.p.: 101-105° C.), 3-pentanone (b.p.: 102° C.), 3-methyl-2-pentanone (b.p.: 118° C.), 4-methyl-2-pentanone (b.p.: 117-118° C.), 2-methyl-3-pentanone (b.p.: 113° C.), 4,4-dimethyl-2-pentanone (b.p.: 125-130° C.), 2,4-dimethyl-3-pentanone (b.p.: 124° C.), 2,2,4,4-tetramethyl-3-pentanone (b.p.: 152-153° C.), 2-hexanone (b.p.: 127° C.), 3-hexanone (b.p.: 123° C.), 5-methyl-2-hexanone (b.p.: 145° C.), 2-heptanone (b.p.: 149-150° C.), 3-heptanone (b.p.: 146-148° C.), 4-heptanone (b.p.: 145° C.), 2-methyl-3-heptanone (b.p.: 158-160° C.), 5-methyl-3-heptanone (b.p.: 161-162° C.), 2,6-dimethyl-4-heptanone (b.p.: 165-170° C.), 2-octanone (b.p.: 173° C.), 3-octanone (b.p.: 167-168° C.), 2-nonanone (b.p.: 192° C./743 mmHg), 3-nonanone (b.p.: 187-188° C.), 5-nonanone (b.p.: 186-187° C.), 2-decanone (b.p.: 211° C.), 3-decanone (b.p.: 204-205° C.), 4-decanone (b.p.: 206-207° C.), 5-hexen-2-one (b.p.: 128-129° C.), 3-penten-2-one (b.p.: 121-124° C.), cyclopentanone (b.p.: 130-131° C.), 2-methylcyclopentanone (b.p.: 139° C.), 3-methylcyclopentanone (b.p.: 145° C.), 2,2-dimethylcyclopentanone (b.p.: 143-145° C.), 2,4,4-trimethylcyclopentanone (b.p.: 160° C.), cyclohexanone (b.p.: 157° C.), 3-methylcyclohexanone (b.p.: 169-170° C.), 4-methylcyclohexanone (b.p.: 169-171° C.), 4-ethylcyclohexanone (b.p.: 192-194° C.), 2,2-dimethylcyclohexanone (b.p.: 169-170° C.), 2,6-dimethylcyclohexanone (b.p.: 174-176° C.), 2,2,6-trimethylcyclohexanone (b.p.: 178-179° C.), cycloheptanone (b.p.: 179° C.), 2-methylcycloheptanone (b.p.: 182-185° C.), and 3-methylcycloheptanone (b.p.: 100° C./40 mmHg) are preferably exemplified.

As alkylene carbonate, e.g., propylene carbonate (b.p.: 240° C.), vinylene carbonate (b.p.: 162° C.), ethylene carbonate (b.p.: 243-244° C./740 mmHg), and butylene carbonate (b.p.: 88° C./0.8 mmHg) are preferably exemplified.

As alkylalkoxy acetate, e.g., 2-methoxyethyl acetate (b.p.: 145° C.), 2-ethoxyethyl acetate (b.p.: 155-156° C.), 2-(2-ethoxyethoxy)ethyl acetate (b.p.: 219° C.), and 1-methoxy-2-propyl acetate (b.p.: 145-146° C.) are preferably exemplified.

As alkyl pyruvate, e.g., methyl pyruvate (b.p.: 134-137° C.), ethyl pyruvate (b.p.: 144° C.), and propyl pyruvate (b.p.: 166° C.) are preferably exemplified.

As preferably usable solvents, 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl-3-ethoxy propionate, ethyl pyruvate, 2-ethoxyethyl acetate, 2-(2-ethoxyethoxy)ethyl acetate, and propylene carbonate are exemplified, but from the viewpoint of the reduction of outgassing, solvents whose boiling temperature is 150° C. or less at normal pressure such as 2-heptanone, propylene glycol monomethyl ether acetate, and propylene glycol monomethyl ether are especially preferred.

The use amount of the solvent (including all the solvents having a boiling temperature of 150° C. or more and 150° C. or less) in the whole amount of the composition can be arbitrarily adjusted according to a desired film thickness and the like, but is generally adjusted so that the concentration of the entire solids content of the composition reaches 0.5 to 30% by mass, preferably 1.0 to 20% by mass, and more preferably 1.5 to 10% by mass.

The actinic ray-sensitive or radiation-sensitive resin composition in the invention can further contain, according to necessity, a basic compound, a resin capable of decomposing by the action of an acid to increase a dissolution rate in an alkali aqueous solution, a conventional photo-acid generator, a surfactant, an acid-decomposable dissolution-inhibiting compound, a dye, a plasticizer, a photo-sensitizer, a dissolution-accelerating compound in a developer, and a compound having a proton-accepting functional group.

<Basic Compounds>

It is preferred that the actinic ray-sensitive or radiation-sensitive resin composition in the invention further contains a basic compound.

The basic compound is preferably a nitrogen-containing organic basic compound.

Usable compounds are not especially limited and, for example, compounds classified into the following (1) to (4) are preferably used.

(1) Compound Represented by the Following Formula (BS-1)

(BS-1)

In formula (BS-1), each of R independently represents any of a hydrogen atom, an alkyl group (straight chain or branched), a cycloalkyl group (monocyclic or polycyclic), an aryl group, and an aralkyl group. However, not all of three R's represent a hydrogen atom.

The carbon atom number of the alkyl group represented by R is not especially restricted and is generally 1 to 20, and preferably 1 to 12.

The carbon atom number of the cycloalkyl group represented by R is not especially restricted and is generally 3 to 20, and preferably 5 to 15.

The carbon atom number of the aryl group represented by R is not especially restricted and is generally 6 to 20, and preferably 6 to 10. Specifically a phenyl group and a naphthyl group are exemplified.

The carbon atom number of the aralkyl group represented by R is not especially restricted and is generally 7 to 20, and preferably 7 to 11. Specifically a benzyl group is exemplified.

The hydrogen atom of each of the alkyl group, cycloalkyl group, aryl group and aralkyl group represented by R may be substituted with a substituent. As the substituents, an alkyl group, a cycloalkyl group, an aryl group, an aralkyl group, a hydroxyl group, a carboxyl group, an alkoxy group, an aryloxy group, an alkylcarbonyloxy group, and an alkylcarbonyl group are exemplified.

It is preferred that, in the compound represented by formula (BS-1), one alone of three R's represents a hydrogen atom, or all R are not hydrogen atoms.

As the specific examples of the compound represented by formula (BS-1), tri-n-butylamine, tri-n-pentylamine, tri-n-octylamine, tri-n-decylamine, triisodecyl-amine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(t-butyl)aniline are exemplified.

Further, in formula (BS-1), a compound in which at least one R is an alkyl group substituted with a hydroxyl group is exemplified as a preferred embodiment. As the specific compounds, triethanolamine and N,N-dihydroxyethylaniline are exemplified.

Further, the alkyl group represented by R may have an oxygen atom in the alkyl chain to form an oxyalkylene chain. As the oxyalkylene chain, —CH$_2$CH$_2$O— is preferred. As the specific examples, tris(methoxyethoxyethyl)amine and the compounds disclosed in U.S. Pat. No. 6,040,112, column 3, line 60 and after, are exemplified.

(2) Compound Having a Nitrogen-Containing Heterocyclic Structure

As the heterocyclic structure, the compound may have or may not have an aromatic property. Further, a plurality of nitrogen atoms may be contained, and hetero atoms other than nitrogen atom may be contained. Specifically, a compound having an imidazole structure, (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine) are exemplified.

A compound having two or more cyclic structures is also preferably used. Specifically, 1,5-diazabicyclo[4.3.0]non-5-ene, 1,8-diazabicyclo[5.4.0]undeca-7-ene are exemplified.

(3) Amine Compound Having a Phenoxy Group

An amine compound having a phenoxy group is a compound having a phenoxy group at the terminal on the opposite side to the nitrogen atom of the alkyl group of an amine compound. The phenoxy group may have a substituent, e.g., an alkyl group, an alkoxy group, a halogen atom, a cyano group, a nitro group, a carboxyl group, a carboxylic acid ester group, a sulfonic acid ester group, an aryl group, an aralkyl group, an acyloxy group, or an aryloxy group.

More preferably, the compound is a compound having at least one oxyalkylene chain between the phenoxy group and the nitrogen atom. The number of oxyalkylene chains in one molecule is preferably 3 to 9, and more preferably 4 to 6. Of oxyalkylene chains, —CH$_2$CH$_2$O— is preferred.

As the specific examples, 2-[2-{2-(2,2-dimethoxyphenoxyethoxy)ethyl}-bis-(2-methoxyethyl)]amine, and Compounds (C1-1) to (C1-3) disclosed in U.S. Patent Application No. 2007/0224539A1, paragraph [0066] are exemplified.

(4) Ammonium Salt

Ammonium salts are also arbitrarily used. Preferred compound is hydroxide or carboxylate. More specifically, tetraalkylammonium hydroxide represented by tetrabutylammonium hydroxide is preferred.

As other basic compounds, the compounds synthesized in JP-A-2002-363146 and the compounds disclosed in JP-A-2007-298569, paragraph [0108] can also be used.

Basic compounds are used alone or in combination of two or more.

The use amount of basic compounds is generally 0.001 to 10% by mass based on all the solid content of the actinic ray-sensitive or radiation-sensitive resin composition, and preferably 0.01 to 5% by mass.

The molar ratio of acid generator/basic compound is preferably 2.5 to 300. That is, the molar ratio of 2.5 or more is preferred from the point of sensitivity and resolution, and 300 or less is preferred from the point of inhibition of the reduction of resolution by the thickening of the pattern in aging after exposure until heat treatment. The molar ratio is more preferably 5.0 to 200 and still more preferably 7.0 to 150.

The acid generator in the above molar ratio is the amount of sum total of repeating unit (a) contained in the resin (P) and the later-described acid generator other than the resin (P).

<Resin Capable of Decomposing by the Action of an Acid to Increase a Dissolution Rate in an Alkali Aqueous Solution>

The actinic ray-sensitive or radiation-sensitive resin composition in the invention may contain a resin capable of decomposing by the action of an acid to increase a dissolution rate in an alkali aqueous solution besides the resin (P).

A resin capable of decomposing by the action of an acid to increase a dissolution rate in an alkali aqueous solution (hereinafter referred to as "acid-decomposable resin") is a resin having a group capable of decomposing by the action of an acid and generating an alkali-soluble group (acid-decomposable group) on the main chain or side chain of a resin, or both main chain and side chain. A resin having an acid-decomposable group on the side chain is more preferred.

As disclosed in European Patent No. 254853, JP-A-2-25850, JP-A-3-223860 and JP-A-4-251259, acid-decomposable resin can be obtained by reacting an alkali-soluble resin with a precursor of acid-decomposable group, or by copolymerizing an alkali-soluble resin monomer with various monomers.

As acid-decomposable group, e.g., a group obtained by substituting the hydrogen atom of an alkali-soluble group, an alkali-soluble group such as a —COO group or an —OH group in a resin having the alkali-soluble group, with a group capable of leaving by the action of an acid is preferred.

As acid-decomposable groups, specifically the same groups with the acid-decomposable groups described above in the resin of the invention (e.g., acid-decomposable groups described as the repeating unit (B) in the resin (P)) can be preferably exemplified.

The alkali-soluble resin is not especially restricted. For example, alkali-soluble resins having a hydroxystyrene structure, e.g., poly(o-hydroxystyrene), poly(m-hydroxystyrene), polyp-hydroxystyrene), copolymers thereof, hydrogenated poly(hydroxystyrene), poly(hydroxystyrenes) having the substituent represented by any of the structures shown below, a resin having a phenolic hydroxyl group, a styrene-hydroxystyrene copolymer, an α-methylstyrene-hydroxystyrene copolymer, and hydrogenated novolak resin, and alkali-soluble resins containing a repeating unit having a carboxyl group such as (meth)acrylic acid or norbornene carboxylic acid are exemplified.

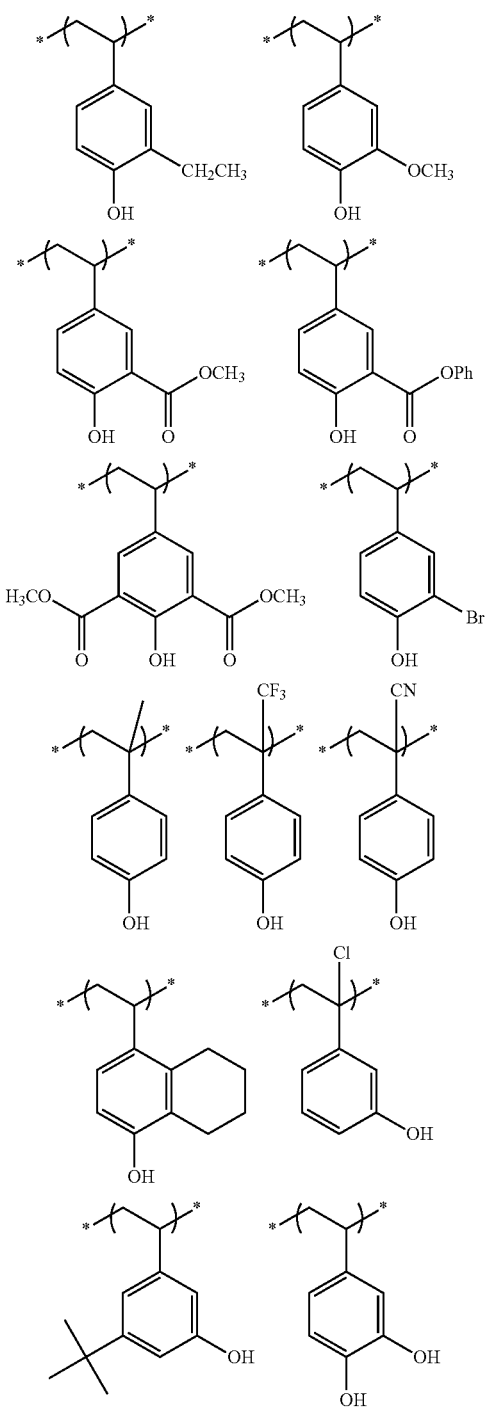

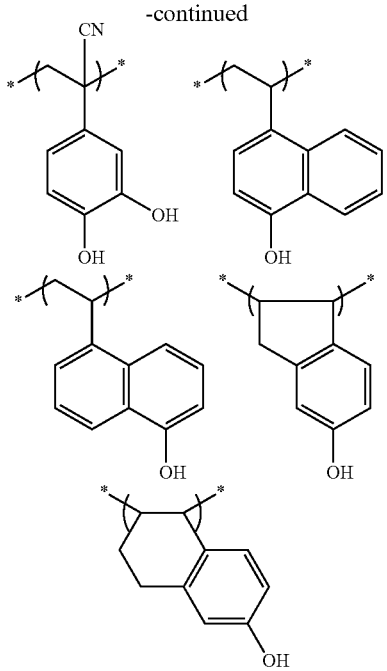

The alkali dissolution rate of these alkali-soluble resins is preferably 170 Å/sec or more particularly preferably 330 Å/sec or more, when measured with a 2.38% by mass of tetramethylammonium hydroxide (TMAH) at 23° C. More specifically, the alkali dissolution rate can be obtained by dissolving an alkali-soluble resin alone in a solvent such as propylene glycol monomethyl ether acetate (PGMEA) to make a composition having solid content concentration of 4% by mass, coating the composition on a silicon wafer to make a film (thickness: 100 nm), and measuring the time (seconds) until the film is thoroughly dissolved in a TMAH aqueous solution.

The content of an acid-decomposable group is expressed by the equation of X/(X+Y) taking the number of repeating units having a group capable of decomposing by the action of an acid in a resin as (X), and the number of repeating units having an alkali-soluble group not protected with a group capable of leaving by the action of an acid as (Y). The content is preferably 0.01 to 0.7, more preferably 0.05 to 0.50, and still more preferably 0.05 to 0.40.

The weight average molecular weight of acid-decomposable resins is preferably 50,000 or less as the polystyrene equivalent by GPC method, more preferably 1,000 to 20,000, and especially preferably 1,000 to 10,000.

The polydispersity (Mw/Mn) of acid-decomposable resins is preferably 1.0 to 3.0, more preferably 1.05 to 2.0, and still more preferably 1.1 to 1.7.

Two or more acid-decomposable resins may be used in combination.

In the actinic ray-sensitive or radiation-sensitive resin composition in the invention, the blending amount of acid-decomposable resins in the composition exclusive of the resin (P) is preferably 0 to 70% by mass in all the solids content of the composition, more preferably 0 to 50% by mass, and still more preferably 0 to 30% by mass.

<Acid-Generators>

The actinic ray-sensitive or radiation-sensitive resin composition in the invention contains the resin (P) having a photo-acid generating structure, and the composition may contain, other than the resin (P), a low molecular weight compound capable of generating an acid upon irradiation with an actinic ray or radiation (hereinafter also referred to as "acid-generator")

As such acid-generators, a photo-initiator for cationic photopolymerization, a photo-initiator for radical photopolymerization, a photo-decoloring agent for a dye, a photo-discoloring agent, and known compounds capable of generating an acid upon irradiation with an actinic ray or radiation, and mixtures thereof can be arbitrarily selected and used.

For example, a diazonium salt, a phosphonium salt, a sulfonium salt, an iodonium salt, imidosulfonate, oximsulfonate, diazodisulfone, disulfone, and o-nitrobenzyl sulfonate can be exemplified. As the specific examples of them, the compounds disclosed in U.S. Patent Application 2008/0241737A1, paragraphs [0164] to [0248] can be referred to.

When acid-generators are used in the actinic ray-sensitive or radiation-sensitive resin composition in the invention other than the resin (P) having a photo-acid generating structure, the acid-generators may be one kind alone, or two or more kinds may be used in combination. The content of acid-generators in the composition is preferably 0 to 20% by mass based on all the solids content in the resist composition, more preferably 0 to 10% by mass, and still more preferably 0 to 7% by mass. Acid-generators are not essential in the invention, but for obtaining the effect of addition, they are used in an amount of generally 0.01% by mass or more.

<Surfactants>

It is preferred for the actinic ray-sensitive or radiation-sensitive resin composition in the invention to further contain a surfactant. As the surfactants, fluorine/silicon surfactants are preferred.

As such surfactants, MEGAFAC F176, MEGAFAC R08 (manufactured by Dainippon Ink and Chemicals Inc.), PF656, PF6320 (manufactured by OMNOVA Solution Inc.), Troy Sol S-366 (manufactured by Troy Chemical Co., Ltd.), Fluorad FC430 (manufactured by Sumitomo 3M Limited), and polysiloxane polymer KP-341 (manufactured by Shin-Etsu Chemical Co., Ltd.) are exemplified.

It is also possible to use surfactants other than fluorine/silicon surfactants. More specifically, polyoxyethylene alkyl ethers and polyoxyethylene alkylaryl ethers are exemplified.

In addition to the above, known surfactants can be optionally used. As other usable surfactants, the surfactants disclosed in U.S. Patent Application No. 2008/0248425A1, paragraphs from [0273] downward are exemplified.

Surfactants may be used alone, or two or more may be used in combination.

The use amount of surfactants is preferably 0.0001 to 2% by mass based on all the solids content of the actinic ray-sensitive or radiation-sensitive resin composition, and more preferably 0.001 to 1% by mass.

<Acid-Decomposable Dissolution-Inhibiting Compounds>

The actinic ray-sensitive or radiation-sensitive resin composition in the invention can contain a dissolution-inhibiting compound capable of decomposing by the action of an acid to increase a dissolution rate in a developer having a molecular weight of 3,000 or less (hereinafter also referred to as "a dissolution-inhibiting compound").

As the dissolution-inhibiting compounds, alicyclic or aliphatic compounds having an acid-decomposable group, such as a cholic acid derivative containing an acid-decomposable group described in Proceeding of SPIE, 2724, 355 (1996) are preferred. As acid-decomposable groups and alicyclic structures, the same compounds as described above in the acid-decomposable resins can be exemplified.

When the actinic ray-sensitive or radiation-sensitive resin composition in the invention is irradiated with an electron beam or EUV ray, a dissolution-inhibiting compound having such a structure that the phenolic hydroxyl group of a phenol compound is substituted with an acid-decomposable group is preferably used. As the phenol compound, those having 1 to 9 phenol structures is preferred, and more preferably having 2 to 6 phenol structures.

The molecular weight of the dissolution-inhibiting compound in the invention is 3,000 or less, preferably 300 to 3,000, and more preferably 500 to 2,500.

<Other Components>

The actinic ray-sensitive or radiation-sensitive resin composition in the invention may contain a dye. Oil dyes and basic dyes are preferred.

For increasing acid-generating efficiency by exposure, the actinic ray-sensitive or radiation-sensitive resin composition in the invention can further contain a photo-sensitizer.

Dissolution-accelerating compounds in a developer usable in the invention are low molecular weight compounds having 2 or more phenolic hydroxyl groups or 1 or more carboxyl groups, and a molecular weight of 1,000 or less. When the compounds have carboxyl groups, alicyclic or aliphatic compounds are preferred. Such phenol compounds having a molecular weight of 1,000 or less are disclosed, e.g., in JP-A-4-122938, JP-A-2-28531, U.S. Pat. No. 4,916,210 and European Patent 219,294.

The compounds having a proton-accepting functional group disclosed in JP-A-2006-208781 and JP-A-2007-286574 can also be preferably used in the composition of the invention.

<Pattern-Forming Method>

The actinic ray-sensitive or radiation-sensitive resin composition in the invention is coated on a support such as a substrate and a resist film is formed. The thickness of the resist film is preferably 0.02 to 0.1 μm.

As a method of coating on a substrate, spin coating is preferred, and the number of revolution is preferably 1,000 to 3,000 rpm.

The actinic ray-sensitive or radiation-sensitive resin composition is coated on a substrate such as the one used in manufacture of a fine integrated circuit device (e.g., silicon, silicon dioxide coating) by a proper coating method, e.g., with a spinner, a coater or the like. The coated substrate is then dried to form a resist film. A known antireflection film may be previously coated.

The resist film is subjected to exposure (irradiation preferably with electron beams (EB), X-rays or EUV rays) generally through a mask, preferably baking (heating), and then development. Thus, a good pattern can be obtained.

In a developing process, an alkali developer is used as follows. As the alkali developer for a resist composition, for example, alkaline aqueous solutions such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

Further, appropriate amounts of alcohols and surfactants can be added to the above alkali developers.

The alkali concentration of the alkali developer is generally 0.1 to 20% by mass.

The pH of the alkali developer is generally 10.0 to 15.0.

EXAMPLE

The invention will be described in further detail with reference to examples but the invention is not restricted thereto.

Synthesis Example 1

Synthesis of Polymer (P-1)

(1) Synthesis of 4-styrenesulfonic acid triphenylsulfonium salt

Triphenylsulfonium Br salt (50 g) is dissolved in 65 ml of methanol. A mixed liquid of 30 g of 4-styrenesulfonic acid Na salt, 65 ml of methanol, and 130 ml of ion exchange water is dripped to the above solution at room temperature with stirring. To the solution are added ion exchange water and chloroform to perform extraction and washing. After an organic layer is concentrated, precipitated solid is slurried in hexane/ethyl acetate and filtered to obtain 48 g of 4-styrenesulfonic acid triphenylsulfonium salt.

(2) Synthesis of polymer (P-1)

1-Methoxy-2-propanol (10 ml) is heated at 80° C. in nitrogen current. A mixed solution comprising 3.0 g (25 mmol) of 4-hydroxystyrene, 1.2 g (10 mmol) of 4-methylstyrene, 6.4 g (45 mmol) of t-butyl methacrylate, 1.1 g (2.5 mmol) of 4-styrenesulfonic acid triphenylsulfonium salt, 1.2 g (5.2 mmol) of dimethyl 2,2'-azobisisobutyrate (V-601, manufactured by Wako Pure Chemical Industries), and 20 ml of 1-methoxy-2-propanol is dripped to the above liquid while stirring over 5 hours. After termination of dripping, the reaction solution is further stirred at 80° C. for 3 hours. After cooling the reaction solution, the solution is reprecipitated with a large amount of hexane/ethyl acetate and vacuum-dried to obtain 7.0 g of resin (P-1) of the invention. On measurement of $^1$H-NMR of the obtained resin, a peak presumably resulting from the OH group of 4-hydroxystyrene in the vicinity of 9.0 ppm, a peak presumably resulting from the methyl group of 4-methylstyrene in the vicinity of 2.3 ppm, a peak presumably resulting from the t-butyl group of t-butyl methacrylate in the vicinity of 1.4 ppm, and a peak presumably resulting from the phenyl group of the cationic part of 4-styrenesulfonic acid triphenylsulfonium salt in the vicinity of 7.8 ppm are respectively observed, thus the structure of resin (P-1) is confirmed. From the area ratio of these peaks, the composition ratio (from the left side in order of the repeating unit in the structural formula of resin (P-1) shown above, 35/15/45/5, in molar ratio) of the resin is computed. The weight average molecular weight (Mw: polystyrene equivalent) found from GPC (carrier: N-methyl-2-pyrrolidone (NMP)) is Mw: 4,500, and Mw/Mn: 1.7.

Synthesis Example 2

Synthesis of Polymer (P-2)

(1) Synthesis of 3,4,4-trifluoro-4-sulfobutyl methacrylate triphenylsulfonium salt Triphenylsulfonium Br salt (50 g) is dissolved in 65 ml of methanol. A mixed liquid of 39 g of 1,1,2-trifluoro-4-hydroxy-1-butanesulfonate lithium salt (synthesized according to the method described in Solid State Ionics, 1999, 123, 233), 65 ml of methanol, and 130 ml of ion exchange water is dripped to the above solution at room temperature with stirring. To the solution are added ion exchange water and chloroform to perform extraction and washing. After an organic layer is concentrated, precipitated solid is slurried in hexane/ethyl acetate and filtered to obtain 31 g (40%) of 3,4,4-trifluoro-4-sulfobutyl methacrylate triphenylsulfonium salt.

(2) Synthesis of polymer (P-2)

1-Methoxy-2-propanol (10 ml) is heated at 80° C. in nitrogen current. A mixed solution comprising 3.0 g (25 mmol) of 4-hydroxystyrene, 1.3 g (9.7 mmol) of 4-methylstyrene, 6.4 g (45 mmol) of t-butyl methacrylate, 1.3 g (2.4 mmol) of 3,4,4-trifluoro-4-sulfobutyl methacrylate triphenylsulfonium salt, 1.2 g (5.2 mmol) of dimethyl 2,2'-azobisisobutyrate (V-601, manufactured by Wako Pure Chemical Industries), and 20 ml of 1-methoxy-2-propanol is dripped to the above liquid while stirring over 5 hours. After termination of dripping, the reaction solution is further stirred at 80° C. for 3 hours. After cooling the reaction solution, the solution is reprecipitated with a large amount of hexane/ethyl acetate and vacuum-dried to obtain 6.6 g of resin (P-2) of the invention. On measurement of $^1$H-NMR of the obtained resin, a peak presumably resulting from the OH group of 4-hydroxystyrene in the vicinity of 9.0 ppm, a peak presumably resulting from the methoxy group of 4-methoxystyrene in the vicinity of 3.7 ppm, a peak presumably resulting from the t-butyl group of t-butyl methacrylate in the vicinity of 1.4 ppm, and a peak presumably resulting from the phenyl group of the cationic part of 3,4,4-trifluoro-4-sulfobutyl methacrylate triphenylsulfonium salt in the vicinity of 7.8 ppm are respectively observed, thus the structure of resin (P-2) is confirmed. From the area ratio of these peaks, the composition ratio (from the left side in order of the repeating unit in the structural formula of resin (P-2) shown above, 34/16/44/6, in molar ratio) of the resin is computed. The weight average molecular weight (Mw: polystyrene equivalent) found from GPC (carrier: N-methyl-2-pyrrolidone (NMP)) is Mw: 4,700, and Mw/Mn: 1.75.

Synthesis Example 3

Synthesis of Polymer (P-3)

1-Methoxy-2-propanol (17.5 ml) is heated at 80° C. in nitrogen current. A mixed solution comprising 10.3 g (85.4 mmol) of 4-hydroxystyrene, 8.0 g (38.2 mmol) of 2-cyclohexyl-2-propyl methacrylate, 1.7 g (3.8 mmol) of 4-styrenesulfonic acid triphenylsulfonium salt, 5.9 g (25.5 mmol) of dimethyl 2,2'-azobisisobutyrate (V-601, manufactured by Wako Pure Chemical Industries), and 70 ml of 1-methoxy-2-propanol is dripped to the above liquid while stirring over 4 hours. After termination of dripping, the reaction solution is further stirred at 80° C. for 2 hours. After cooling the reaction solution, the solution is reprecipitated with a large amount of hexane/ethyl acetate and vacuum-dried to obtain 17.1 g of polymer (P-3) of the invention. On measurement of $^1$H-NMR of the obtained polymer, a peak presumably resulting from the OH group of 4-hydroxystyrene in the vicinity of 9.0 ppm, and a peak presumably resulting from the phenyl group of the cationic part of 4-styrenesulfonic acid triphenylsulfonium salt in the vicinity of 7.8 ppm are respectively observed. Further, peaks presumably resulting from the methylene group and methine group of 4-hydroxystyrene and 4-styrenesulfonic acid triphenylsulfonium salt in the vicinity of 0.0 to 2.0 ppm are observed, and at the same time a peak presumably resulting from 2-cyclohexyl-2-propyl methacrylate is observed, thus the structure of polymer (P-3) is confirmed. From the area ratio of these peaks, the composition ratio (from the left side in order of the repeating unit in the structural formula of resin (P-3) shown above, 60/37/3, in molar ratio) of the polymer is computed. The weight average molecular weight found from GPC is Mw: 5,000, and Mw/Mn: 1.6.

Other resins are also synthesized in the same manner.

Examples 1 to 35 and Comparative Examples 1 to 5

Resist Evaluation (EB)

The components shown in Table 1 below are dissolved in the mixed solvent shown in Table 1 and a solution having solids content concentration of 5.0% by mass is prepared. The solution is filtered through a polytetrafluoroethylene filter having a pore size of 0.1 μm, and a positive resist solution is obtained. The prepared positive resist solution is uniformly coated with a spin coater on a silicon substrate having been treated with hexamethyldisilazane, the substrate is dried on a hot plate by heating at 110° C. for 90 seconds, and a resist film having a thickness of 100 nm is formed.

The resist film is irradiated with electron beam by an electron beam irradiating apparatus (HL750, accelerating voltage: 50 KeV, manufactured by Hitachi Ltd.). Immediately after irradiation, the resist film is heated at 130° C. for 90 seconds on a hot plate. The resist film is then developed with a tetramethylammonium hydroxide aqueous solution having concentration of 2.38% by mass at 23° C. for 60 seconds, rinsed with pure water for 30 seconds, and dried to form a line and space pattern. The obtained pattern is evaluated by the methods shown below.
[Sensitivity]
The form of the cross section of the obtained pattern is observed with a scanning electron microscope (S-9220, manufactured by Hitachi Limited). The minimum irradiation energy for resolving a 100 nm line (line and space: 1/1) is taken as sensitivity.
[Resolution]
Limiting resolution in the irradiation quantity showing the above sensitivity (the minimum line width capable of separation-resolving the line and space) is taken as resolution.
[Line Edge Roughness (LER)]
Concerning ordinary 30 points in the longitudinal direction 50 μm of 100 nm line pattern in the irradiation quantity showing the above sensitivity, the distance from the intrinsic base line of the edge is measured with a scanning electron microscope (S-9220, manufactured by Hitachi, Ltd.), and standard deviation is found and 3σ is computed.
[Pattern Form]
The form of the cross section of the 100 nm line pattern in the irradiation quantity showing the above sensitivity is observed with a scanning electron microscope (S-4300, manufactured by Hitachi Limited), and three-stage evaluation of rectangle, a little taper and taper is performed.
[Outgassing]
Evaluation is performed by the degree of variability (Z) of the film thickness at the time of irradiation with the minimum irradiation energy for resolving 100 nm line (line and space: 1/1).

$Z=\{[(\text{film thickness before exposure})-(\text{film thickness after exposure})]/(\text{film thickness before exposure})\}\times 100(\%)$ Here, the film thickness after exposure indicates the film thickness immediately after exposure and is the film thickness before entering PEB and alkali developing process. The smaller the value, the better is the performance.

TABLE 1

| | | Results of evaluation by EB exposure | | | |
|---|---|---|---|---|---|
| Ex. No. | Resin 1 [Composition Ratio]*1 <Mw, Mw/Mn>*2 (Concentration)*3 | Resin 2 [Composition Ratio]*1 <Mw, Mw/Mn>*2 (Concentration)*3 | Conventional Acid-Generating Agent (concentration)*3 | Basic Cpd. (concentration)*3 | Surfactant (concentration)*3 |
| Ex. 1 | P-1 [35/15/45/5] <4,500, 1.7> (99.95) | None | None | None | W-1 (0.05) |
| Ex. 2 | P-1 [35/15/45/5] <4,500, 1.7> (99.95) | None | None | None | W-1 (0.05) |
| Ex. 3 | P-2 [34/16/44/6] <4,700, 1.75> (99.95) | None | None | None | W-1 (0.05) |
| Ex. 4 | P-3 [60/37/3] <5,000, 1.6> (99.95) | None | None | None | W-2 (0.05) |
| Ex. 5 | P-4 [36/14/45/5] <5,000, 1.75> (99.95) | None | None | None | W-3 (0.05) |
| Ex. 6 | P-12 [36/14/46/4] <4,700, 1.73> (99.95) | None | None | None | W-1 (0.05) |
| Ex. 7 | P-19 [35/15/47/3] <4,800, 1.86> (99.95) | None | None | None | W-1 (0.05) |
| Ex. 8 | P-21 [47.5/46.5/6] <4,500, 1.90> (99.95) | None | None | None | W-1 (0.05) |
| Ex. 9 | P-21 [47.5/46.5/6] <4,700, 1.66> (99.95) | None | None | None | W-1 (0.05) |
| Ex. 10 | P-21 [47.5/46.5/6] <4,500, 1.90> (99.95) | None | None | None | W-1 (0.05) |
| Ex. 11 | P-29 [48/47/5] <4,500, 1.80> (99.95) | None | None | None | W-1 (0.05) |
| Ex. 12 | P-30 [50/45/5] <4,500, 1.80> (99.95) | None | None | None | W-1 (0.05) |
| Ex. 13 | P-35 [30/18/47/5] <4,700, 1.66> (99.95) | None | None | None | W-1 (0.05) |
| Ex. 14 | P-44 [35/15/45/5] <4,500, 1.91> (99.95) | None | None | None | W-1 (0.05) |
| Ex. 15 | P-48 [37/13/45/5] <4,300, 1.65> (99.95) | None | None | None | W-2 (0.05) |
| Ex. 16 | P-59 [35/15/46/4] <4,300, 1.65> (99.95) | None | None | None | W-3 (0.05) |
| Ex. 17 | P-4 [50/0/44/6] <5,000, 1.75> (74.95) | P-44 [0/50/45/5] <4,300, 1.65> (25) | None | None | W-1 (0.05) |
| Ex. 18 | P-4 [52/0/42/6] | P-48 [0/50/45/5] | None | None | W-1 (0.05) |

TABLE 1-continued

| | Results of evaluation by EB exposure | | | | |
|---|---|---|---|---|---|
| | <5,000, 1.75><br>(74.95) | <4,300, 1.65><br>(25) | | | |
| Ex. 19 | P-2<br>[29/26/40/5]<br><4,500, 1.65><br>(84.95) | PR-1<br>[70/30]<br><19,000, 1.14><br>(15) | None | None | W-1<br>(0.05) |
| Ex. 20 | P-2<br>[34/16/44/6]<br><4,500, 1.65><br>(99.65) | None | None | TPI<br>(0.3) | W-1<br>(0.05) |
| Ex. 21 | P-2<br>[34/16/44/6]<br><4,500, 1.65><br>(98.65) | None | PAG-1<br>(1) | TPI<br>(0.3) | W-1<br>(0.05) |
| Ex. 22 | P-4<br>[36/14/45/5]<br><5,000, 1.75><br>(66.95) | PR-2<br>[70/30]<br><20,000, 1.15><br>(33) | None | None | W-1<br>(0.05) |
| Ex. 23 | P-4<br>[36/14/45/5]<br><5,000, 1.75><br>(97.45) | None | PAG-1<br>(2) | TBAH<br>(0.5) | W-1<br>(0.05) |
| Ex. 24 | P-44<br>[35.5/14.5/44/6]<br><4,500, 1.91><br>(97.45) | None | PAG-1<br>(2) | TBAH<br>(0.5) | W-1<br>(0.05) |
| Ex. 25 | P-22<br>[45/12/37/6]<br><4,600, 1.85><br>(99.65) | None | None | TBAH<br>(0.3) | W-1<br>(0.05) |
| Ex. 26 | P-29<br>[50/46/4]<br><5,100, 1.89><br>(99.65) | None | None | TBAH<br>(0.3) | W-1<br>(0.05) |
| Ex. 27 | P-40<br>[46/11/37/6]<br><4,750, 1.81><br>(99.65) | None | None | TBAH<br>(0.3) | W-1<br>(0.05) |
| Ex. 28 | P-55<br>[45/10/37/8]<br><6,200, 1.85><br>(99.65) | None | None | TBAH<br>(0.3) | W-1<br>(0.05) |
| Ex. 29 | P-61<br>[51/10/33/6]<br><4,500, 1.91><br>(99.65) | None | None | TBAH<br>(0.3) | W-1<br>(0.05) |
| Ex. 30 | P-62<br>[52/10/32/6]<br><5,000, 1.86><br>(99.65) | None | None | TBAH<br>(0.3) | W-1<br>(0.05) |
| Ex. 31 | P-66<br>[55/10/29/6]<br><4,850, 1.83><br>(99.65) | None | None | TBAH<br>(0.3) | W-1<br>(0.05) |
| Ex. 32 | P-72<br>[40/20/30/10]<br><5,250, 1.79><br>(99.65) | None | None | TBAH<br>(0.3) | W-1<br>(0.05) |
| Ex. 33 | P-75<br>[61/36/3]<br><5,250, 1.79><br>(99.65) | None | None | TBAH<br>(0.3) | W-1<br>(0.05) |
| Ex. 34 | P-1<br>[35/15/45/5]<br><4,500, 1.7><br>(100) | None | None | None | None |
| Ex. 35 | P-1<br>[35/15/45/5]<br><4,500, 1.7><br>(100) | None | None | None | W-1<br>(0.05) |
| Comp. Ex. 1 | PR-1<br>[70/30]<br><19,000, 1.14><br>(91.95) | None | PAG-1<br>(8) | None | W-1<br>(0.05) |
| Comp. Ex. 2 | PR-1<br>[70/30]<br><19,000, 1.14><br>(90.45) | None | PAG-1<br>(8) | TPI<br>(1.5) | W-1<br>(0.05) |

TABLE 1-continued

Results of evaluation by EB exposure

| | | | | | |
|---|---|---|---|---|---|
| Comp. Ex. 3 | PR-1 [70/30] <19,000, 1.14> (50) | PR-3 [70/30] <21,000, 1.85> (49.95) | None | None | W-1 (0.05) |
| Comp. Ex. 4 | PR-4 [17/50/30/3] <38,500, 2.55> (99.95) | None | None | None | W-1 (0.05) |
| Comp. Ex. 5 | P-1 [35/15/45/5] <4,500, 1.7> (99.95) | None | None | None | W-1 (0.05) |

| Ex. No. | Organic Solvent (mixing ratio)*4 | Sensitivity (μC/cm²) | Resolution (nm) | Pattern Form | LER (nm) | Outgassing (Z) | Remarks |
|---|---|---|---|---|---|---|---|
| Ex. 1 | S1/S2 (40/60) | 23 | 65 | Rectangle | 5.0 | 5.1 | — |
| Ex. 2 | S1/S6 (80/20) | 23.1 | 65 | Rectangle | 4.9 | 5.9 | — |
| Ex. 3 | S1/S5 (40/60) | 21 | 60 | Rectangle | 4.7 | 4.9 | — |
| Ex. 4 | S1/S2 (40/60) | 18.5 | 65 | Rectangle | 4.0 | 3.7 | — |
| Ex. 5 | S1/S2 (40/60) | 17.1 | 65 | Rectangle | 4.9 | 3.7 | — |
| Ex. 6 | S1/S2 (40/60) | 17 | 65 | Rectangle | 4.9 | 3.5 | — |
| Ex. 7 | S1/S2 (40/60) | 23.5 | 55 | Rectangle | 4.5 | 3 | — |
| Ex. 8 | S1/S2 (40/60) | 18.5 | 60 | Rectangle | 4.3 | 3.2 | — |
| Ex. 9 | S1/S2 (60/40) | 19.5 | 55 | Rectangle | 4.0 | 4.5 | — |
| Ex. 10 | S1/S2 (40/60) | 16.9 | 65 | Rectangle | 4.8 | 4.1 | — |
| Ex. 11 | S1/S2 (40/60) | 16.8 | 65 | Rectangle | 5.0 | 4.5 | — |
| Ex. 12 | S1/S2 (40/60) | 17 | 65 | Rectangle | 4.9 | 4.1 | — |
| Ex. 13 | S1/S2 (40/60) | 22.4 | 65 | Rectangle | 4.5 | 4.5 | — |
| Ex. 14 | S1/S2 (40/60) | 18.5 | 60 | Rectangle | 5.0 | 3.5 | — |
| Ex. 15 | S1/S2 (40/60) | 17.5 | 60 | Rectangle | 4.5 | 3.4 | — |
| Ex. 16 | S2/S3 (60/40) | 25 | 65 | Rectangle | 5.5 | 5.5 | — |
| Ex. 17 | S1/S2 (40/60) | 18 | 60 | Rectangle | 5.0 | 3.6 | — |
| Ex. 18 | S1/S2 (40/60) | 17.3 | 60 | Rectangle | 4.8 | 3.7 | — |
| Ex. 19 | S2/S4 (60/40) | 23.8 | 65 | Rectangle | 5.5 | 8 | — |
| Ex. 20 | S1/S2 (40/60) | 33.1 | 60 | Rectangle | 4.3 | 5 | — |
| Ex. 21 | S1/S2 (40/60) | 28 | 65 | Rectangle | 5.1 | 5.1 | — |
| Ex. 22 | S1/S2 (40/60) | 18 | 65 | Rectangle | 5.2 | 4.1 | — |
| Ex. 23 | S1/S2 (50/50) | 19.7 | 60 | Rectangle | 4.3 | 4 | — |
| Ex. 24 | S1/S2 (50/50) | 26.5 | 60 | Rectangle | 7.5 | 4 | — |
| Ex. 25 | S1/S2 (50/50) | 22 | 60 | Rectangle | 4.4 | 5.2 | — |
| Ex. 26 | S1/S2 (50/50) | 22 | 65 | Rectangle | 4.6 | 5.5 | — |
| Ex. 27 | S1/S2 (50/50) | 23 | 60 | Rectangle | 4.5 | 5.2 | — |
| Ex. 28 | S1/S2 (50/50) | 25 | 65 | Rectangle | 4.4 | 5.1 | — |
| Ex. 29 | S1/S2 (50/50) | 21 | 60 | Rectangle | 4.5 | 5 | — |
| Ex. 30 | S1/S2 (50/50) | 20 | 60 | Rectangle | 4.3 | 5.1 | — |

TABLE 1-continued

| | | Results of evaluation by EB exposure | | | | | |
|---|---|---|---|---|---|---|---|
| Ex. 31 | S1/S2 (50/50) | 19 | 60 | Rectangle | 4.1 | 5.1 | — |
| Ex. 32 | S1/S6 (70/30) | 20 | 60 | Rectangle | 4.2 | 4.8 | — |
| Ex. 33 | S1/S2 (40/60) | 23 | 55 | Rectangle | 4.0 | 5.4 | — |
| Ex. 34 | S1/S6 (70/30) | 22.5 | 65 | Rectangle | 5.0 | 6.5 | — |
| Ex. 35 | S1/S6 (60/40) | 22.1 | 65 | Rectangle | 5.2 | 7.6 | — |
| Comp. Ex. 1 | S1/S2 (40/60) | — | — | — | — | 10.6 | 100 nm L/S pattern cannot be formed |
| Comp. Ex. 2 | S1/S2 (40/60) | 22.8 | 90 | Taper | 12.6 | 10.5 | — |
| Comp. Ex. 3 | S1/S2 (40/60) | 27.6 | 85 | Taper | 10.2 | 9.1 | — |
| Comp. Ex. 4 | S1/S2 (40/60) | — | — | — | — | 8.5 | 100 nm L/S pattern cannot be formed |
| Comp. Ex. 5 | S6 | 23.1 | 65 | Rectangle | 5.1 | 8.3 | — |

*1 Molar ratio
*2 Mw and Mn are respectively weight average molecular weight and number average molecular weight as polystyrene equivalent found by GPC (carrier: N-methyl-2-pyrrolidone (NMP))
*3 % by mass in all the solids content
*4 Mass ratio In Comparative Examples 1 and 4, patterns of 100 nm line (line and space: 1/1) cannot be formed.

From Table 1, it is apparent that the actinic ray-sensitive or radiation-sensitive resin compositions in the invention can satisfy high sensitivity, high resolution, good pattern form, good line edge roughness and reduction of outgassing at the same time.

The structures of the materials (other resins, conventional acid generators and basic compounds) used in examples and comparative examples are shown below.

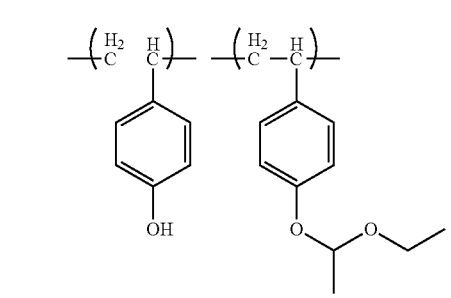

PR-1

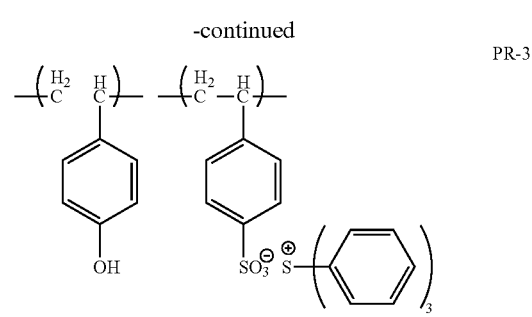

PR-3

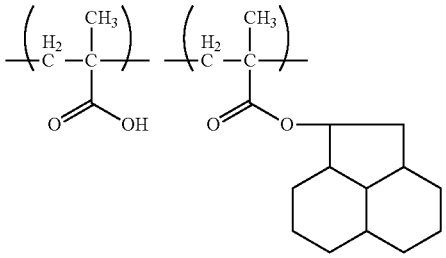

PR-2

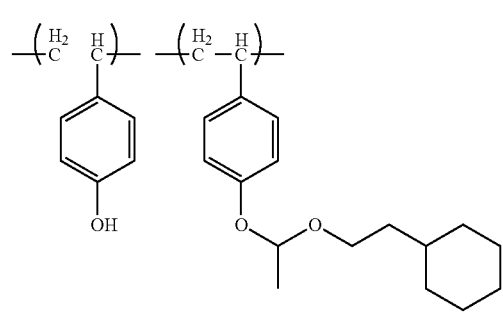

PR-4

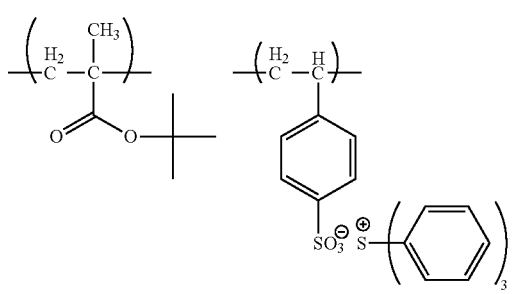

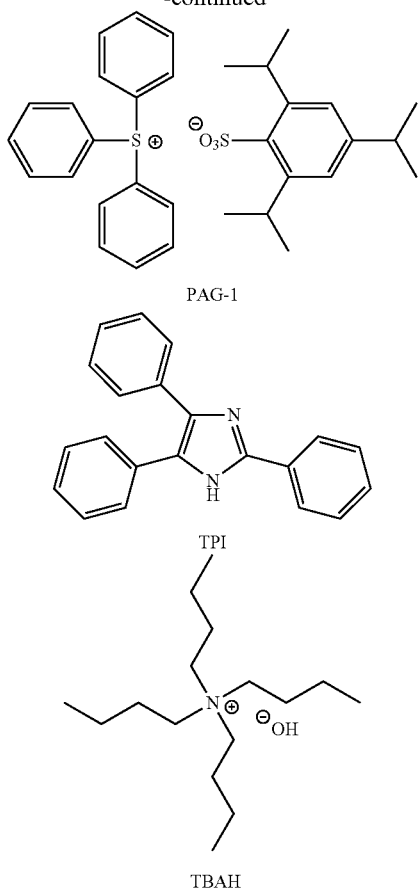

PAG-1

TPI

TBAH

The surfactants and solvents used in examples and comparative examples are shown below.
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer (silicon surfactant, manufactured by Shin-Etsu Chemical Co., Ltd.)
S1: Propylene glycol monomethyl ether acetate (PGMEA, b.p.: 146° C.)
S2: Propylene glycol monomethyl ether (PGME, b.p.: 120° C.)
S3: Methyl lactate (b.p.: 145° C.)
S4: 5-Methyl-2-hexanone (b.p.: 145° C.)
S5: Propylene glycol monoethyl ether (b.p.: 130-131° C.)
S6: Cyclohexanone (b.p.: 157° C.)

Examples 36 to 38

Resist Evaluation (EUV)

The components shown in Table 2 below are dissolved in the mixed solvent shown in Table 2 and a solution having solids content concentration of 5.0% by mass is prepared. The solution is filtered through a polytetrafluoroethylene filter having a pore size of 0.1 μm, and a positive resist solution is obtained. The symbols in Table 2 are the same as those in Table 1.

The prepared positive resist solution is uniformly coated with a spin coater on a silicon substrate having been treated with hexamethyldisilazane, the substrate is dried on a hot plate by heating at 120° C. for 90 seconds, and a resist film having a thickness of 100 nm is formed.

The resist film is irradiated with EUV exposure apparatus (wavelength: 13 nm). Immediately after irradiation, the resist film is heated at 130° C. for 90 seconds on a hot plate. The resist film is then developed with a tetramethylammonium hydroxide aqueous solution having concentration of 2.38% by mass at 23° C. for 60 seconds, rinsed with pure water for 30 seconds, and dried to form a line and space pattern (line and space: 1/1). The obtained pattern is evaluated by the methods shown below.

[Sensitivity]

The form of the cross section of the obtained pattern is observed with a scanning electron microscope (S-9220, manufactured by Hitachi Limited). The minimum irradiation energy for resolving a 100 nm line (line and space: 1/1) is taken as sensitivity.

[Pattern Form]

The form of the cross section of the 100 nm line pattern in the irradiation quantity showing the above sensitivity is observed with a scanning electron microscope (S-4300, manufactured by Hitachi Limited), and three-stage evaluation of rectangle, a little taper and taper is performed.

TABLE 2

Results of evaluation by EUV exposure

| Ex. No. | Resin 1 [Composition Ratio]*1 <Mw, Mw/Mn>*2 (concentration)*3 | Resin 2 [Composition Ratio]*1 <Mw, Mw/Mn>*2 (concentration)*3 | Conventional Acid-Generating Agent (concentration)*3 | Basic Compound (concentration)*3 | Surfactant (concentration)*3 | Organic Solvent (mixing ratio)*4 | Sensitivity ($\mu C/cm^2$) | Pattern Form |
|---|---|---|---|---|---|---|---|---|
| Ex. 36 | P-4 [36/14/44/6] <5,000, 1.75> (99.95) | None | None | None | W-3 (0.05) | S1/S2 (40/60) | 25.7 | Rectangle |
| Ex. 37 | P-11 [35/15/45/5] <4,700, 1.67> (99.95) | None | None | None | W-1 (0.05) | S1/S2 (40/60) | 26.8 | Rectangle |
| Ex. 38 | P-30 [50/45/5] <4,500, 1.80> (99.95) | None | None | None | W-1 (0.05) | S1/S2 (40/60) | 25.1 | Rectangle |

*1 Molar ratio
*2 Mw and Mn are respectively weight average molecular weight and number average molecular weight as polystyrene equivalent found by GPC (carrier: N-methyl-2-pyrrolidone (NMP))
*3 % by mass in all the solids content
*4 Mass ratio From the results shown in Table 2, the actinic ray-sensitive or radiation-sensitive resin compositions in the invention can also show good sensitivity and form a good pattern form even with EUV exposure.

According to the invention, an actinic ray-sensitive or radiation-sensitive resin composition satisfying high sensitivity, high resolution, good pattern form, good line edge roughness and reduction of outgassing at the same time in a super fine region, in particular, in electron beam, X-ray or EUV ray lithography, and suitable as a positive resist composition, and a pattern-forming method using the composition can be provided.

The entire disclosure of Japanese Patent Application Nos. 2009-083708 and 2010-013681 filed on Mar. 30, 2009 and Jan. 25, 2010 respectively, from which the benefit of foreign priority has been claimed in the present application, is incorporated herein by reference, as if fully set forth.

What is claimed is:

1. An actinic ray-sensitive or radiation-sensitive resin composition comprising:
   (P) a resin that contains the following repeating units (A), (B) and (C); and
   a solvent having a boiling temperature of 150° C. or less,
   (A) a repeating unit containing a group capable of decomposing and forming an acid upon irradiation with an actinic ray or radiation,
   (B) a repeating unit containing a group capable of decomposing and forming a carboxylic acid by the action of an acid, and
   (C) a repeating unit containing a carbon-carbon unsaturated bond,
   wherein the repeating unit (A) has on the side chain a group capable of decomposing and generating an acid upon irradiation with an actinic ray or radiation and the acid comprises a group represented by any one of the following structures:
   —$CH_2$—$SO_3H$, —$CH_2$—$CF_2$—$CF_2$—$SO_3H$, —OCO—$CF_2$—$SO_3H$, —CHF—$CF_2$—$SO_3H$,
   —$CH_2$—$SO_2$—NH—$SO_2$—$CF_3$, and —$CF_2$—$SO_2$—NH—$SO_2$—$CF_3$, wherein
   the compositional amount (mol) of the repeating unit (B) and the repeating unit (C) in the resin (P) satisfies a relationship of the repeating unit (B)≤the repeating unit (C).

2. The actinic ray-sensitive or radiation-sensitive resin composition as claimed in claim 1, wherein the repeating unit (B) is a repeating unit represented by the following formula (I), and
   the repeating unit (C) is a repeating unit represented by the following formula (II):

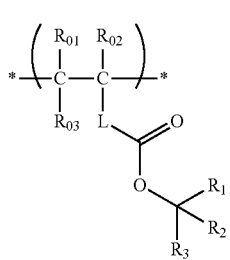

(I)

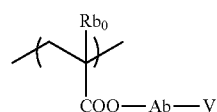

(II)

wherein
each of $R_{01}$, $R_{02}$ and $R_{03}$ independently represents a hydrogen atom, an alkyl group, a cycloalkyl group, a halogen atom, a cyano group, or an alkoxycarbonyl group, and $R_{03}$ may represent an alkylene group and be bonded to L or Q to form a 5- or 6-membered ring;
L represents a single bond or a divalent linking group, provided that L represents a trivalent linking group when bonded to $R_{03}$ to form a 5- or 6-membered ring;
$R_1$ represents an alkyl group;
each of $R_2$ and $R_3$ independently represents a hydrogen atom, an alkyl group, a cycloalkyl group or an aryl group, and $R_2$ and $R_3$ may be bonded to each other to form a ring, provided that $R_2$ and $R_3$ do not represent a hydrogen atom at the same time; and
Q represents a group containing a carbon-carbon unsaturated bond.

3. The actinic ray-sensitive or radiation-sensitive resin composition as claimed in claim 1, wherein
the resin (P) further contains (D) a repeating unit which has a group capable of decomposing by the action of an alkali developer and increasing a dissolution rate in the alkali developer and which is represented by the following formula (AII):

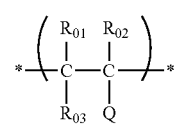

(AII)

wherein
$Rb_0$ represents a hydrogen atom, a halogen atom or an alkyl group;
Ab represents a single bond, an alkylene group, a divalent linking group having a monocyclic or polycyclic alicyclic hydrocarbon structure, an ether bond, an ester bond, a carbonyl group, or a divalent linking group combining these; and
V represents a group capable of decomposing by the action of an alkali developer and increasing a dissolution rate in the alkali developer.

4. The actinic ray-sensitive or radiation-sensitive resin composition as claimed in claim 2, wherein
Q in formula (II) is a group containing an aromatic ring.

5. The actinic ray-sensitive or radiation-sensitive resin composition as claimed in claim 4, wherein
Q in formula (II) is a group containing a benzene ring.

6. The actinic ray-sensitive or radiation-sensitive resin composition as claimed in claim 1, wherein
the resin (P) contains, as the repeating unit (C), a repeating unit derived from hydroxystyrene or a derivative thereof.

7. The actinic ray-sensitive or radiation-sensitive resin composition as claimed in claim 1, wherein
the solvent having a boiling temperature of 150° C. or less is contained in an amount of 65% by mass or more based on all the amount of solvents.

8. The actinic ray-sensitive or radiation-sensitive resin composition as claimed in claim 1, wherein
the resin (P) consists of the repeating units (A) to (C) alone, and all of the repeating unit (C) are a repeating unit represented by the following formula (II-1):

wherein
Q represents a group containing a carbon-carbon unsaturated bond.

9. The actinic ray-sensitive or radiation-sensitive resin composition as claimed in claim 3, wherein
the resin (P) consists of the repeating units (A) to (D) alone, and all of the repeating unit (C) are a repeating unit represented by the following formula (II-1):

wherein
Q represents a group containing a carbon-carbon unsaturated bond.

10. The actinic ray-sensitive or radiation-sensitive resin composition as claimed in claim 1, wherein
the proportion of a repeating unit having a cyclic structure in the main chain in the resin (P) is 30 mol % or less.

11. The actinic ray-sensitive or radiation-sensitive resin composition as claimed in claim 1, wherein
the resin (P) does not contain a repeating unit having a cyclic structure in the main chain.

12. The actinic ray-sensitive or radiation-sensitive resin composition as claimed in claim 1, wherein
the resin (P) has a weight average molecular weight in the range of 1,000 to 100,000.

13. The actinic ray-sensitive or radiation-sensitive resin composition as claimed in claim 1, further comprising:
a basic compound.

14. The actinic ray-sensitive or radiation-sensitive resin composition as claimed in claim 1, which is exposed with an electron beam, an X-ray or an EUV ray.

15. A resist film formed with the actinic ray-sensitive or radiation-sensitive resin composition claimed in claim 1.

16. A pattern-forming method comprising:
exposing and developing the resist film claimed in claim 15.

17. An actinic ray-sensitive or radiation-sensitive resin composition comprising:
(P) a resin that contains the following repeating units (A), (B) and (C); and
a solvent having a boiling temperature of 150° C. or less,
(A) a repeating unit containing a group capable of decomposing and forming an acid upon irradiation with an actinic ray or radiation,
(B) a repeating unit containing a group capable of decomposing and forming a carboxylic acid by the action of an acid, and
(C) a repeating unit containing a carbon-carbon unsaturated bond,
wherein the repeating unit (A) has on the side chain a group capable of decomposing and generating an acid upon irradiation with an actinic ray or radiation and the acid comprises a group represented by any one of the following structures:
—CH$_2$—SO$_3$H, —CH$_2$—CF$_2$—CF$_2$—SO$_3$H, —OCO—CF$_2$—SO$_3$H, —CHF—CF$_2$—SO$_3$H, —CH$_2$—SO$_2$—NH—SO$_2$—CF$_3$, and —CF$_2$—SO$_2$—NH—SO$_2$—CF$_3$,
wherein the repeating unit (B) is a repeating unit represented by the following formula (I), and
the repeating unit (C) is a repeating unit represented by the following formula (II):

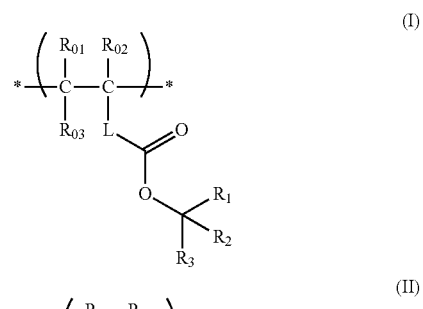

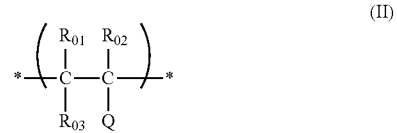

wherein
each of $R_{01}$, $R_{02}$ and $R_{03}$ independently represents a hydrogen atom, an alkyl group, a cycloalkyl group, a halogen atom, a cyano group, or an alkoxycarbonyl group, and $R_{03}$ may represent an alkylene group and be bonded to Q to form a 5- or 6-membered ring;
L of formula (I) represents —COO—L$_1$—, and L$_1$ represents an alkylene group, a cycloalkylene group, an arylene group, or an aralkylene group and
R$_1$ represents an alkyl group;
each of R$_2$ and R$_3$ independently represents a hydrogen atom, an alkyl group, a cycloalkyl group or an aryl group, and R$_2$ and R$_3$ may be bonded to each other to form a ring, provided that R$_2$ and R$_3$ do not represent a hydrogen atom at the same time; and
Q represents a group containing a carbon-carbon unsaturated bond.

* * * * *